United States Patent
Sano et al.

(10) Patent No.: US 8,106,449 B2
(45) Date of Patent: Jan. 31, 2012

(54) SEMICONDUCTOR DEVICE

(75) Inventors: Toshiaki Sano, Tachikawa (JP);
Tomoyuki Ishii, Kokubunji (JP);
Norifumi Kameshiro, Kodaira (JP);
Toshiyuki Mine, Fussa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 255 days.

(21) Appl. No.: 11/493,688

(22) Filed: Jul. 27, 2006

(65) Prior Publication Data
US 2007/0063287 A1 Mar. 22, 2007

(30) Foreign Application Priority Data

Sep. 16, 2005 (JP) ................................. 2005-270816

(51) Int. Cl.
*H01L 29/94* (2006.01)
(52) U.S. Cl. ............ 257/334; 257/67; 257/69; 257/330; 257/332; 257/333; 257/352; 257/368; 257/E21.645
(58) Field of Classification Search ........... 257/E21.661, 257/E21.68, 67, 69, 330, 332, 333, 334, 352, 257/368, E21.645
See application file for complete search history.

(56) References Cited

U.S. PATENT DOCUMENTS

| | | | | |
|---|---|---|---|---|
| 5,116,771 A * | 5/1992 | Karulkar | ....................... | 438/163 |
| 5,124,768 A * | 6/1992 | Mano et al. | .................... | 257/347 |
| 5,557,126 A * | 9/1996 | Cunningham | ................ | 257/332 |
| 5,567,958 A * | 10/1996 | Orlowski et al. | ............... | 257/66 |
| 5,670,398 A * | 9/1997 | Yin et al. | ....................... | 438/151 |
| 5,937,283 A * | 8/1999 | Lee | ............................... | 438/149 |
| 6,239,472 B1 * | 5/2001 | Shenoy | ......................... | 257/408 |
| 6,362,502 B1 * | 3/2002 | Rosner et al. | ................. | 257/298 |
| 6,395,589 B1 * | 5/2002 | Yu | ................................. | 438/183 |
| 6,524,920 B1 * | 2/2003 | Yu | ................................. | 438/303 |
| 6,551,886 B1 * | 4/2003 | Yu | ................................. | 438/300 |
| 6,576,943 B1 | 6/2003 | Ishii et al. | ..................... | 257/296 |
| 6,580,132 B1 * | 6/2003 | Chan et al. | .................... | 257/365 |
| 6,646,300 B2 | 11/2003 | Ishii et al. | ..................... | 257/316 |
| 6,660,600 B2 * | 12/2003 | Ahmad et al. | ................ | 438/300 |

(Continued)

FOREIGN PATENT DOCUMENTS

JP 3-177073 8/1991

(Continued)

OTHER PUBLICATIONS

M. Yamaoka et al., "A 300MHz 25µA/Mb Leakage On-Chip SRAM Module Featuring Process-Variation Immunity and Low-Leakage-Active Mode for Mobile-Phone Application Processor," 2004 IEEE International Solid-State Circuits Conference, Feb. 18, 2004, pp. 494-495.

(Continued)

*Primary Examiner* — Kiesha Bryant
*Assistant Examiner* — Eric Ward
(74) *Attorney, Agent, or Firm* — Miles & Stockbridge P.C.

(57) ABSTRACT

To achieve a stable reading operation in a memory cell having a gain-cell structure, a write transistor is configured, which has a source and a drain that are formed on the insulating layer, a channel formed on the insulating layer and between the source and the drain and made of a semiconductor, and a gate formed on an upper portion of the insulating layer and between the source and the drain and electrically insulated from the channel by a gate insulating film and controlling the potential of the channel. The channel electrically connects the source and the drain on the side surfaces of the source and the drain.

14 Claims, 52 Drawing Sheets

U.S. PATENT DOCUMENTS

| | | | |
|---|---|---|---|
| 6,787,424 B1 * | 9/2004 | Yu ................................ | 438/300 |
| 6,787,835 B2 | 9/2004 | Atwood et al. .............. | 257/296 |
| 6,825,528 B2 | 11/2004 | Iwata et al. | |
| 6,949,782 B2 | 9/2005 | Atwood et al. | |
| 7,294,890 B2 * | 11/2007 | Lo et al. ....................... | 257/384 |
| 7,375,399 B2 * | 5/2008 | Ishii et al. .................... | 257/365 |
| 7,723,755 B2 * | 5/2010 | Lee et al. ...................... | 257/211 |
| 7,772,053 B2 * | 8/2010 | Kameshiro et al. ........... | 438/164 |
| 2002/0096702 A1 | 7/2002 | Ishii et al. .................... | 257/314 |
| 2005/0029551 A1 * | 2/2005 | Atwood et al. ............... | 257/208 |
| 2005/0260801 A1 * | 11/2005 | Divakaruni et al. .......... | 438/151 |
| 2005/0280000 A1 | 12/2005 | Ishii et al. ...................... | 257/67 |

FOREIGN PATENT DOCUMENTS

| | | |
|---|---|---|
| JP | 06-021458 A | 1/1994 |
| JP | 06-085259 A | 3/1994 |
| JP | 06-334185 A | 12/1994 |
| JP | 8-181327 A | 7/1996 |
| JP | 2000-269457 | 9/2000 |
| JP | 2002-94029 | 3/2002 |
| JP | 2004-14094 | 1/2004 |
| WO | WO 0150536 A1 | 7/2001 |

OTHER PUBLICATIONS

H. Shichijo et al., "TITE RAM: A New SOI DRAM Gain Cell for Mbit DRAM's," Conference on Solid State Devices and Materials, 1984, pp. 265-268.

S. Shukuri et al., "A Complementary Gain Cell Technology for Sub-1V Supply DRAMs," IEEE International Electron Devices Meeting, 1992, pp. 1006-1008.

T. Osabe, "A Single-Electron Shut-Off Transistor for a Scalable Sub-0.1-µm Memory," IEEE International Electron Devices Meeting, 2000, pp. 301-304.

U.S. Appl. No. 11/399,391, filed Apr. 7, 2006, Kameshiro et al.

* cited by examiner

US 8,106,449 B2

SEMICONDUCTOR DEVICE

CROSS-REFERENCE TO RELATED APPLICATION

The present application claims priority from Japanese Patent Application No. JP 2005-270816 filed on Sep. 16, 2005, the content of which is hereby incorporated by reference into this application.

TECHNICAL FIELD OF THE INVENTION

The present invention relates to semiconductor devices and, particularly, to a technology effective when applied to a semiconductor device including a memory cell having a gain-cell structure.

BACKGROUND OF THE INVENTION

As microfabrication progresses, many transistors have become able to be integrated on the same chip, and also circuits with many functions have become able to be mounted on the same chip. On-chip memory having a memory and a processor mixed on the same chip is superior in both of data transfer rate and power consumption, compared with the case where memory is separately mounted on another chip. In particular, as mobile devices including cellular phone and PDA (Personal Digital Assistance) become more sophisticated in functionality, compatibility between high functionality and low power consumption is valued, and therefore on-chip memory will play an important role.

For on-chip memory, SRAM (Static Random Access Memory) is dedicatedly used in view of consistency in manufacturing process with logic transistors.

M. Yamaoka et al, IEEE International Solid-State Circuits Conferences, pp. 494-495, (2004) discloses a technology regarding on-chip low power in SRAM.

On the other hand, one known example of memory that allows more integration than SRAM is DRAM (Dynamic Random Access Memory). However, since DRAM adopts operation principles of storing charge in a capacitor and ensures a certain amount of capacitance or more in a fine cell area, it is indispensable to introduce a high-permittivity material, such as $Ta_2O_5$ (tantalum pentoxide), and a three-dimensional structure. Such DRAM has poor process consistency with logic transistors which form peripheral circuits of memory and other logical circuits.

To get around the problem, one suggested example of structure for DRAM operable without using a special capacitor structure is a structure of a storage element called a gain cell (gain-cell structure). This gain cell is a memory cell in which a storage node (charge-storage node) is charged via a write transistor and reading is performed by using the fact that conductance of a read transistor separately provided is varied by this stored charge.

Technologies regarding the gain-cell structure are disclosed in Japanese Patent Laid-Open Publication No. 2000-269457 and Japanese Patent Laid-Open Publication No. 2002-094029. Also, H. Shichijo et al, Conference on Solid State Devices and Materials, pp. 265-268, (1984) discloses a technology of applying polycrystalline silicon (polysilicon) to a write transistor. Furthermore, S. Shukuri et al, IEEE International Electron Devices Meeting, pp. 1006-1008, (1992) discloses a technology of applying polycrystalline silicon (polysilicon) to a read transistor. Still further, T. Osabe et al, IEEE International Electron Devices Meeting, pp. 301-304, (2000) discloses a technology regarding memory having a gain-cell structure with a sufficient retention time by utilizing the fact that a leakage current of a TFT (Thin Film Transistor) using an ultra-thin polycrystalline silicon film as a channel is extremely small.

As described above, compared with SRAM (Static Random Access Memory) that has been used as on-chip memory, DRAM (Dynamic Random Access Memory) using a memory cell having a gain-cell structure is more promising in high integration.

SUMMARY OF THE INVENTION

A DRAM memory cell having a gain-cell structure studied by the inventors is described below with reference to FIGS. 70A, 70B, and 71.

FIG. 70A is a drawing for describing an equivalent circuit of a memory cell with a gain-cell structure studied by the inventors in the case where a write transistor Qw and a read transistor Qr are included. FIG. 70B is a drawing for describing an equivalent circuit of a memory cell with a gain-cell structure studied by the inventors in the case where a write transistor Qw, a read transistor Qr, and a select transistor Qs are included. Here, the gate capacitance of the read transistor Qr is a main capacitance of a charge-storage node (storage node), and is referred to herein as a charge-storage capacitance Cs. Also, as will be described further below, a parasitic capacitance occurs between the gate and the source of the write transistor due to the structure of the write transistor Qw, and is referred to herein as a parasitic capacitance Cp.

As shown in FIGS. 70A and 70B, the structure of the memory cell is basically such that the write transistor Qw, which is a transistor for writing information, and the read transistor Qr, which is a transistor for reading written information, are unified together.

In the memory cell of FIG. 70A, when a voltage is applied to the gate of the write transistor Qw electrically connected to a word line WL to cause the write transistor Qw to become conductive, a current flows through the channel of the write transistor Qw. At this time, depending on a preset potential of a write bit line WBL, different amounts of charge are stored in the charge-storage node. That is, information is stored in the memory cell.

On the other hand, the read transistor Qr has different gate voltages depending on the amount of stored charge. By sensing the gate voltage, information can be read. That is, a change in conductance of the read transistor Qr occurs with a change in gate voltage, and is extracted to the outside of the memory cell as a difference in current flows from the read bit line RBL to the source line SL.

The memory-cell structure shown in FIG. 70B is different from the memory-cell structure shown in FIG. 70A in that the select transistor Qs is provided.

FIG. 71 is a schematic cross-section view of main parts of the write transistor Qw in the memory cell having the gain-cell structure studied by the inventors. This write transistor Qw has a Field-Effect Transistor (FET) structure with an ultra-thin semiconductor film as a channel 4.

As shown in FIG. 71, a semiconductor substrate 7 made of, for example, p-type single-crystal silicon has a main surface on which the write transistor Qw is formed. The write transistor Qw has a source 2 and a drain 3 formed on an insulating layer 6 serving as an isolation region formed by, for example, filling a groove made in a semiconductor substrate 7 with a silicon oxide ($SiO_2$) film. Also, the channel 4 of the write transistor Qw is formed on the insulating layer 6 between the source 2 and the drain 3. Furthermore, the write transistor Qw has a gate 1 formed on a gate insulating film 5 formed on the channel 4 so as to fill a gap between the source 2 and the drain 3 and cover a part of the upper surface of the source 2 and the drain 3.

The DRAM memory cell studied by the inventors is a highly-integrated memory cell. In general, in a memory cell having a small area due to microfabrication, the area of its capacitor is also small. Therefore, the capacitance of the capacitor is small, and the amount of stored charge is also small. This will decrease the information retention time. That is, the charge-storage capacitance Cs of the memory cell studied by the inventors is disadvantageously small.

To get around this problem, by applying a field-effect transistor with a small leakage current, the information retention time can be expected to have a sufficient length. Therefore, in the memory cell studied by the inventors, by using a field-effect transistor with a small leakage current, the thickness of the channel 4 is made ultra-thin, thereby achieving a long information retention time using a confinement effect in quantum mechanics in a thickness direction. With this, by applying the above-described memory cell, a refresh cycle can be made long, and a memory with small power consumption can be achieved.

However, there is a problem which the memory cell with such a small charge-storage capacitance Cs is significantly influenced by the parasitic capacitance Cp. In particular, when the ultra-thin channel 4 is used, the parasitic capacitance Cp is large. A main reason for this large parasitic capacitance Cp may be that, in the memory cell studied by the inventors, since a transistor with a low leakage current is to be formed, a so-called self-align process is not used, which is a process for normal MIS (Metal Insulator Semiconductor) transistors in which source, drain, and channel regions are formed by implanting impurities with a gate as a mask.

In the structure of the write transistor Qw shown in FIG. 71, it is a portion of the channel 4 between the source 2 and the drain 3 and on the insulating layer 6 that practically serves as a channel region of the write transistor Qw. Therefore, an overlapped portion with the gate 1 serves as the parasitic capacitance Cp. That is, an overlapped portion 8 and a facing portion 9 are present between the gate 1 and a region formed of the source 2 and the drain 3 and, because of this presence, the parasitic capacitance Cp is large.

Here, for description of the influence of the parasitic capacitance Cp, it is assumed that the write transistor Qw and the read transistor Qr are n-type channel field-effect transistors. At the time of writing, a positive voltage is applied to the gate of the write transistor Qw. Then, after a predetermined charge is stored in the charge storage node (charge-storage capacitance Cs), the potential of the gate of the write transistor Qw is lowered to be in a retention state or a read state. At this time, if the parasitic capacitance Cp is large, as the gate potential of the write transistor Qw is lowered, the potential of the charge-storage node is also lowered due to capacitance coupling with the parasitic capacitance Cp. For this reason, even with a high potential provided at the time of writing, the channel region of the read transistor Qr has a high resistance at the time of reading, thereby decreasing a current flowing through the channel. That is, problems are posed such that it is impossible to make a clear distinction from the case of a low potential originally provided at the time of writing in expectation of a high resistance and stable reading of information cannot be achieved.

An object of the present invention is to provide a technology allowing a stable reading operation in a memory cell having a gain-cell structure.

The above and other objects and novel characteristics of the present invention will be apparent from the description of this specification and the accompanying drawings.

The typical ones of the inventions disclosed in this application will be briefly described as follows.

In the present invention, a write transistor includes a source, a drain, and a channel formed on an insulating layer, and a gate that is formed on an upper portion of the insulating layer and between the source and the drain and is electrically insulated from the channel by a gate insulating film, the gate controlling a potential of the channel, and the channel of the write transistor electrically connects the source and the drain on side surfaces of the source and the drain.

Also, in the present invention, a write transistor includes a source and a drain that are formed on an insulating layer, a channel formed on the source and the drain and electrically connecting the source and the drain, and a gate electrically insulated from the channel by a gate insulating film and controlling a potential of the channel, and the channel is formed on an entire surface of a lower portion of the gate.

Furthermore, in the present invention, a write transistor includes a source, a drain, and a channel that are formed on an insulating layer, and a gate that is formed on an upper portion of the insulating layer and is electrically insulated from the channel by a gate insulating film, the gate controlling a potential of the channel, and the channel of the write transistor is formed along an upper surface of the source, a sidewall of the source, the insulating layer, a sidewall of the drain, and an upper surface of the drain.

Still further, in the present invention, a write transistor is provided including a substrate provided with a gate insulating film, a source and a drain that are formed on the gate insulating film, a gate formed under the gate insulating film and controlling a potential of a channel, and the channel made of a semiconductor electrically connecting the source and the drain, the channel being electrically insulated from the gate by the gate insulating film.

Still further, in the present invention, a write transistor is provided including a substrate provided with a gate insulating film, a source and a drain formed on the gate insulating film, a first gate formed under the gate insulating film, a semiconductor film formed on an upper portion of the first gate and electrically insulated from the first gate by the gate insulating film, and a second gate that is formed so as to have the semiconductor film interposed between the second gate and the first gate.

Still further, in the present invention, a memory cell is provided in which a charge-storage node is charged via a write transistor and reading is performed by using the fact that the conductance of a read transistor is varied by the stored charge, and an electrode is provided near the charge-storage node of the memory cell.

The effects obtained by typical aspects of the present invention will be briefly described below.

According to the present invention, a stable memory reading operation can be achieved.

BRIEF DESCRIPTIONS OF THE DRAWINGS

DESCRIPTIONS OF THE PREFERRED EMBODIMENTS

Figure 1:
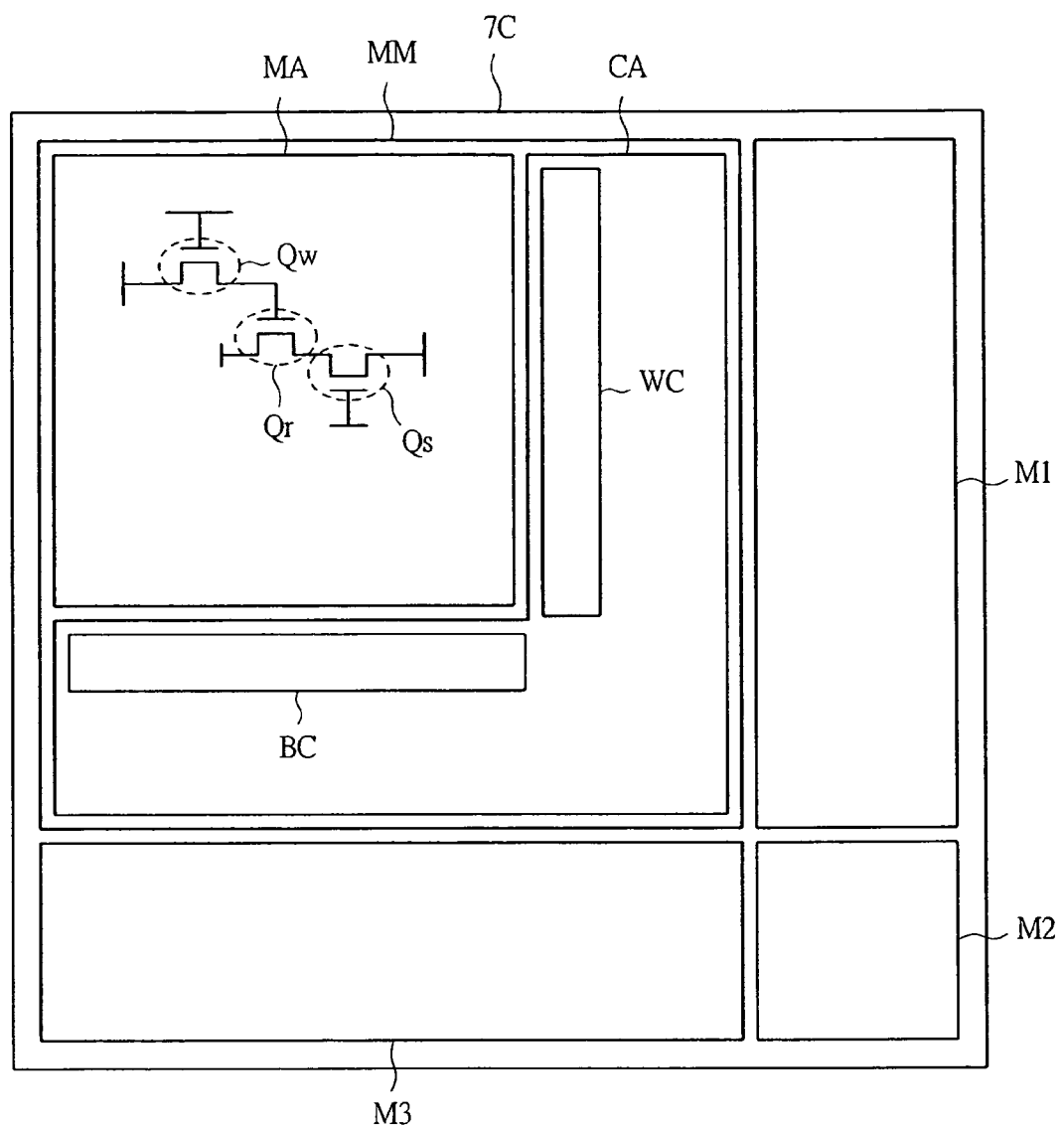
FIG. 1 is a schematic drawing for describing the structure of a semiconductor device according to a first embodiment of the present invention.

Hereinafter, embodiments of the present invention will be described in detail with reference to the accompanying drawings. Note that in all of the drawings for describing the embodiments, the same components are denoted by the same reference numerals in principle, and are not repeatedly described. In particular, components corresponding to those of other embodiments in view of functionality are provided with the same reference numerals even though there is a difference therebetween in shape, impurity concentration, crystallinity, etc. Also, hatching may be provided even to a plan view for ease of description. Furthermore, a gate, a gate electrode, and a gate region are collectively referred to herein as a "gate". Still further, a source, a source electrode, and a source region are collectively referred to herein as a "source". Still further, a drain, a drain electrode, and a drain region are collectively referred to herein as a "drain". Still further, a memory, a semiconductor memory, a memory cell (unit memory cell) are collectively referred to herein as a "memory". Here, although the memory includes SRAM (Static Random Access Memory), flash memory, EEPROM (Electronically Erasable and Programmable Read Only Memory), and others, a memory having a gain-cell structure is referred to herein as a "memory", unless otherwise specified.

First Embodiment

FIG. 1 is a schematic drawing for describing the structure of a semiconductor device according to a first embodiment of the present invention. For example, a semiconductor device in a chip (semiconductor chip) state has a chip 7C on which a memory module MM and modules M1, M2, and M3, such as other logic circuits (logic modules) and an analog circuit (analog module) are configured. In the memory module MM, a memory area MA and its peripheral circuit area CA are configured. In the memory area MA, a memory configured as an array of a plurality of memory cells is formed. Also, in the peripheral circuit area CA, a word line driving circuit WC and a bit line driving circuit BC for selecting a memory cell, and a peripheral circuit formed of a control circuit and others are formed.

A transistor forming these memory area MA and the peripheral circuit area CA is formed on one chip 7C. In the first embodiment, the memory area MA has a write transistor Qw, which is a transistor that writes information, a read transistor Qr, which is a transistor that reads written information, and a select transistor Qs for selecting a memory cell from a plurality of memory cells (refer to FIG. 70B). Also, the peripheral circuit area CA has a logic transistor and a high-voltage transistor. Here, as described above, such a structure of a memory cell in which the write transistor Qw and the read transistor Qr are unified together is referred to as a gain cell.

Figure 2:
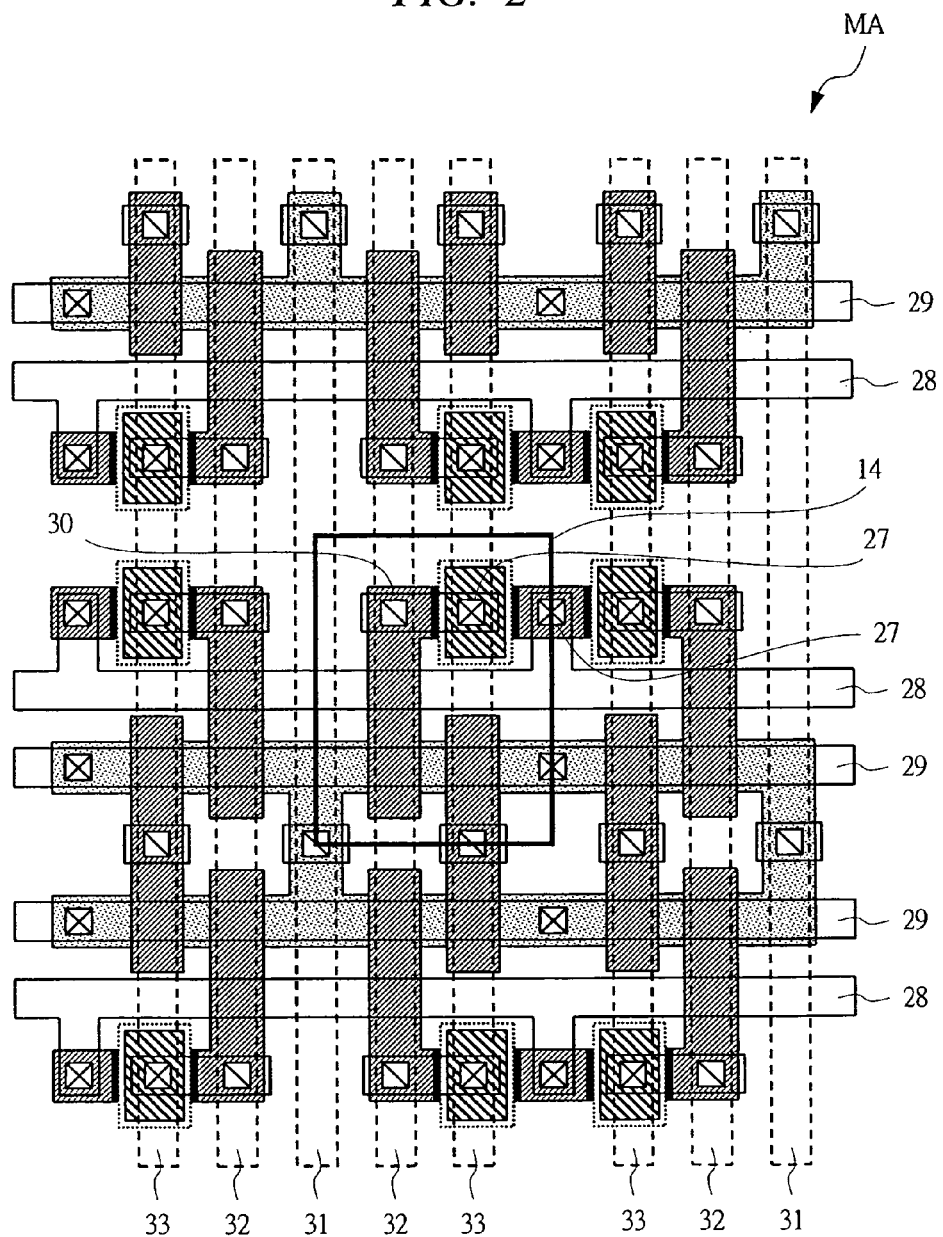
FIG. 2 is a schematic plan view of main parts of a memory formed in a memory area of FIG. 1.

FIG. 2 is a schematic plan view of main parts of the memory formed in the memory area MA of FIG. 1, depicting an array in which a plurality of memory cells are two-dimensionally arranged. In the memory area MA, memory cells are arranged so as to be reversed in horizontal and vertical directions, and the adjacent memory cells share a contact 27 and a via 30, thereby preventing an increase in chip area. The plurality of memory cells are each electrically connected to a write bit line 28, a read bit line 29, a source line 31, a write word line 32, and a read word line 33 via the contact 27 or the via 30. Here, one of memory cells forming a memory array is a unit memory cell, and a region 14 of a unit memory cell on the chip 7C is shown in FIG. 2.

Figure 3:
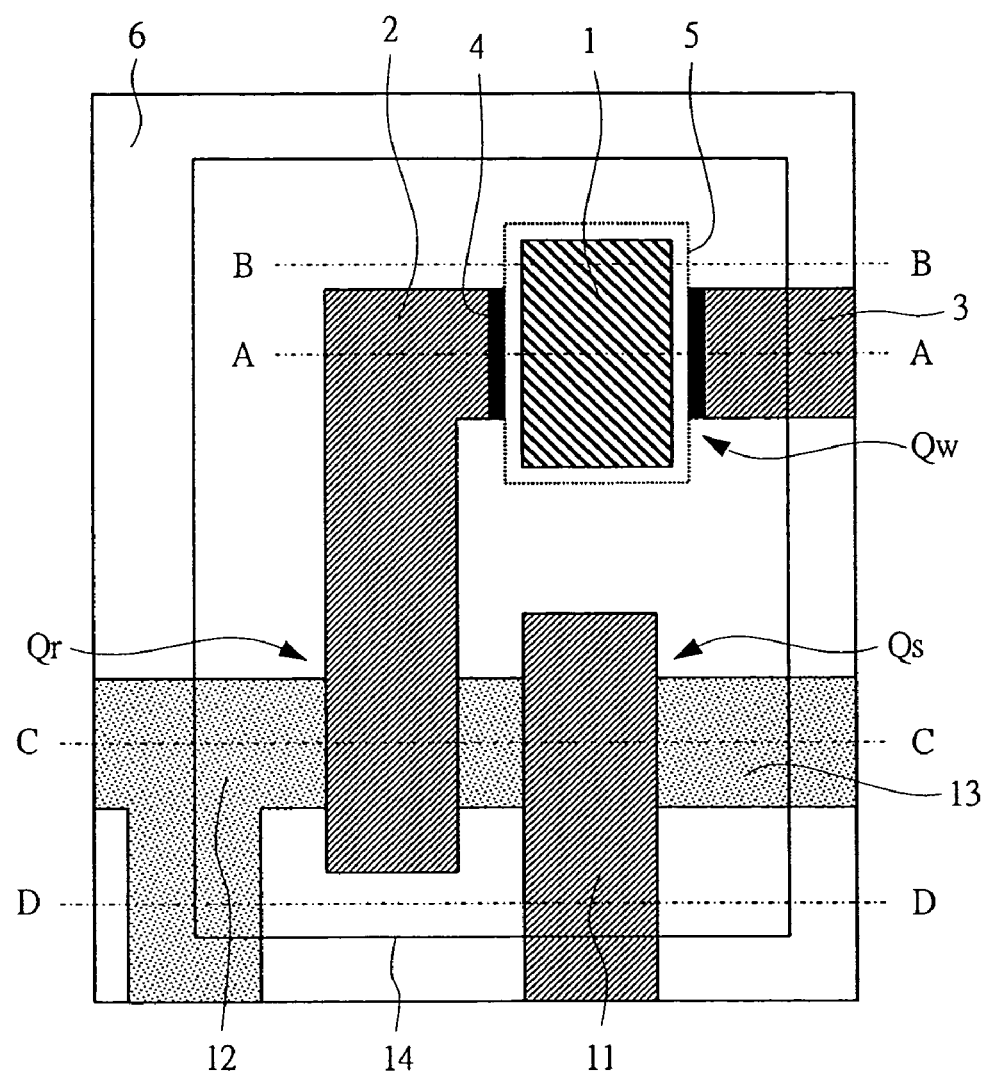
FIG. 3 is an enlarged plan view of main parts in FIG. 2.
Figure 4:
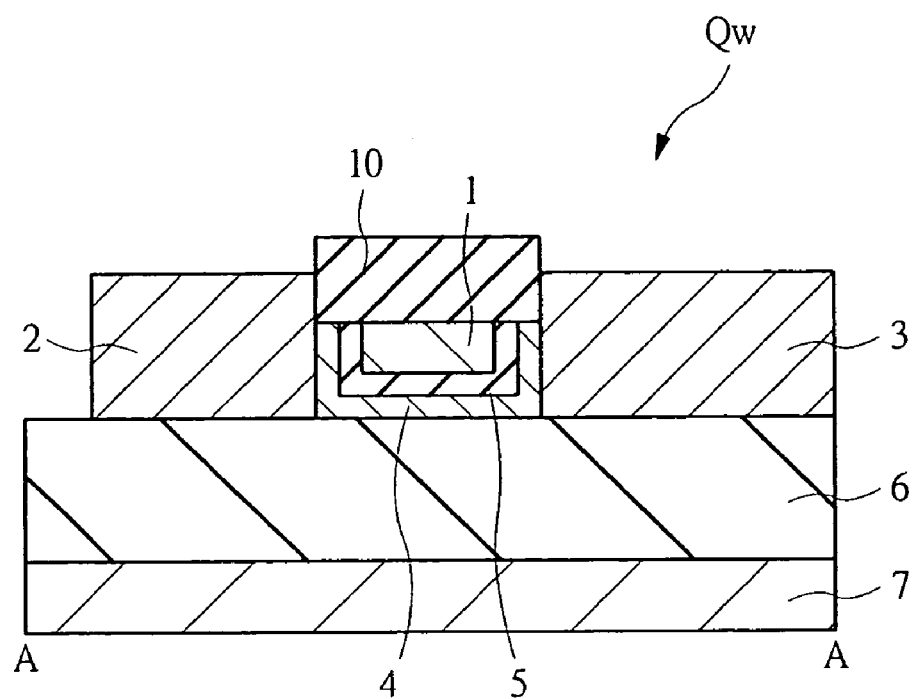
FIG. 4 is a cross-section view along an A-A line in FIG. 3.
Figure 5:
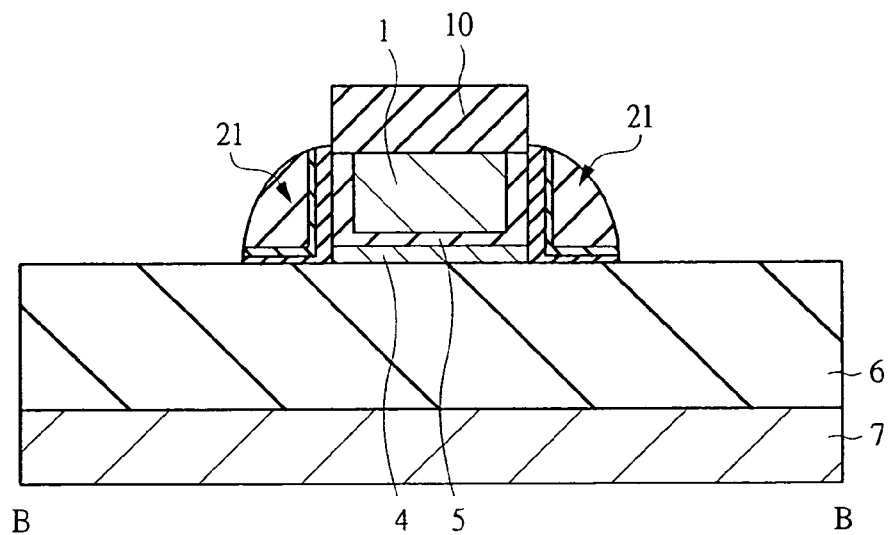
FIG. 5 is a cross-section view along a B-B line in FIG. 3.
Figure 6:
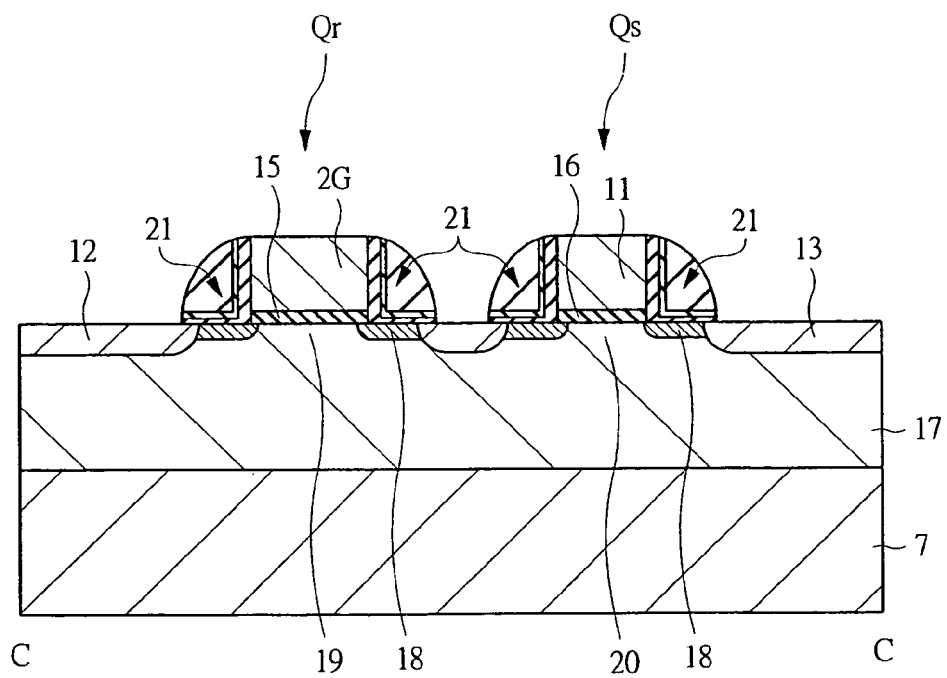
FIG. 6 is a cross-section view along a C-C line in FIG. 3.
Figure 7:
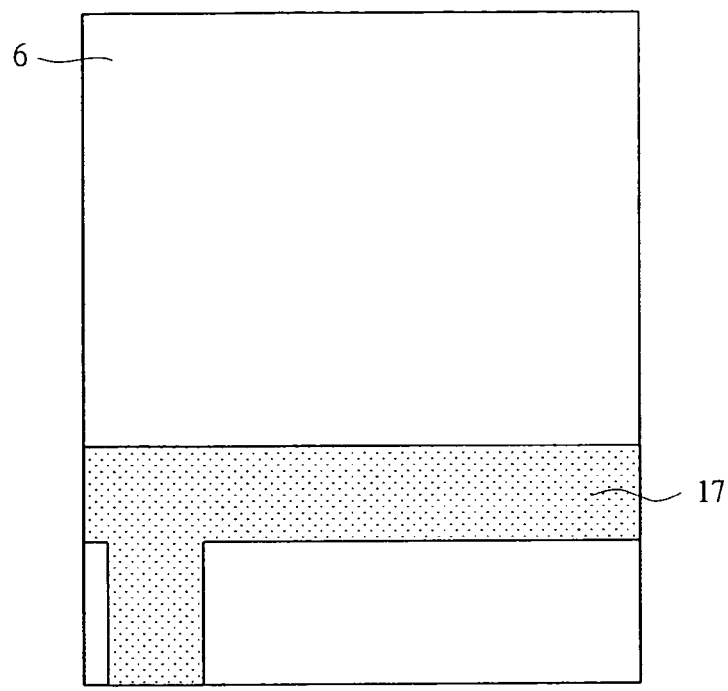
FIG. 7 is a schematic plan view of a memory cell during a manufacturing process in a region corresponding to FIG. 3.

With reference to FIGS. 3 to 6, the structure of the memory cell according to the first embodiment is described. FIG. 3 is an enlarged plan view of main parts in FIG. 2, depicting the region 14 of a unit memory cell including the write transistor Qw, the read transistor Qr, and the select transistor Qs. FIGS. 4 to 6 are cross-section views along an A-A line, a B-B line, and a C-C line, respectively, in FIG. 3. Here, in the region 14 of the unit memory cell shown in FIG. 3, for ease of description of an element structure, components, such as contacts and vias, are omitted.

First, the structure of the write transistor Qw of the unit memory cell is described. For example, a groove made in a semiconductor substrate (hereinafter simply referred to as a substrate) 7 made of, for example, p-type single-crystal silicon, has an insulating layer 6 serving as an isolation region filled with an insulator, such as silicon oxide ($SiO_2$). The insulating layer 6 has formed thereon a source 2 and a drain 3 made of, for example, n-type polycrystalline silicon. Also, on the insulating layer 6 between the source 2 and the drain 3, a channel 4 formed of a semiconductor film made of intrinsic polycrystalline silicon having a thickness of, for example, 2.5 nm is formed. Also, on this channel 4, a gate insulating film 5 formed of a silicon oxide film having a film thickness of, for example, the order of 12 nm is formed. Between the source 2 and the drain 3, a gate 1 made of, for example, n-type polycrystalline silicon having the gate insulating film 5 interposed between the source 2 and the gate 1 and between the drain 3 and the gate 1 is formed. Furthermore, on the upper surface of the gate 1, an insulating film 10 made of, for example, silicon oxide is formed. Here, the gate 1 controls the potential of the channel 4.

Figure 70A:
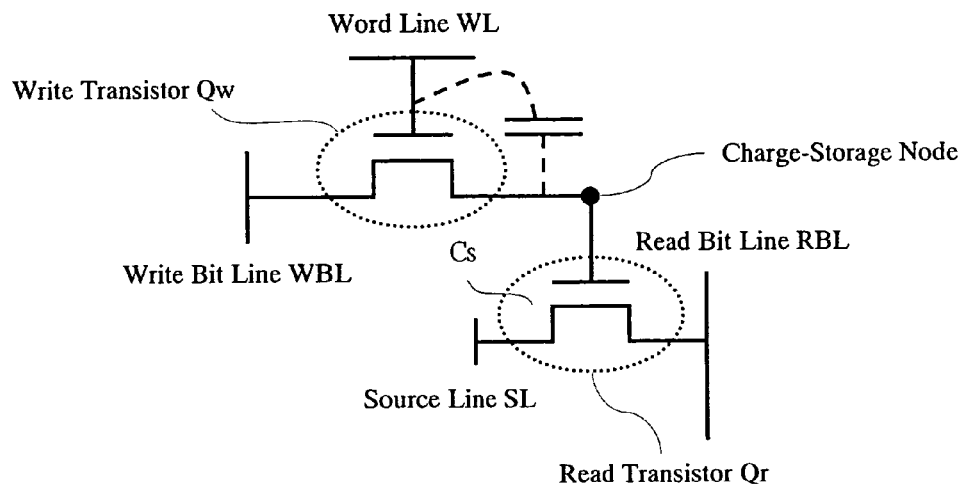
FIG. 70A is a drawing for describing an equivalent circuit of a memory cell with a gain-cell structure studied by the inventors in the case where a write transistor and a read transistor are included.
Figure 70B:
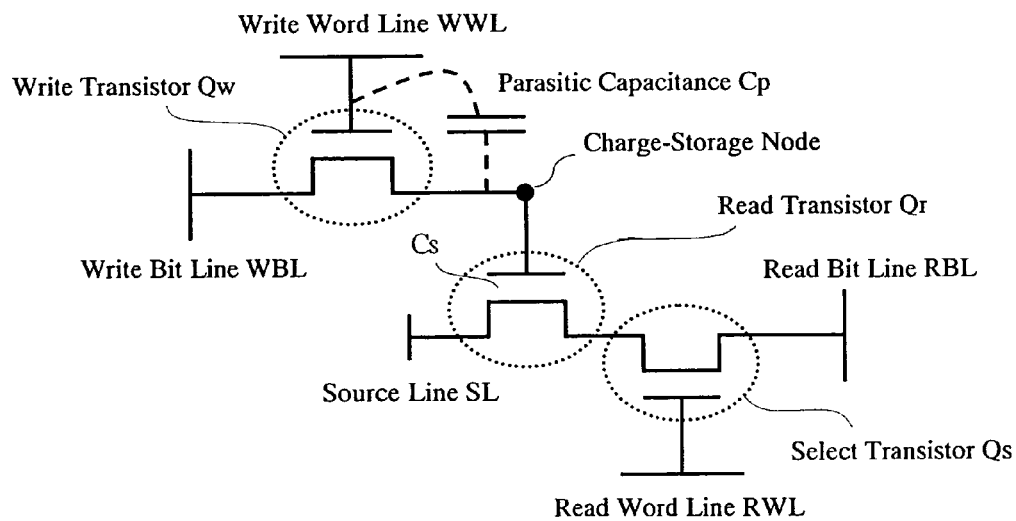
FIG. 70B is a drawing for describing an equivalent circuit of a memory cell with a gain-cell structure studied by the inventors in the case where a write transistor, a read transistor, and a select transistor are included.
Figure 71:
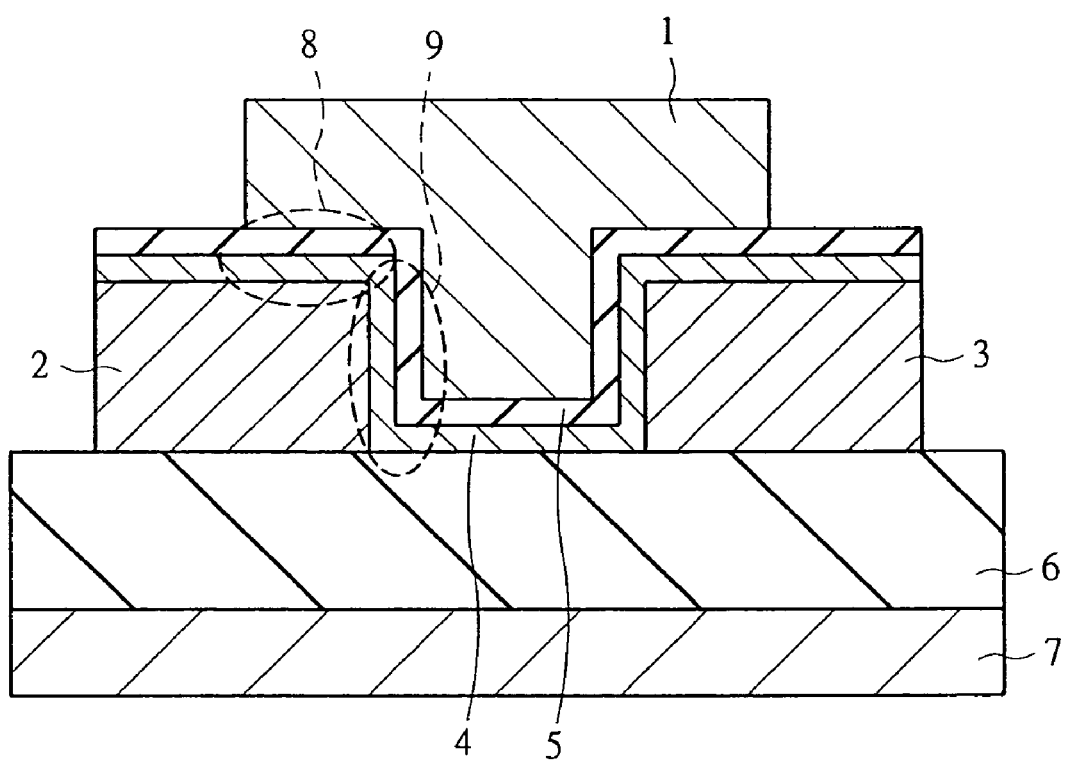
FIG. 71 is a schematic cross-section view of main parts of the write transistor in the memory cell with the gain-cell structure studied by the inventors.

The structure of the write transistor Qw shown in the first embodiment is different from the structure shown in FIG. 71 in that the gate 1 is formed between the source 2 and the drain 3 and the upper surface of the gate 1 is lower than the upper surface of the source 2. That is, a feature is that the gate 1 does not overlap with the source 2 or the drain 3. Therefore, compared with the structure shown in FIG. 71, the write transistor Qw shown in FIG. 4 does not have the overlapped portion 8 of FIG. 71, and therefore the parasitic capacitance Cp between the gate 1 and the source 2 of the write transistor Qw (refer to FIGS. 70A and 70B) is small. Therefore, in the semiconductor device according to the first embodiment, a stable reading operation with a less influence of the parasitic capacitance Cp can be achieved.

Also, the structure of the write transistor Qw according to the first embodiment is such that the channel 4 is formed on the entire surface of the lower portion of the gate 1 in a direction that crosses a direction in which a current flows from the source 2 to the drain 3 through the channel 4, and the dimension of the gate 1 is larger than the dimensions of the source 2 and the drain 3. Therefore, an effective channel width is larger than the dimension of the source 2, thereby advantageously increasing the current.

Furthermore, when photolithography is applied to form the gate 1 having the structure shown in FIG. 71, alignment deviation at the time of forming the gate 1 affects an increase or decrease of the overlapped portion 8, thereby causing variations in the parasitic capacitance Cp (refer to FIGS. 70A and 70B). Therefore, with the structure shown in FIG. 71, the parasitic capacitance Cp with variations will be further increased. By contrast, with the structure according to the present embodiment (refer to FIG. 2), since there is no overlap of the gate 1 with the source 2 or the drain 3, the gate 1 does not receive an influence of alignment deviation.

Still further, the structure of the write transistor Qw according to the first embodiment is a field-effect transistor (FET) structure, and therefore has a feature such that a leakage current of the write transistor Qw is extremely small. This is because the inventors found through their unique studies that the channel 4 having a film thickness on the order of 5 nm or smaller can achieve an outstanding leakage reduction effect and applies the channel 4 formed of a semiconductor film on the order of, for example, 2.5 nm, in the first embodiment. Here, reasons for the leakage reduction effect are thought to be such that, in addition to an extremely small cross-section area of the film compared with the area of a PN junction in a normal transistor, a band gap is effectively widened due to a confinement effect of quantum mechanics in a film-thickness direction.

As such, in the first embodiment, the write transistor Qw has the source 2 and the drain 3 that are formed on the insulating layer 6, the channel 4 formed on the insulating layer 6 and between the source 2 and the drain 3 and made of a semiconductor, and the gate 1 formed on an upper portion of the insulating layer 6 and between the source 2 and the drain 3 and electrically insulated from the channel 4 by the gate insulating film 5 and controlling the potential of the channel 4. This channel 4 electrically connects the source 2 and the drain 3 on the side surfaces of the source 2 and the drain 3. Also, the upper surface of the gate 1 is formed lower than the height of the upper surface of the source 2. Furthermore, the insulating film 10 is formed on the side surfaces of the source and the drain 3 to insulate and separate the gate 1 from the source 2 and the drain 3. Still further, the channel is formed on the entire surface of the lower surface of the gate 1 in a direction that crosses a direction in which a current flows from the source 2 to the drain 3 through the channel 4, and the dimension of the gate 1 is larger than the dimensions of the source 2 and the drain 3. Still further, the channel is made of silicon (for example, single-crystal silicon, polycrystalline silicon, or amorphous silicon), and has a thickness on the order of 5 nm or smaller. Here, the gate 1 may be made of metal, and at least one of the source 2 and the drain 3 may be made of metal.

Next, the structure of the read transistor Qr and the select transistor Qs is described. Also, the structure of the logic transistor and the high-voltage transistor in the peripheral circuit area will be described together. Here, these transistors are MISFETs (Metal Insulator Semiconductor Field Effect Transistors), and have a different structure from that of the above-described write transistor Qw, but are formed on the substrate 7 made of p-type silicon. Also, a so-called triple-well structure may be adopted, in which, for example, an n-well is provided on the substrate 7 and, for example, a p-well is further formed inside of the n-well. If such a triple-well structure is adopted, different voltages can be set to p-wells separated from each other by the n-type region, thereby allowing a bias to be applied to the substrate 7.

The gate insulating films of these transistors are formed of a silicon oxide film, for example, subjected to a nitriding process, and are provided according to two levels so as to have a film thickness on the order of either 2 nm or 7 nm. That is, the two levels means that a gate insulating film 15 of the read transistor Qr, a gate insulating film 16 of the select transistor Qs, and a gate insulating film of the high-voltage transistor each has a thickness on the order of 7 nm, whilst a gate insulating film of the logic transistor has a thickness on the order of 2 nm.

A gate 2G of the read transistor Qr and a gate 11 of the select transistor Qs are made of, for example, polycrystalline silicon, and each has sidewalls 21 formed of a laminated layer of a silicon oxide film and a silicon nitride film. Also, the gates of the high-voltage transistor and the logic transistor are made of, for example, polycrystalline silicon, and each has sidewalls formed of a laminated layer of a silicon oxide film and a silicon nitride film. Furthermore, the gate of the logic transistor is made of polycrystalline silicon with its surface being made by, for example, nickel silicide, so as to have a low resistance. Here, as shown in FIG. 3, the source 2 of the write transistor Qw and the gate 2G of the read transistor Qr are simultaneously formed, and are electrically connected together.

Also, under the gate 2G of the read transistor Qr and the sidewalls 21 of the select transistor Qs, so-called extension regions 18 are provided, which are shallow n⁻ regions. Furthermore, at the lateral sides of the sidewalls 21, n⁺ regions are provided, serveing as a source 12 of the read transistor Qr and a drain 13 of the select transistor Qs.

Here, if both of the logic transistor and the high-voltage transistor have an extension region, the logic transistor preferably uses an extension region shallower than that of the high-voltage transistor. A reason for this is as follows. Such a shallow extension region is formed through low-energy impurity implantation or impurity diffusion from the surface, with impurities being suppressed from spreading in horizontal and vertical directions, so as to have an extension structure resistant to a short channel effect even with a short gate length. On the other hand, in the high-voltage transistor, it is preferred that impurities to be implanted with higher energy, thereby forming an extension region extending wider in horizontal and vertical directions. This is to ensure a sufficient withstand voltage of a PN junction.

As shown in FIG. 6, the-read transistor Qr and the select transistor Qs are formed on a p-well 17, the p-well 17 formed so as to be directly connected onto the substrate 7 made of, for example, p-type silicon. The gate 2G of the read transistor Qr is electrically connected to the source 2 of the write transistor Qw, thereby forming a charge-storage capacitance Cs (refer to FIGS. 70A and 70B) mainly containing the gate capacitance of the read transistor Qr. Also, since a gate lower portion 19 of the read transistor Qr has an impurity concentration different from that of a gate lower portion 20 of the select transistor Qs, the read transistor Qr and the select transistor Qs have different thresholds, effects of which will be described further below.

In comparison between the select transistor Qs and the logic transistor, the gate insulating film 16 of the select transistor Qs is thicker than that of the logic transistor, and also basically has a gate length longer than that of the logic transistor so as to suppress a short channel effect.

Also, in comparisons between the read transistor Qr and the select transistor Qs in the memory area and between the logic transistor and the high-voltage transistor in the peripheral circuit area, they are similar in that a source and a drain are provided, but are different in depth of the extension region. In the memory area, while the gate insulating film having thickness on the order of 7 nm, which is equal to that of the high-voltage transistor, is used, the extension region having a shallower extension structure is formed. As will be described further below, voltages applied to these read transistor Qr and select transistor Qs are small, and therefore a high junction withstand voltage is not particularly required, posing no problem in withstand voltage. The gate insulating film 15 of the read transistor Qr is thicker than that of the logic transistor so as to cause a charge to be stored in the gate 2G for storage and preventing the charge from coming and going due to a tunnel current via the gate insulating film 15. With the use of such a shallow extension, an excellent short channel characteristic can be achieved, thereby making it possible to make a gate length shorter than the high-voltage transistor and achieving a small memory cell area.

In the present embodiment, the read transistor Qr and the select transistor Qs in the memory area use a gate insulating film thickness common to the high-voltage transistor in order to reduce the number of manufacturing processes. However, in view of a gate-insulating-film leakage, the gate insulating film thickness is preferably on the order of 3 nm or larger. For example, for the memory area, a gate insulating film thickness on the order of 4 nm may be separately provided, thereby achieving a three-level gate-insulating-film structure. Here, even in such a case, a shallow extension may be used in the extension structure, or the same extension structure as that of the logic transistor may be used.

In the case of such a three-level gate-insulating-film structure, the read transistor Qr can be formed as a transistor excellent in short channel characteristic. That is, since the read transistor Qr has a gate insulating film thinner than the high-voltage transistor, the read transistor Qr is superior in short channel characteristic, can use a short gate length, and can be achieved with a smaller cell area. Also, the gate capacitance of the read transistor Qr is increased, thereby improving a reading speed. Furthermore, with an increase in the amount of stored charge, a stable reading operation and a long retention time can be attained. In addition, a sub-threshold coefficient is decreased, thereby causing a large change in reading current with respect to the same stored charge, thereby increasing a reading margin.

Next, a semiconductor device manufacturing method according to the first embodiment is described with reference to FIGS. 7 to 23, focusing on the memory area having a memory cell. FIGS. 7 to 14 are schematic plan views of a memory cell during the manufacturing process in a region corresponding to FIG. 3. FIGS. 15 to 21 are schematic cross-section views of the memory cell during the manufacturing process in a portion corresponding to the portion along the A-A line in FIG. 3, depicting the write transistor Qw. FIG. 22 is a schematic cross-section view of the memory cell during the manufacturing process in a portion corresponding to the portion along the C-C line in FIG. 3, depicting the read transistor Qr and the select transistor Qs. FIG. 23 is a schematic cross-section view of the memory cell during the manufacturing process in a portion corresponding to a portion along a D-D line in FIG. 3.

First, a semiconductor substrate (at this stage, a semiconductor plate having an approximately circular plane, which is called a semiconductor wafer) made of, for example, p-type silicon (Si) single crystal, is prepared, and a silicon oxide ($SiO_2$) film is formed on a main surface of the semiconductor substrate (hereinafter simply referred to as a substrate) through oxidization. Furthermore, a silicon nitride (SiN) film is deposited.

Then, with a resist as a mask, the above-mentioned silicon nitride film, silicon oxide film, and substrate are etched, thereby forming a groove in the substrate. Then, that groove is filled with a silicon oxide film through, for example, CVD (Chemical Vapor Deposition), and then planarization is performed to form an isolation region (insulating layer) and an active region on the substrate. Next, impurities are ion-implanted to the active region to form an n-well and a p-well. Further, impurities are implanted into the n-well to form a p-well. Through the foregoing processes, in FIG. 7, the insulating layer 6 of the isolation region and a p-well 17 of the active region are formed on the substrate 7 on which a memory cell is later formed.

Then, impurities are implanted for adjusting a threshold of a MIS (Metal Insulator Semiconductor) transistor. Here, in the completed semiconductor device, n-type impurities are introduced only to a lower portion of the gate of the read transistor Qr, thereby setting an effective p-type impurity concentration lower than that of a lower portion of the select transistor Qs.

Then, for the purpose of forming the gate insulating films of the read transistor Qr, the select transistor Qs, and the high-voltage transistor, the substrate 7 is oxidized until the thickness becomes on the order of, for example, 7 nm. Next, by using a resist pattern with an opening in a region where the logic transistor is to be formed as a mask, a hydrofluoric acid treatment is performed to remove the gate insulating film at the opening. At this time, for the regions of the read transistor Qr, the select transistor Qs, and the high-voltage transistor, a resist pattern without opening is used.

Then, after removing the resist, the substrate 7 is oxidized (gate oxidation) so as to form a silicon oxide film having a thickness on the order of, for example, 2 nm, in the logic transistor region. Next, a conductive film made of non-doped polycrystalline silicon for gate is deposited on the substrate 7 so as to have a film thickness on the order of, for example, 150 nm.

In the foregoing, the processing common to the memory area MA and the peripheral circuit area CA shown in FIG. 1 has been described. Next, processing only on the memory area MA is described.

Figure 8:
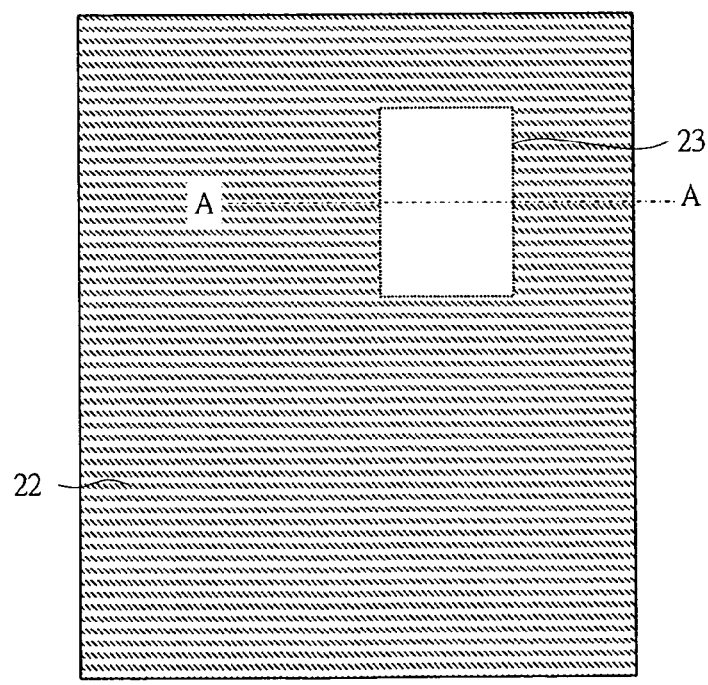
FIG. 8 is a schematic plan view of the memory cell during the manufacturing process continued from FIG. 7.
Figure 15:
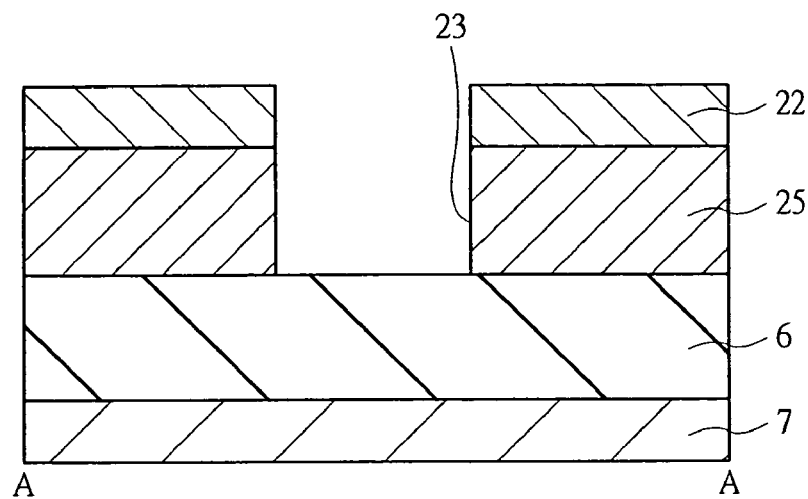
FIG. 15 is a schematic cross-section view of the memory cell during the manufacturing process in a portion corresponding to the portion along the A-A line in FIG. 3.

Then, as shown in FIGS. 8 and 15, after an insulating film 22 made of silicon nitride having a film thickness on the order of, for example, 50 nm, is deposited on a conductive film 25 described above, etching is performed with a hole pattern of a resist as a mask to remove the conductive film 25 of the channel and the gate regions, thereby forming an opening 23. Here, in semiconductor device manufacturing according to the first embodiment, a photomask additionally provided other than those for forming a normal logic transistor or high-voltage transistor is only for use in this process.

Figure 9:
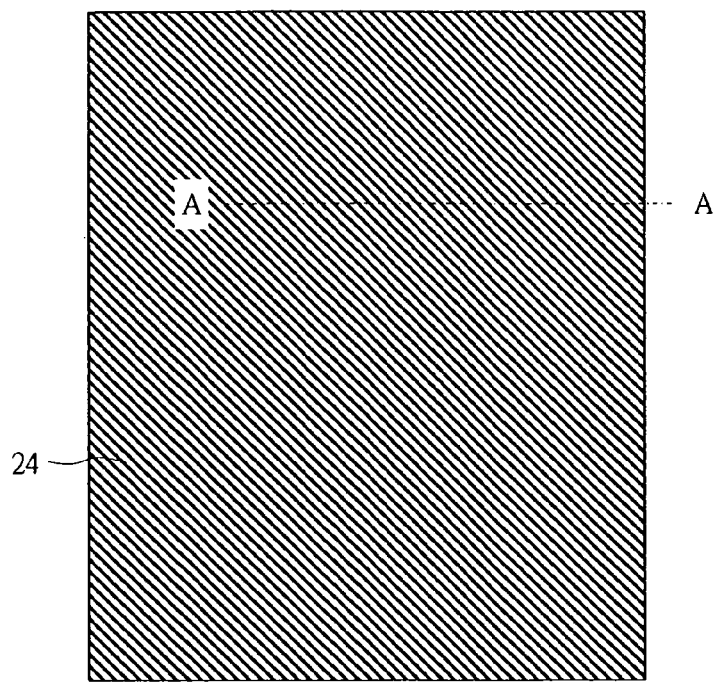
FIG. 9 is a schematic plan view of the memory cell during the manufacturing process continued from FIG. 8.
Figure 16:
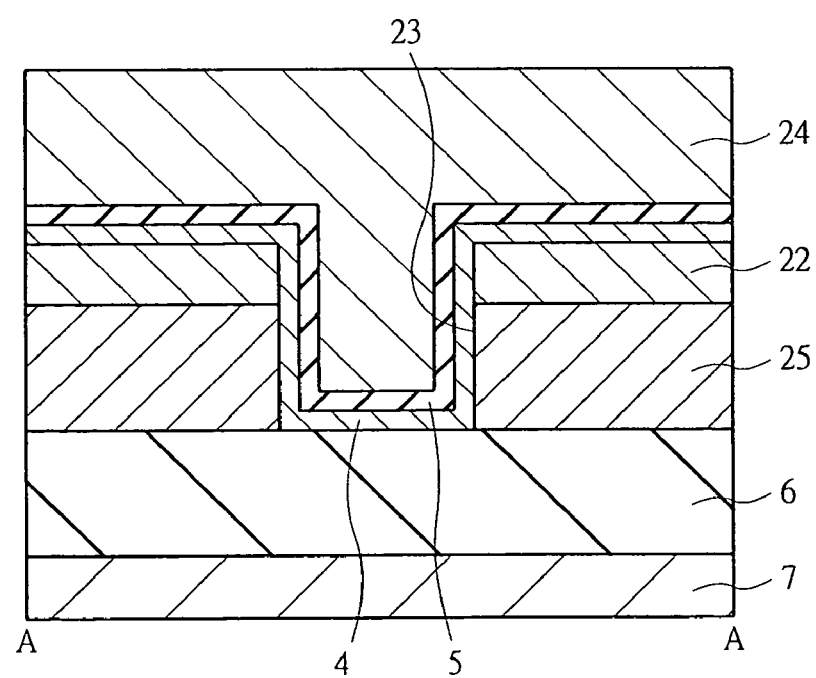
FIG. 16 is a schematic cross-section view of the memory cell during the manufacturing process continued from FIG. 15.

Then, as shown in FIGS. 9 and 16, after cleaning the substrate 7, deposited are the channel 4 made of amorphous silicon (semiconductor film) having a thickness on the order of, for example, 2.5 nm, the gate insulating film 5 having a thickness on the order of, for example, 15 nm, and then the conductive film 24 made of n-type polycrystalline silicon having a thickness on the order of, for example, 200 nm. Furthermore, annealing is performed, thereby crystallizing amorphous silicon of the channel 4 into polycrystalline silicon. Here, from the inventors' own studies, it was found that crystallization of such an ultra-thin film requires a temperature higher than a temperature at which a film having a thickness on the order of 10 nm or larger is formed. Note that, at the time of annealing, no impurities are yet introduced to the conductive film 25 that will serve as a source and drain of the write transistor Qw, and the diffusion layers of the logic transistor and the high-voltage transistor are not yet formed. Therefore, the short channel characteristic of the write transistor Qw, the logic transistor, and the high-voltage transistor does not receive an adverse effect.

Figure 10:
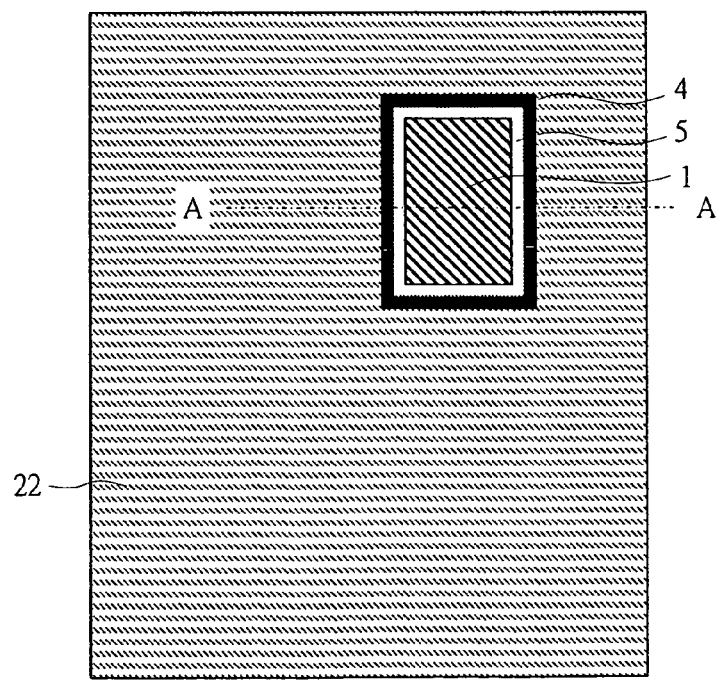
FIG. 10 is a schematic plan view of the memory cell during the manufacturing process continued from FIG. 9.
Figure 17:
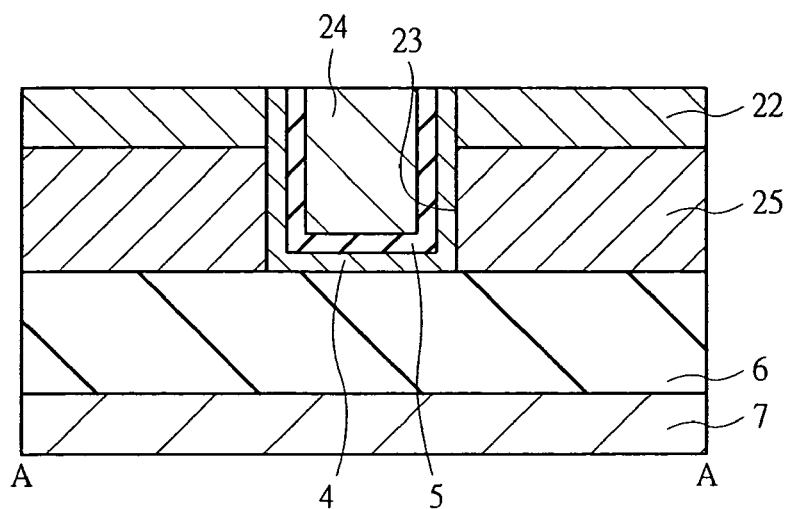
FIG. 17 is a schematic cross-section view of the memory cell during the manufacturing process continued from FIG. 16.

Then, as shown in FIGS. 10 and 17, the conductive film 24 is shaved through, for example, CMP (Chemical Mechanical Polishing) or an etch-back technique, until the surface of the insulating film 22 is exposed. With this, the conductive film 24 made of n-type polycrystalline silicon is left only at the opening 23 of the hole pattern made in advance.

Figure 18:
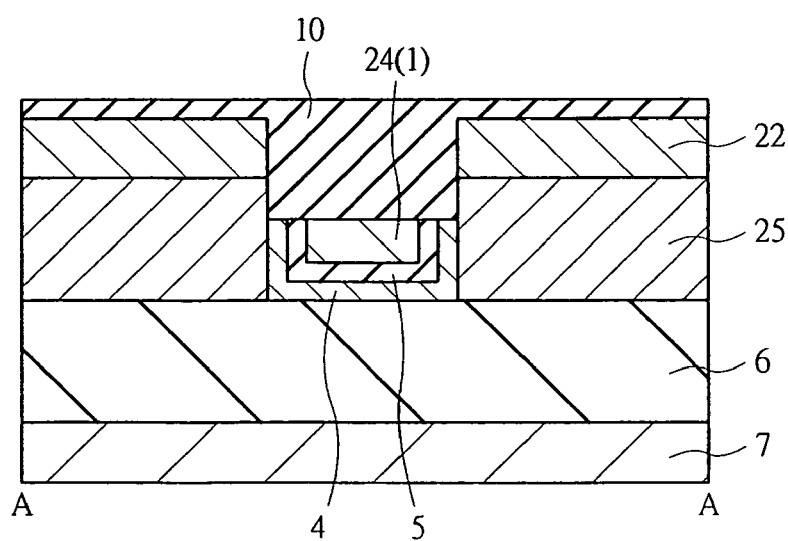
FIG. 18 is a schematic cross-section view of the memory cell during the manufacturing process continued from FIG. 17.

Then, as shown in FIG. 18, oxidization of n-type polycrystalline silicon, which is the conductive film 24, is performed. At this time, the exposed surface of the conductive film 24 and also the exposed channel 4 made of polysilicon are oxidized to form an insulating film 10 of a silicon oxide film. Here, a non-oxidized portion of the conductive film 24 becomes the gate 1 of the write transistor Qw. Here, the surface of the conductive film 25, which will later serve as a source and drain is protected by the insulating film 22, and therefore is not oxidized. Further, although the conductive film 25, which will later serve as a source and drain, is slightly oxidized from the side surface of the hole pattern, its oxidizing speed is slower than that of the conductive film 24 made of n-type polycrystalline silicon with impurities being introduced therein.

Figure 19:
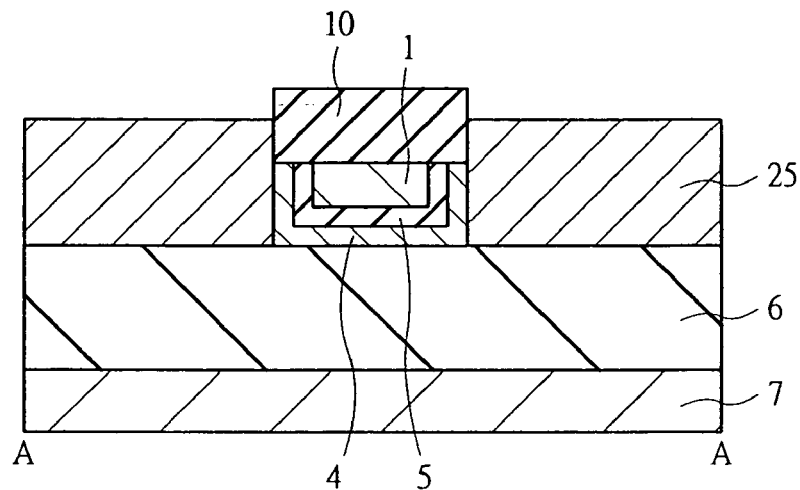
FIG. 19 is a schematic cross-section view of the memory cell during the manufacturing process continued from FIG. 18.

Then, as shown in FIG. 19, a part of the insulating film 10 and the insulating film 22 are removed through etching. With the remaining insulating film 10, the gate 1 is protected. Here, an etching selectivity of silicon oxide and silicon nitride is set so that silicon nitride is more etched.

In the above, the processing only on the memory area MA shown in FIG. 1 has been described. Next, processing common to the memory area MA and the peripheral circuit area CA is described.

With a resist as a mask, impurities are implanted to each polycrystalline silicon on a region desired to be as an n-type gate and a region desired to be as a p-type gate. Here, in the memory cell unit MA, n-type impurities are implanted for making an n-type gate.

Figure 11:
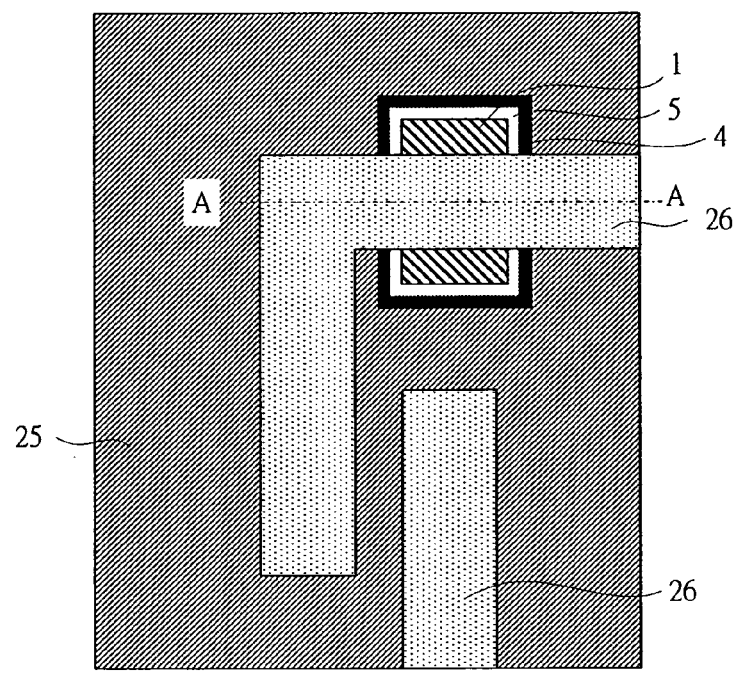
FIG. 11 is a schematic plan view of the memory cell during the manufacturing process continued from FIG. 10.
Figure 12:
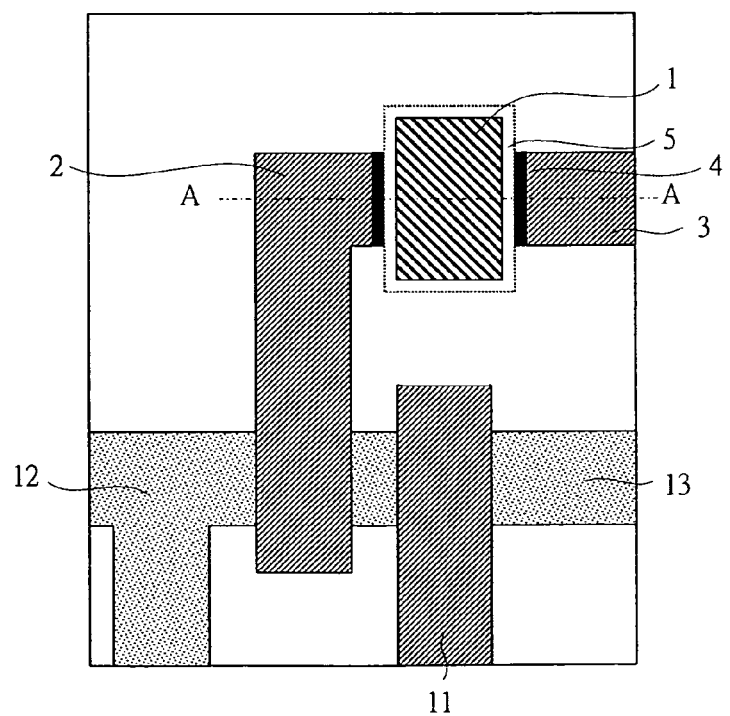
FIG. 12 is a schematic plan view of the memory cell during the manufacturing process continued from FIG. 11.
Figure 13:
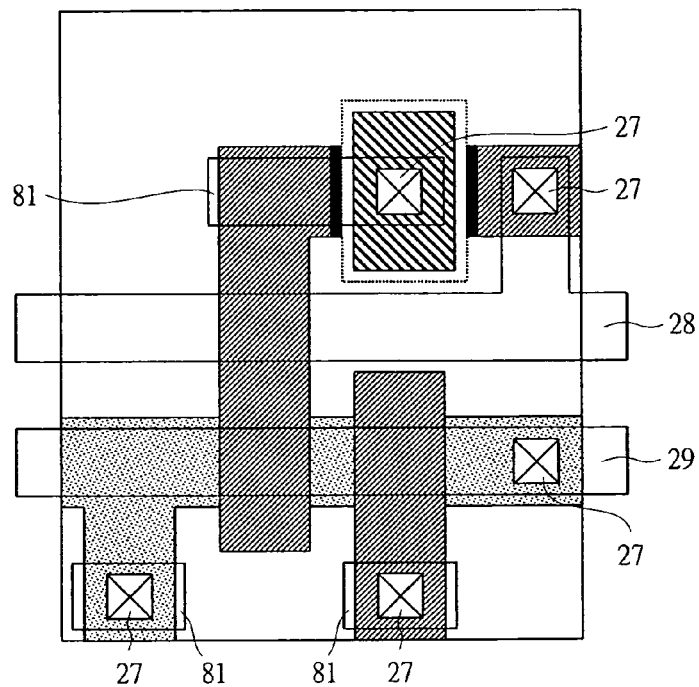
FIG. 13 is a schematic plan view of the memory cell during the manufacturing process continued from FIG. 12.
Figure 14:
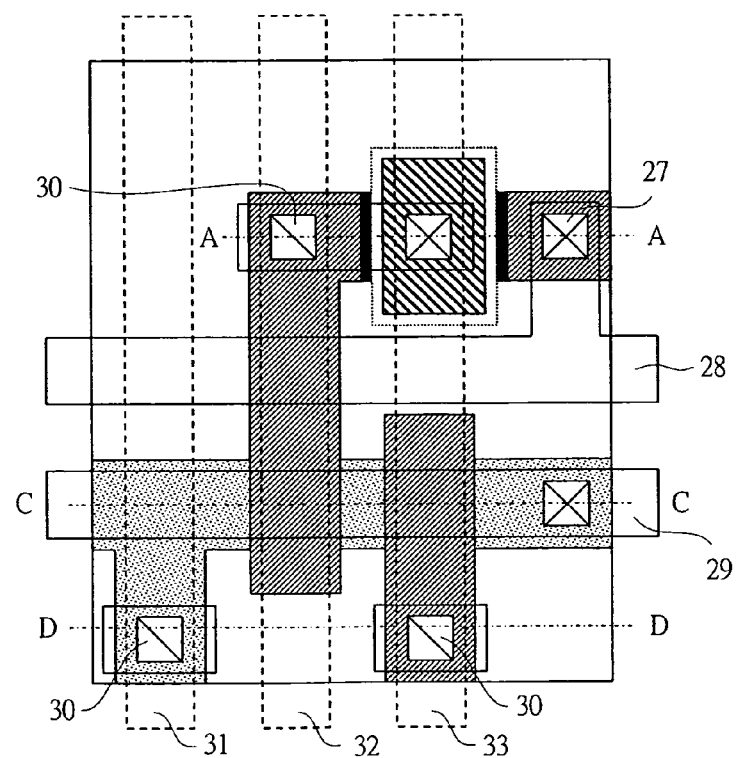
FIG. 14 is a schematic plan view of the memory cell during the manufacturing process continued from FIG. 13.
Figure 20:
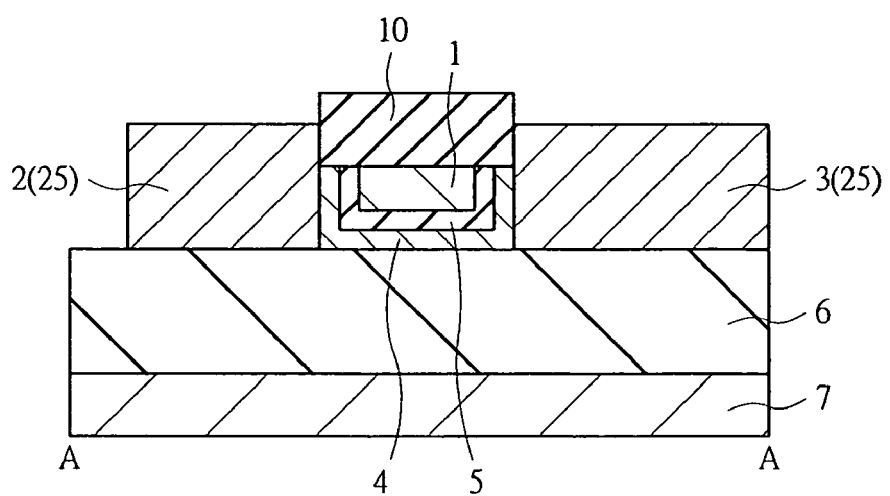
FIG. 20 is a schematic cross-section view of the memory cell during the manufacturing process continued from FIG. 19.

Then, with a resist as a mask, polycrystalline silicon is etched to form a gate pattern of the logic transistor and the high-voltage transistor in the peripheral circuit area CA. At this time, as shown in FIGS. 12 and 20, by using a resist pattern 26 as shown in FIG. 11, the source 2 and the drain 3 of the write transistor Qw are simultaneously formed from the conductive film 25. At this time, the gate 1 of the write transistor Qw is protected by the insulating film 10 made of silicon oxide, and therefore is not shaved. Here, in FIG. 11, the insulating film 10 is omitted for the purpose of ease of viewing.

Then, extension formation is performed for the high-voltage transistor. First, for an extension of an n-type MIS transistor of the high-voltage transistor, n-type impurities made of P (phosphorus) are implanted at, for example, approximately 10 KeV, with a resist as a mask. Next, for an extension of a p-type MIS transistor of the high-voltage transistor, p-type impurities made of $BF_2$ are implanted at, for example, approximately 5 KeV, with a resist as a mask.

Then, extension formation is performed for the logic transistor, the read transistor Qr, and the select transistor Qs. First, for an extension of an n-type MIS transistor of these transistors, n-type impurities made of As (arsenic) are implanted at, for example, approximately 3 KeV, with a resist pattern covering portions of the high-voltage transistor and the p-type MIS transistors as a mask. Next, p-type impurities are implanted to a further deeper position to increase a p-well concentration under the extension in order to prevent a punch-through. Next, at the time of forming an extension of a p-type MIS transistor of the logic transistor, the read transistor Qr, and the select transistor Qs, p-type impurities made of $BF_2$ are implanted at, for example, approximately 3 KeV. Next, n-type impurities are implanted to a further deeper position to increase an n-well concentration under the extension in order to prevent a punch-through.

Then, after forming a silicon oxide film through CVD, a silicon nitride film is deposited. Furthermore, after depositing a silicon oxide film through CVD, an etch-back technique is performed to form sidewalls on the gate side surfaces of the read transistor Qr, the select transistor Qs, the logic transistor, and the high-voltage transistor. Here, in FIGS. 22 and 23, the sidewalls 21 are shown on the side surface of the gate 2G of the read transistor Qr and the gate 11 of the select transistor Qs.

Then, with the sidewalls and a resist as a mask, n-type impurities are implanted to the n-type MIS transistor region, whilst p-type impurities are implanted to the p-type MIS transistor region, thereby forming a diffusion layer. In this impurity implantation for the diffusion layer, an impurity implantation process is used which is common to the read transistor Qr and the select transistor Qs in the memory area MA and the logic transistor and the high-voltage transistor in the peripheral circuit area CA and other circuit modules. By using the impurity implantation process as described above, a special mask or process is not required for forming an extension and a diffusion layer in the memory area, thereby achieving a reduction in manufacturing cost. Here, in FIG. 22, the source 12 and the drain 13, which are diffusion layers of the read transistor Qr and the select transistor Qs, respectively, and further extension regions 18 are shown.

Then, a silicon oxide film is deposited through CVD. Then, with a resist pattern covering a portion not to be silicided, such as a polycrystalline silicon resistance element, as a mask, the deposited silicon oxide film is removed.

Then, a nickel (Ni) film is deposited through sputtering, and annealing is then performed for reaction with silicon. After that, the nickel film is removed. At this time, the array portion of the memory cells are assumed to be not silicided. Such a manufacturing process has a feature such that, even if the insulating film 10 on the gate 1 of the write transistor Qw is shaved in a later process to cause the gate 1 made of polycrystalline silicon to be exposed, short-circuit between the source 2 and the drain 3 via the nickel film can be prevented.

Then, as shown in FIGS. 13 and 14 and FIGS. 21 to 23, a process of depositing and planarizing an interlayer insulating film 80 formed of, for example, a silicon oxide film, a process of forming the contact 27, a process of forming the via 30, and a process of forming a wiring 81 are performed. Then, for example, a protective film for protecting the memory area MA and the peripheral circuit area CA is formed, thereby almost completing a semiconductor device. The drain 3 of the write transistor Qw is connected to the write bit line 28 whilst the gate 1 of the write transistor Qw is connected to the write word line 32. Also, the drain 13 of the select transistor Qs is connected to the read bit line 29, whilst the gate 11 of the select transistor Qs is connected to the read word line 33. Furthermore, the source 12 of the read transistor Qr is connected to the source line 31.

In the first embodiment, the case where the write transistor Qw, the read transistor Qr, and the select transistor Qs are of n-type has been described. Alternatively, a combination of polarities and a combination of p-types may be applied. Also in such cases, similarly to the above, an extension shallower than the high-voltage transistor is used for the diffusion layers of the read transistor Qr and the select transistor Qs. Furthermore, if the read transistor Qr for use is of p-type, a gate-insulating-film leakage is small even with the same gate insulating film thickness, compared with the n-type read transistor Qr.

Also, in the first embodiment, the write transistor Qw is formed on the insulating layer 6 serving as an isolation region as shown in FIG. 4. Therefore, unlike a MIS transistor, no well is required to be formed, thereby allowing different polarities to be used without a particular increase in area.

Furthermore, in the first embodiment, the parasitic capacitance Cp (refer to FIGS. 70A and 70B) between the gate 1 and the source 2 of the write transistor Qw is made small. Therefore, there is a feature of a large reading margin. Still further, by setting the threshold of the read transistor Qr lower than that of the select transistor Qs, a sufficient reading current flows even if the potential of the charge-storage node is decreased due to capacitance coupling, thereby further enhancing a reading margin.

Still further, in the first embodiment, as for the select transistor Qs, the above-mentioned capacitance coupling does not matter and, in view of suppressing an off-leakage current at non-selected memory cell, the threshold is preferably not decreased too much. Therefore, it will be preferable that the threshold of the read transistor Qr to be lower than the threshold of the select transistor Qs. On the other hand, if the threshold of the read transistor Qr is set similarly to that of the select transistor Qs, it is not required to implant impurities separately between two transistors, and therefore a gate-to-gate distance between two transistors can be shortened, thereby allowing a reduction in cell area.

Still further, in the first embodiment, for ease of viewing, the channel width of the read transistor Qr is equal to the channel width of the select transistor Qs. Alternatively, the channel width of the read transistor Qr may be wider. With this, the charge-storage capacitance Cs can be increased. Therefore, it is possible to relatively suppress the influence of the parasitic capacitance Cp (refer to FIGS. 70A and 70B), that is, a phenomenon in which the potential of the charge-storage node is significantly lowered due to capacitance coupling with the parasitic capacitance Cp as the potential of the gate 1 of the write transistor Qw is lowered. Such a memory according to the first embodiment allows a stable reading operation with a less influence of the parasitic capacitance Cp. Also, there is an advantage of achieving a long retention time. Even if the channel width of the read transistor Qr is increased in order to ensure the charge-storage capacitance Cs, the channel width of the select transistor Qs does not have to be increased. This is because, since a sufficient voltage can be externally applied to the gate of the select transistor Qs, the conductance can be sufficiently decreased even with a small width. Accordingly, an increase in area can be prevented.

Still further, in the first embodiment, a semiconductor substrate made of p-type silicon is applied as a substrate. Alternatively, a substrate having a SOI (Silicon on Insulator) structure may be applied. When such a substrate having a SOI structure is applied, the characteristics of the logic transistor are improved, thereby achieving higher-speed, lower-power LSI (Large Scale Integration). Also, a triple-well process is not required, thereby simplifying the processing.

Still further, in the first embodiment, polycrystalline silicon with its surface being silicided is applied as a gate, and a silicon oxide film is applied as a gate insulating film. Alternatively, even when a metal gate or a high dielectric constant film, such as hafnium oxide or alumina, is applied as a gate insulating film, the above-described combination of the diffusion-layer structure and the gate insulating film is effective. In that case, the relation in magnitude of the gate insulating film thickness can be interpreted not in terms of physical film thickness but in terms of a silicon oxide film thickness obtained through electrical conversion. For example, when a high dielectric constant film and a silicon oxide film are mixed as gate insulating films, the permittivity of the high dielectric constant film is used for conversion to find a film thickness of a silicon oxide film that provides an equivalent capacitance. If the found film thickness is thinner than the film thickness of the silicon oxide film, the high dielectric constant film is interpreted as a thin gate insulating film, thereby keeping the relation described in the present embodiment effective as it is.

Figure 21:
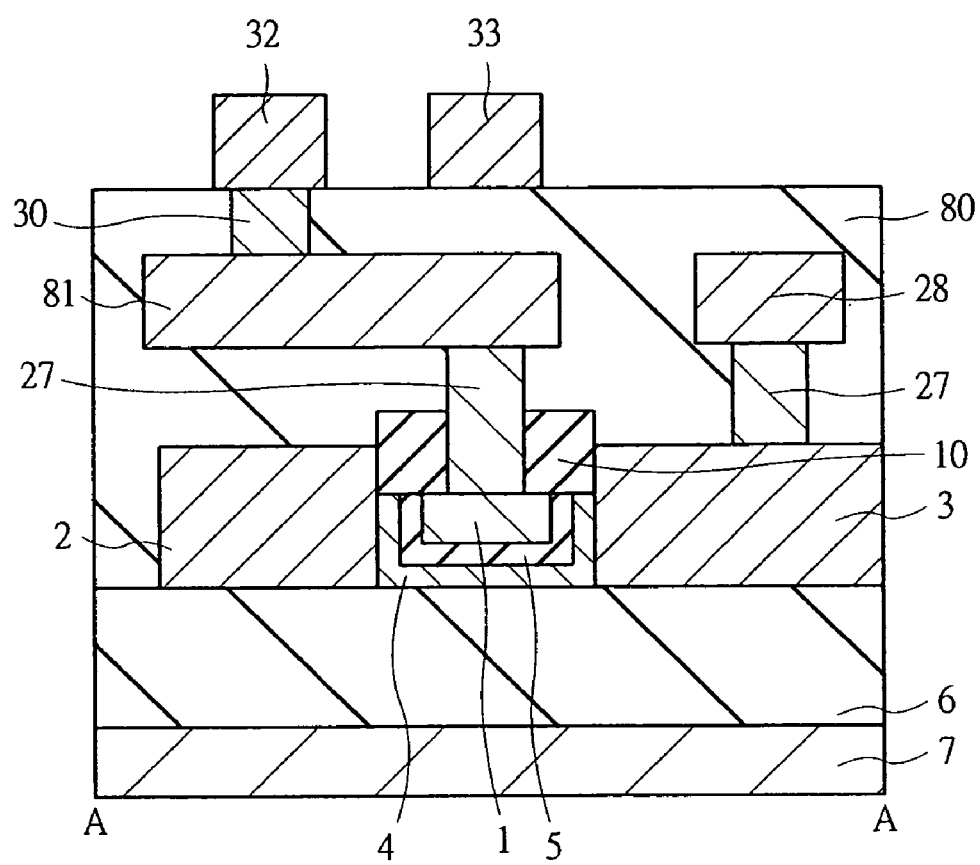
FIG. 21 is a schematic cross-section view of the memory cell during the manufacturing process continued from FIG. 20.
Figure 22:
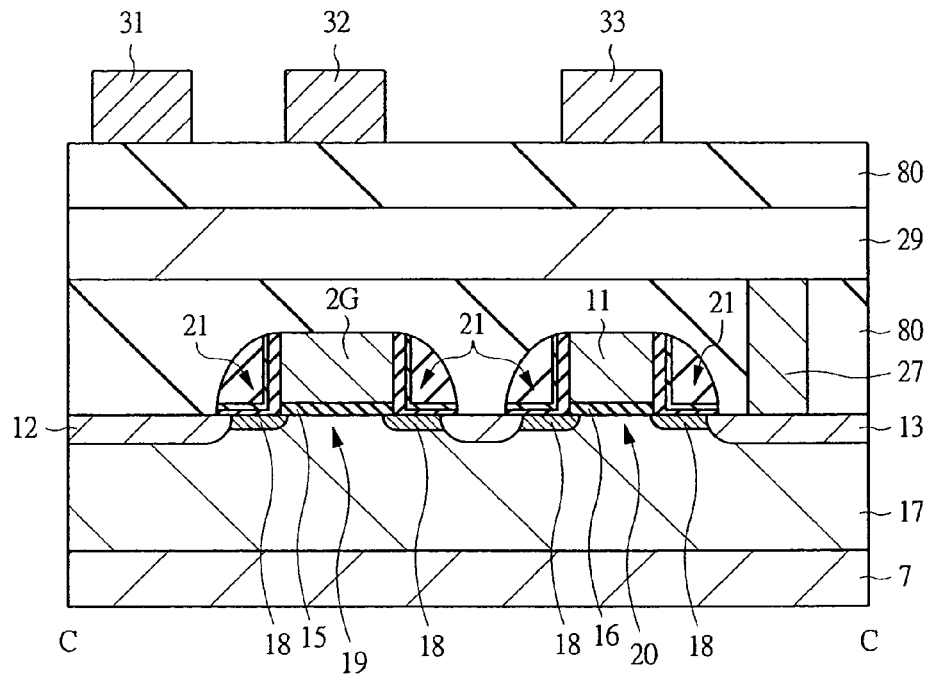
FIG. 22 is a schematic cross-section view of the memory cell during the manufacturing process in a portion corresponding to the portion along the C-C line in FIG. 3.
Figure 23:
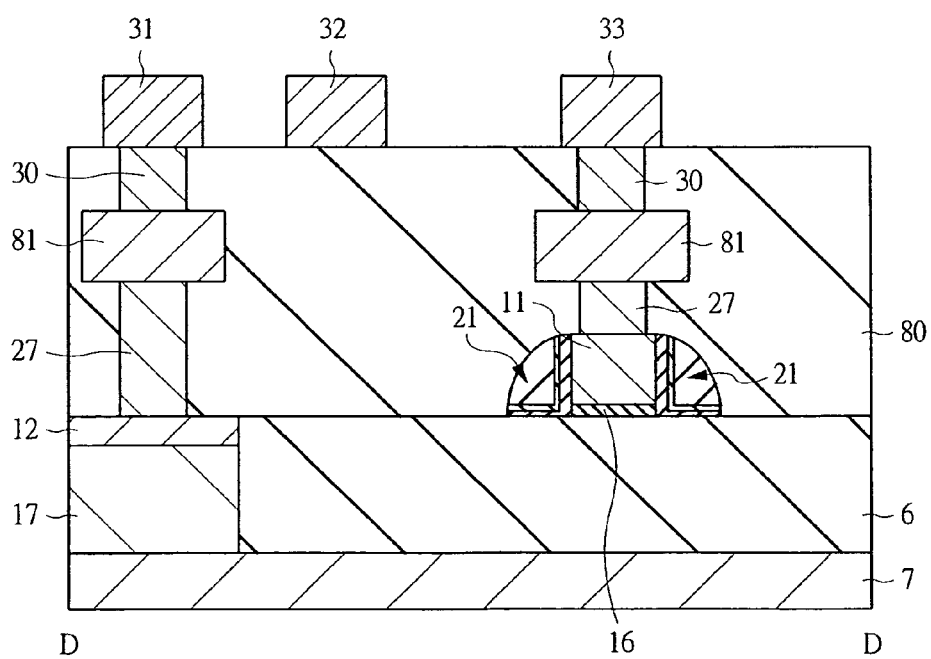
FIG. 23 is a schematic cross-section view of the memory cell during the manufacturing process in a portion corresponding to a portion along a D-D line in FIG. 3.

Still further, in the first embodiment, as shown in FIGS. 21 to 23, the write bit line 28 and the read bit line 29 are taken as a first wiring layer, whilst the write word line 32, the read word line 33, and the source line 31 are taken as a second wiring layer. Alternatively, other combinations may be used.

Still further, in the first embodiment, when reading is performed by using a cross-coupled sense amplifier, the read bit line 29 is in a floating state. By taking the bit lines as the first wiring layer, noise mixed from wirings of a third layer and upper can be prevented.

Still further, in the first embodiment, the case has been described where the bit lines are taken as the first-layer wiring. Alternatively, with the read word line being taken as a first-layer wiring and being laid out near the read transistor Qr, the potential of the charge-storage node can be increased by capacitance coupling with the gate of the read transistor Qr, which is a charge-storage node (storage node), at the time of reading. Furthermore, it is possible to compensate for the harmful effect described in the above Related Art section that, as the gate potential of the write transistor Qw is lowered, the potential of the charge-storage node is also lowered due to capacitance coupling with the parasitic capacitance Cp.

Still further, in the first embodiment of the present invention, the source line is laid out so as to be parallel to the write word line and the read word line. Alternatively, the source line may be parallel to the write bit line and the read bit line. As shown in the present embodiment, when the source line is laid out so as to be parallel to the write word line and the read word line, only the source line corresponding to the selected word line is selected, thereby cutting off the current flowing from the read bit line of the memory cell connected to the non-selected word line to the source line. On the other hand, when the source line is laid out so as to be parallel to the write bit line and the read bit line as opposed to the present embodiment, the current flowing through one read bit line flows one source line. Therefore, the channel width of the MIS transistor selecting a source line can be small. Any combination that is thought to be best in consideration of other design factors can be used.

What has been described above can be similarly applied to the other embodiments.

Next, the operation of the memory according to the first embodiment of the present invention is described with reference to FIG. 2. First, a writing operation is described. After setting the potential of the write bit line 28 at High (for example, on the order of 1 V) or Low (for example, on the order of 0 V) according to the information desired to be written, the voltage of the write word line 32 is increased from a holding potential (for example, on the order of −0.5 V) to a write potential (for example, on the order of 2 V). With this, the write transistor is turned ON, and the potential set at the write bit line 28 is written in the charge-storage node (storage node). Then, the voltage of the write word line 32 is retuned again to the holding potential, thereby ending the writing. During writing, the potential of the source line 31 is preferably fixed at, for example, on the order of 0 V herein. Also, with the read word line 33 electrically connected to the gate of the select transistor being set at a low potential (for example, on the order of 0V) to be turned OFF, an influence of potential fluctuations on the read bit line 29 at the time of a writing operation can be reduced.

Then, a reading operation is described. The reading operation is performed with the voltage of the write word line 32 being held at the holding potential (for example, on the order of −0.5 V). First, with the read bit line 29 being set at a pre-charge voltage (for example, on the order of 1 V), the potential of the source line 31 is fixed at a predetermined potential (for example, on the order of 0 V). With the read word line 33 electrically connected to the gate of the select transistor being set at a high potential (for example, on the order of 1 V) to turn the select transistor ON, a current flows between the read bit line 29 and the source line 31, thereby causing the potential of the read bit line 29 to fluctuate. Also, since the conductance of the read transistor is varied depending on the information stored in the read transistor, the fluctuation speed of the potential of the read bit line 29 is varied. Furthermore, a sense amplifier connected to the read bit line 29 is started at a predetermined timing to amplify a potential relation with references, thereby allowing a reading operation. In the potential relation described herein, when High writing is performed at the time of writing, a decrease in potential of the read bit line 29 is quick so that amplification is performed as Low. The potential of the information written at Low is amplified to a High potential. Therefore, note that a relation of High and Low at the time of writing is reversed at the time of reading. Here, this operation is basically nondestructive reading, and is different from reading of one-transistor one-capacitor DRAM. However, this operation can be such that element designing and voltage setting tolerated by a reading disturb are performed and then re-writing is performed after reading.

Then, a refresh operation is described. The refresh operation can be performed at intervals of, for example; 128 ms. First, the memory cell driven by the selected read word line 33 is read. Next, inversed information of amplify information on that row is loaded to the write bit line 28, and then a writing operation is performed by using the write word line 32 corresponding to the original row, thereby achieving refresh. In this manner, by repeating this operation through sequel selection, thereby allowing a refresh operation for the entire memory cell array.

Second Embodiment

Figure 24:
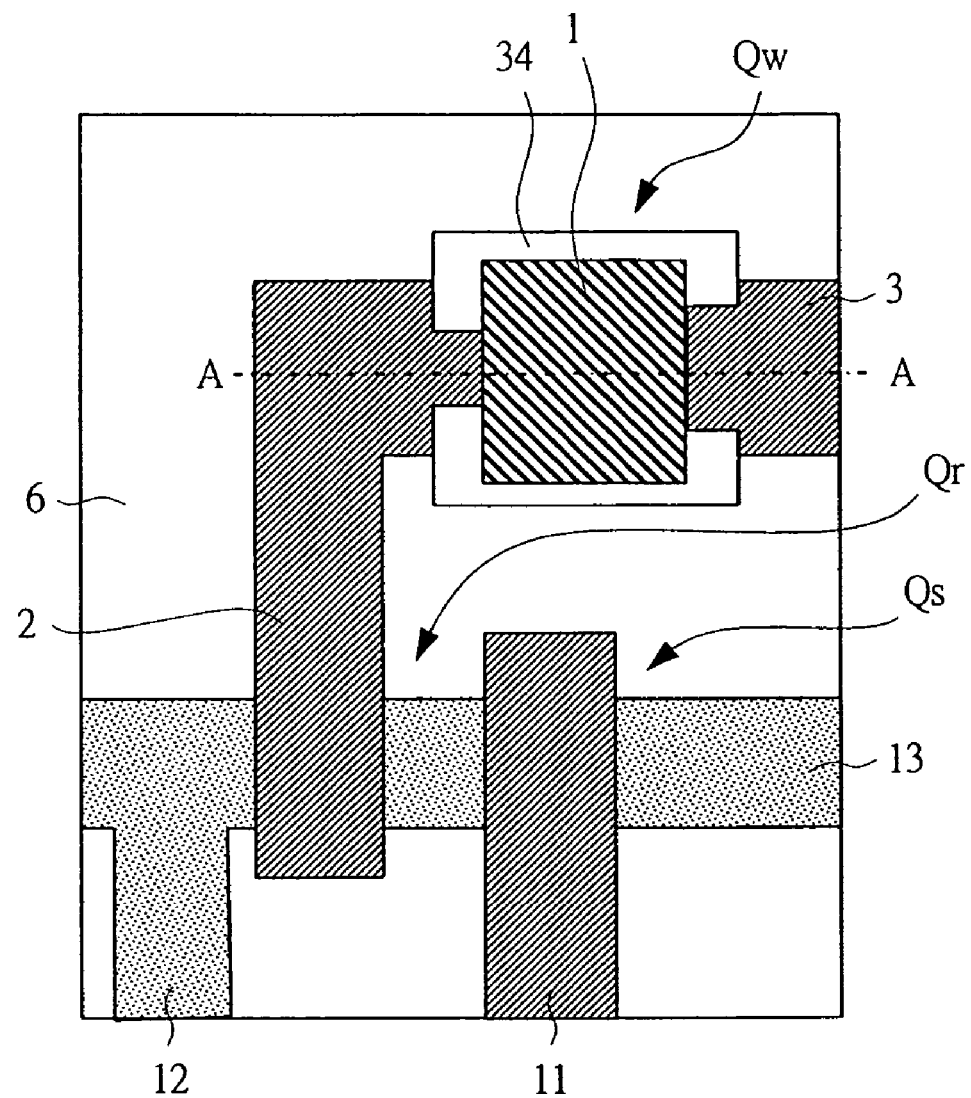
FIG. 24 is a schematic plan view of a memory cell according to a second embodiment of the present invention.
Figure 25:
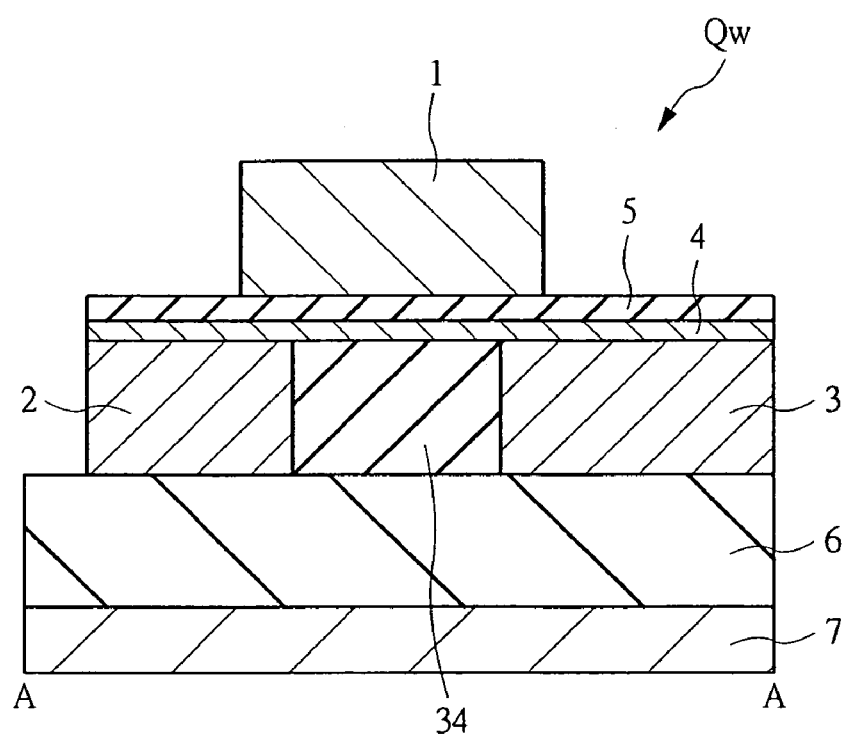
FIG. 25 is a cross-section view along an A-A line in FIG. 24.
Figure 26:
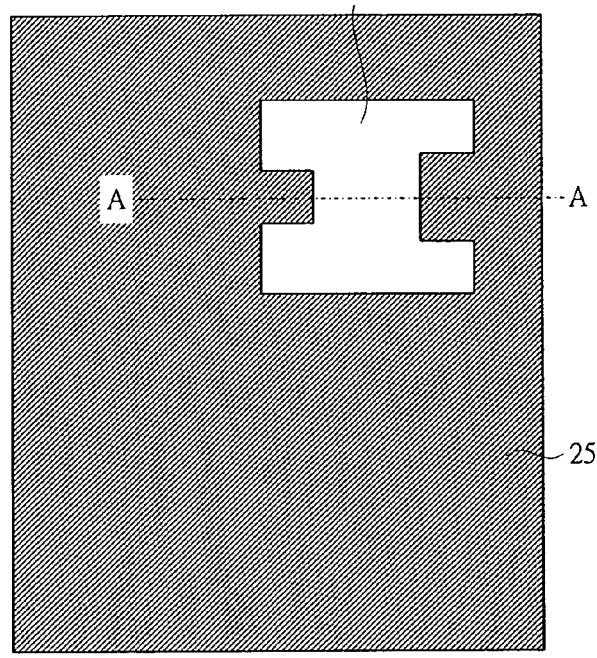
FIG. 26 is a schematic plan view of a memory cell during a manufacturing process in a region corresponding to FIG. 24.
Figure 27:
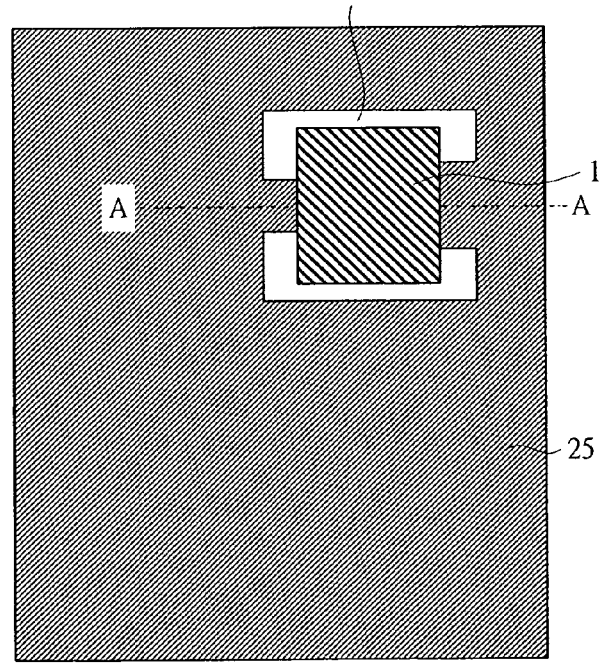
FIG. 27 is a schematic plan view of the memory cell during the manufacturing process continued from FIG. 26.
Figure 28:
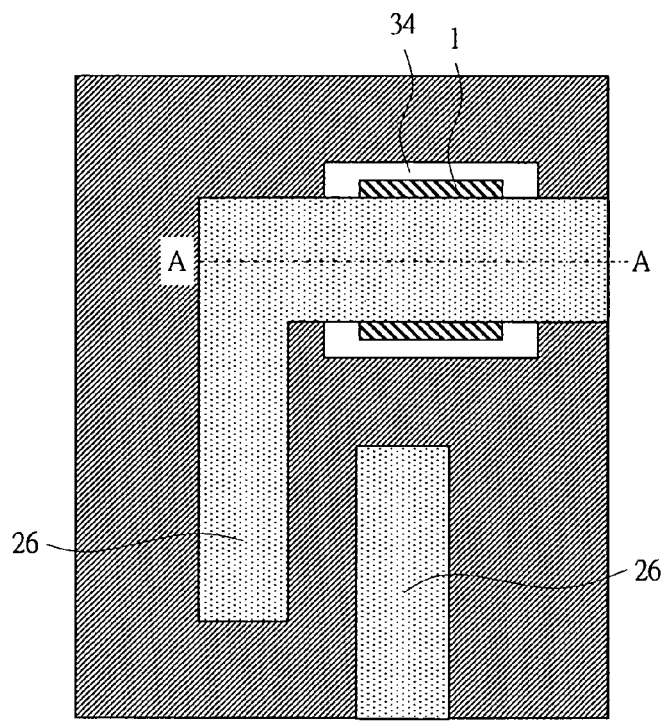
FIG. 28 is a schematic plan view of the memory cell during the manufacturing process continued from FIG. 27.

A semiconductor device according to a second embodiment is described with reference to FIGS. 24 to 28, focusing on differences from the first embodiment. FIG. 24 is a schematic plan view of a memory cell according to the second embodiment, depicting a write transistor Qw, a read transistor Qr, and a select transistor Qs. FIG. 25 is a cross-section view along an A-A line in FIG. 24. FIGS. 26 to 28 are schematic plan views of a memory cell during a manufacturing process in a region corresponding to FIG. 24.

First, the structure of the write transistor Qw of a unit memory cell according to the second embodiment is described. The structure of the write transistor Qw of FIG. 4 according to the first embodiment is such that the overlapped portion 8 of the gate on the upper surface of the source in the write transistor Qw of FIG. 71 studied by the inventors is eliminated. In the second embodiment, the structure does not include the facing portion 9. That is, as shown in FIGS. 24 and 25, the structure is such that an insulating film 34 made of, for example silicon oxide, is embedded between a source 2 and a drain 3 formed on an insulating layer 6 of a substrate 7, and a channel 4, a gate insulating film 5, and a gate 1 are formed on the source 2, the drain 3, and the insulating film 34.

As in the structure of the write transistor Qw of FIG. 71 studied by the inventors, if the overlapped portion 8 is present, alignment deviation causes variations in the parasitic capacitance Cp (refer to FIGS. 70A and 70B). In this regard, with the advancement of lithography technology, alignment margin is expected to be scaled down. In one scheme, when the facing portion 9 is present, the gate height is lowered in order to reduce the parasitic capacitance Cp of this facing portion 9. However, for convenience of taking the gate as a mask for impurity implantation for extension regions, it is impossible to lower the gate height too sharply. As a result, with the advancement of lithography technology, parasitic capacitance components of the facing portion 9 are relatively increased.

To get around this problem, according to the second embodiment, the facing portion 9 in FIG. 71 is eliminated from the structure, thereby allowing a stable reading operation with a less influence of the parasitic capacitance Cp. also, the structure according to the second embodiment has a feature of being effective as microfabrication progresses.

In this manner, in the second embodiment, the write transistor Qw includes the source 2 and the drain 3 that are formed on the insulating layer 6, the channel 4 formed of a semiconductor on the source 2 and the drain 3 and electrically connecting the source 2 and the drain 3, and the gate 1 that is formed on an upper portion of the source 2 and the drain 3 and is electrically insulated from the channel 4 by the gate insulating film 5, the gate 1 controlling a potential of the channel 4. The channel 4 is formed on the entire surface of a lower portion of this gate 1.

Also, as shown in FIG. 24, in a direction that crosses a direction in which a current flows from the source 2 to the drain 3 through the channel 4, the dimension of the source 2 on a lower portion of the gate 1 is different from the dimension of the drain 3. That is, for a large ON current, the dimension of the drain 3 on the lower portion of the gate 1 is longer than the dimension of the source 2 on the lower portion of the gate 1.

Next, differences from the manufacturing method according to the previous embodiment are described. From formation of an insulating layer 6 serving as an isolation region to formation of a gate insulating film 5 and deposition of a conductive film 25 made of, for example, polycrystalline silicon, are similar to those in the manufacturing method according to the first embodiment. Here, a cap formed of a silicon nitride film is not formed.

Then, as shown in FIG. 26, after the conductive film 25 is etched with a resist as a mask to form a structure with the conductive film 25 being removed from a hole pattern, an insulating film 34 is deposited, and then CMP is performed to fill the hole pattern. Here, unlike the first embodiment, the hole pattern does not have a rectangular shape, but has a concavity and convexity as shown in FIG. 26.

Then, after depositing a semiconductor film made of amorphous silicon having a thickness on the order of 3 nm and serving as the channel 4, the surface is oxidized to further form a silicon oxide film having a thickness on the order of 10 nm (which will later serve as the gate insulating film 5). On that silicon oxide film, polycrystalline silicon doped with P (phosphorus) having a thickness on the order of 80 nm is deposited, and then the surface is oxidized to form a silicon oxide film. In this process, the amorphous thin film formed of the semiconductor film, which is the channel 4, is crystallized.

Then, with a resist as a mask, the silicon oxide film, the polycrystalline silicon film, and the silicon oxide film (which will later serve as the gate insulating film 5) under those are etched to form the gate 1 of the write transistor made of polycrystalline silicon (refer to FIG. 27).

Then, with a resist pattern 26 (refer to FIG. 28) for gate processing of the read transistor Qr as a mask, the polycrystalline silicon is etched to form the source 2 (which is also a charge-storage node) and the drain 3 of the write transistor Qw. At this time, the gate 11 of the select transistor Qs is simultaneously formed. The processes thereafter can be similar to those in the manufacturing process according to the first embodiment.

With a contrivance in the shape of the hole pattern embedded in the insulating film 34, the overlapped area of the gate 1 and the charge-storage node (source 2) is decreased, thereby achieving a more stable reading characteristic. Here, on the drain 3 side, the overlapped area does not particularly have to be small. Also, for a large ON-state current, the line width on the drain side is thick, and the width is asymmetric between the source and the drain (refer to FIG. 24).

Third Embodiment

Figure 29:
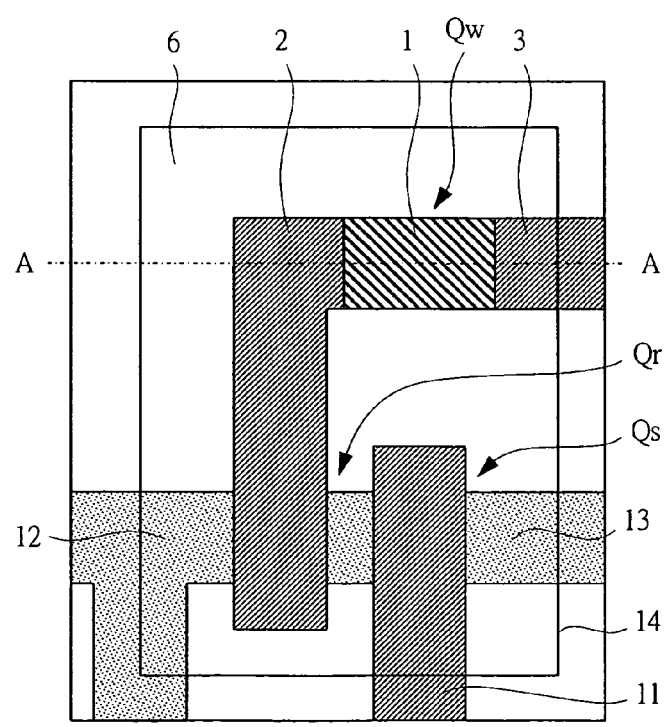
FIG. 29 is a schematic plan view of a memory cell according to a third embodiment of the present invention.
Figure 30:
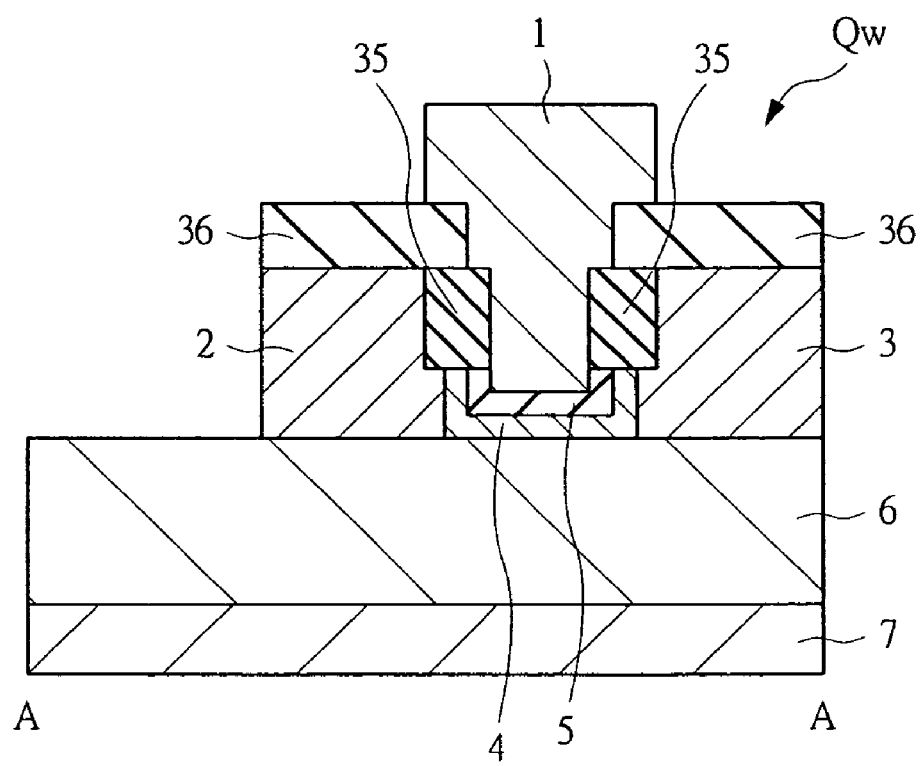
FIG. 30 is a cross-section view along an A-A line in FIG. 29.
Figure 31:
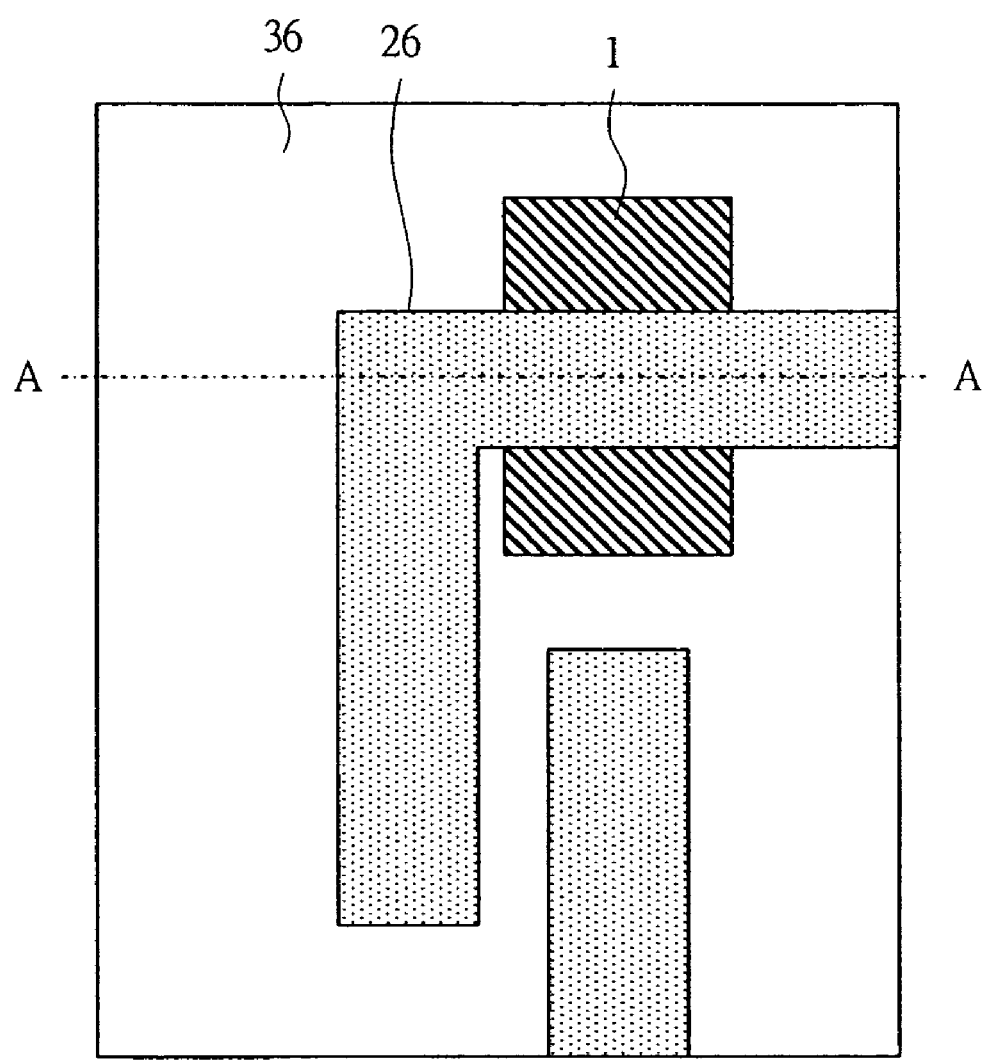
FIG. 31 is a schematic plan view of the memory cell during a manufacturing process in a region corresponding to FIG. 29.

A semiconductor device according to a third embodiment is described with reference to FIGS. 29 to 35, focusing on differences from the first embodiment. FIG. 29 is a schematic plan view of a memory cell according to the third embodiment, depicting a write transistor Qw, a read transistor Qr, and a select transistor Qs. FIG. 30 is a cross-section view along an A-A line in FIG. 29. FIG. 31 is a schematic plan view of the memory cell during a manufacturing process in a region corresponding to FIG. 29. FIGS. 32 to 35 are schematic cross-section views of the memory cell during the manufacturing process in a portion corresponding to the portion along the A-A line in FIG. 29. Here, in FIGS. 29 and 30, for ease of description of an element structure, components, such as contacts and wirings, are omitted. Also, in FIG. 29, an insulating film 36 shown in FIG. 30 is omitted for ease of viewing.

First, the structure of the write transistor Qw of a unit memory cell according to the third embodiment is described. As shown in FIG. 30, in the third embodiment, unlike the structure of the write transistor Qw of FIG. 71 studied by the inventors, insulating films 36 and insulating films 35 made of, for example, silicon oxide, and thicker than the gate insulating film 5 are formed on portions overlapping with the source 2 and the drain 3 and facing portions (the overlapped portions 8 and the facing portions 9 in FIG. 71), respectively. Also, since the insulating film 35 is thick, the width of each overlapped portion is decreased by the thickness of the insulating film 35.

With such a structure of the write transistor Qw, the memory according to the third embodiment can perform a stable reading operation with a less influence of the parasitic capacitance Cp (refer to FIGS. 70A and 70B).

As such, in the third embodiment, the write transistor Qw has the source 2 and the drain 3 that are formed on the insulating layer 6, the channel 4 formed on the insulating layer 6 and between the source 2 and the drain 3 and is made of a semiconductor, and the gate 1 formed on an upper portion of the insulating layer 6 and between the source 2 and the drain 3 and electrically insulated from the channel 4 by the gate insulating film 5 and controlling the potential of the channel 4. Also, the insulating film 35 is formed on the side surfaces of the source 2 and the drain 3 to insulate and separate the gate 1 from the source 2 and the drain 3. Furthermore, the insulating film 35 between the gate 1 and the source 2 and drain 3 is thicker than the gate insulating film 5 between the gate 1 and the channel 4.

Next, differences from the manufacturing process shown in the first embodiment are described. From formation of the insulating layer 6 to formation of the gate insulating film 5 and deposition of a conductive film 25 made of, for example, polycrystalline silicon, are similar to those in the manufacturing method according to the first embodiment. Then, on the conductive film 25, the insulating film 36 made of, for example, silicon oxide, and then the insulating film 37 made of, for example, silicon nitride, are sequentially deposited.

Figure 32:
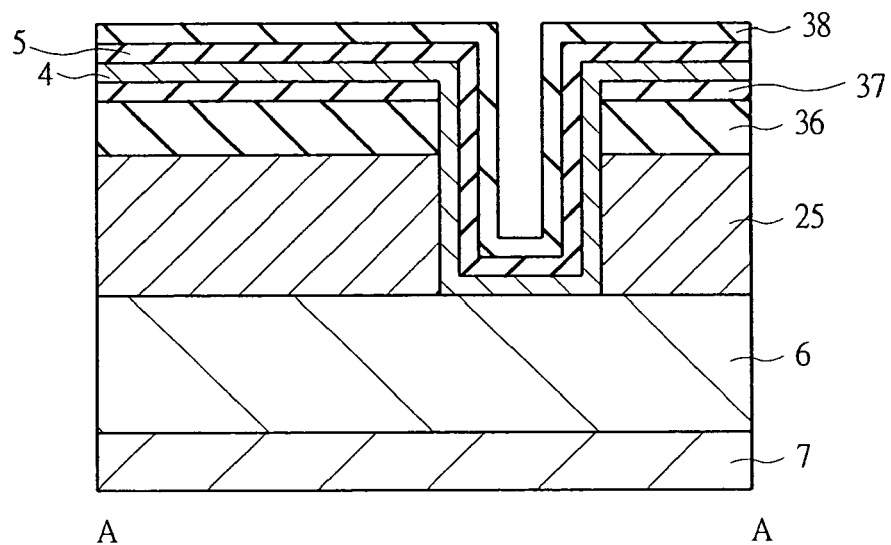
FIG. 32 is a schematic cross-section view of the memory cell during the manufacturing process in a portion corresponding to the portion along the A-A line in FIG. 29.

Then, as shown in FIG. 32, etching is performed with the hole pattern of a resist as a mask, and then the conductive film 25 made of, for example, polycrystalline silicon, is removed from the channel and gate regions. Then, after cleaning, deposited are the channel 4 made of amorphous silicon having a thickness on the order of, for example, 2.5 nm, the gate insulating film 5 having a thickness on the order of, for example, 15 nm, and then the conductive film 38 made of, for example, silicon nitride. Next, annealing is performed, thereby crystallizing the amorphous silicon of the channel 4 into polycrystalline silicon.

Figure 33:
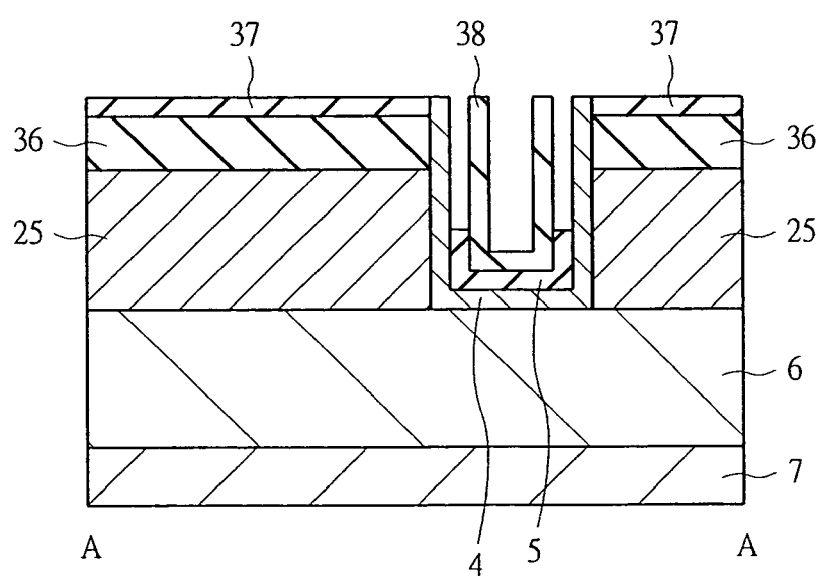
FIG. 33 is a schematic cross-section view of the memory cell during the manufacturing process continued from FIG. 32.

Then, as shown in FIG. 33, CMP or an etch-back technique is performed until the surface of the insulating film 37 is exposed, and then a part of the gate insulating film 5 formed of a silicon oxide film is etched, with a portion on the order of, for example, 20 nm, from the hole bottom being left. Here, from an upper side surface of the hole, the channel 4 made of polycrystalline silicon is exposed.

Figure 34:
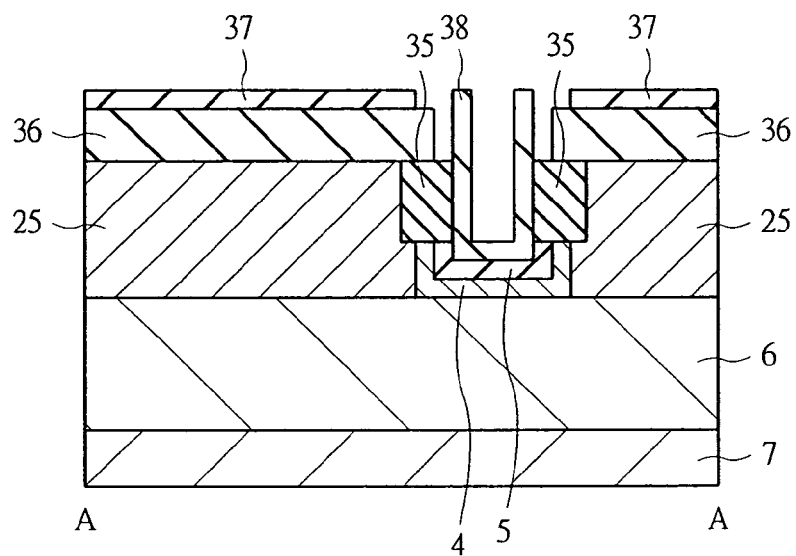
FIG. 34 is a schematic cross-section view of the memory cell during the manufacturing process continued from FIG. 33.

Then, as shown in FIG. 34, the channel 4 made of polycrystalline silicon exposed from the side surface of the hole is oxidized to form the insulating film 35. Here, the channel 4 on the side surface of the insulating film 36 is oxidized to be included in the insulating film 36.

Figure 35:
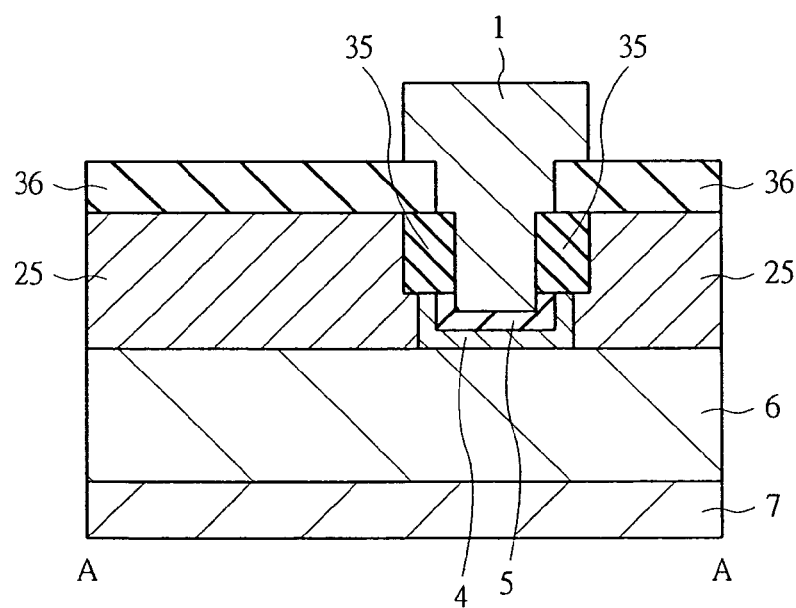
FIG. 35 is a schematic cross-section view of the memory cell during the manufacturing process continued from FIG. 34.

Then, as shown in FIG. 35, the insulating film 37 is removed and, after a polycrystalline silicon film serving as the gate 1 is deposited, etching is performed with a resist as a mask to remove the polycrystalline silicon film other than the gate 1 of the write transistor.

Then, by applying a resist pattern 26 as shown in FIG. 31, unwanted portions of the insulating film 36 and the conductive film 25 are removed to form the source 2 and the drain 3 of the write transistor Qw. At this time, what is different from the first embodiment is that the gate 1 and the gate insulating film 5 of the write resistor Qw portion and also the semiconductor film serving as the channel 4 are processed with the same resist pattern as a mask. Also, the polycrystalline silicon is etched with a resist as a mask to form a gate pattern of each of a logic transistor and a high-voltage transistor. Thereafter, the manufacturing process is similar to that of the first embodiment.

Fourth Embodiment

Figure 36:
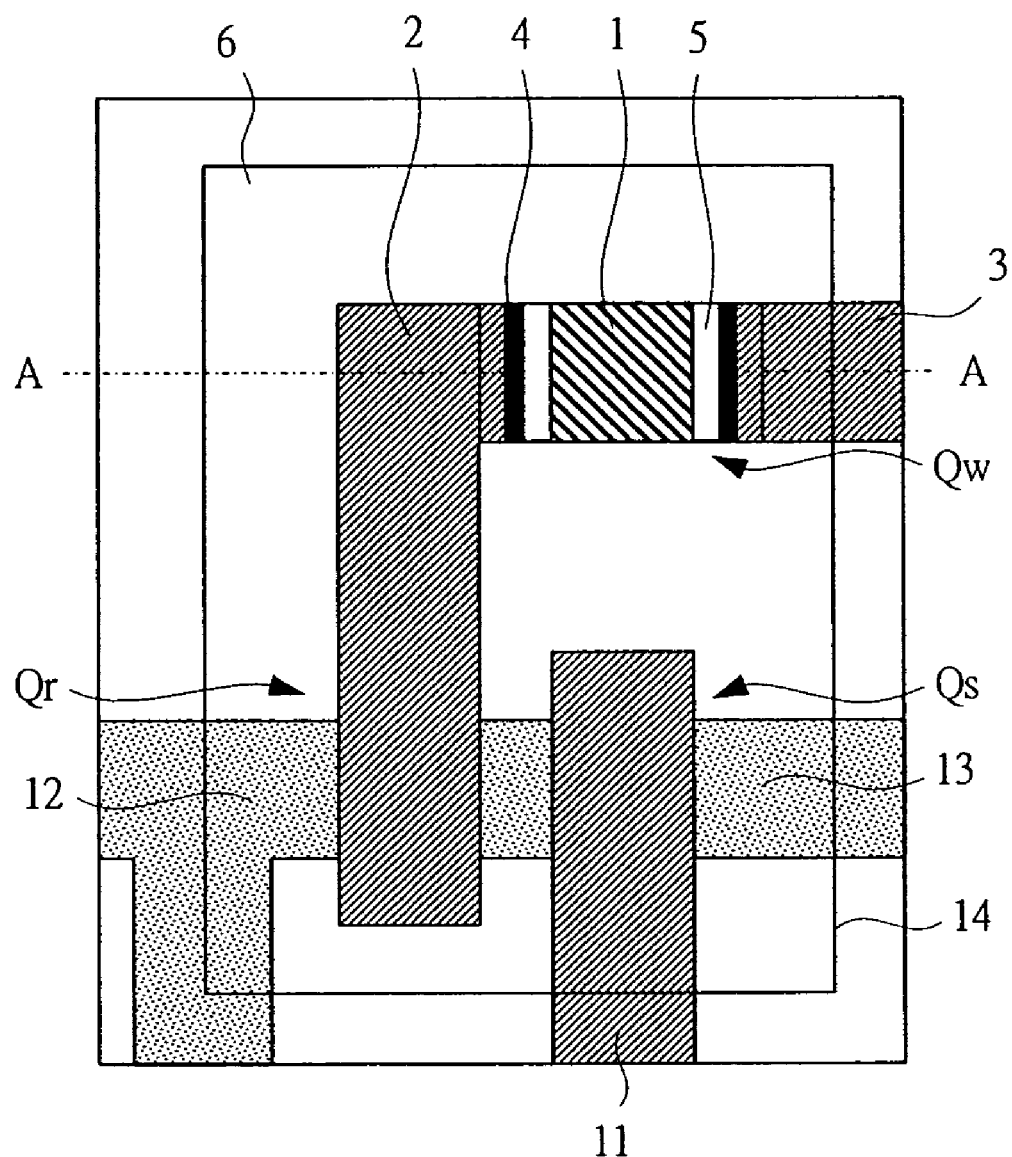
FIG. 36 is a schematic plan view of a memory cell according to a fourth embodiment of the present invention.
Figure 37:
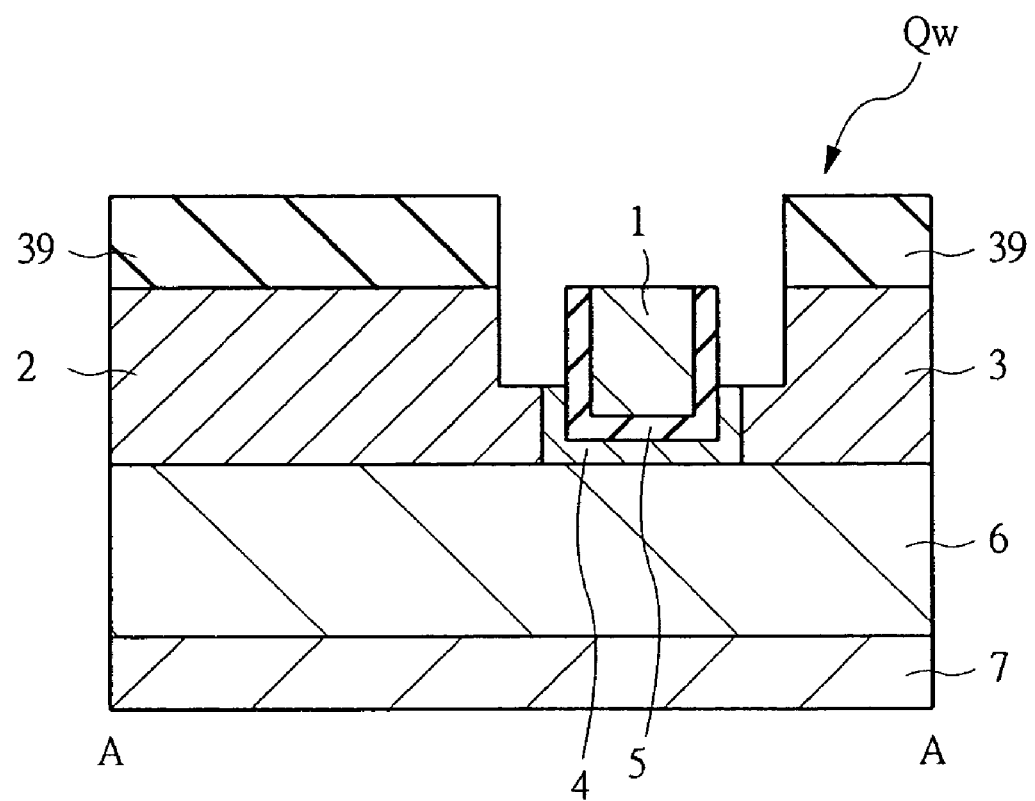
FIG. 37 is a cross-section view along an A-A line in FIG. 36.
Figure 38:
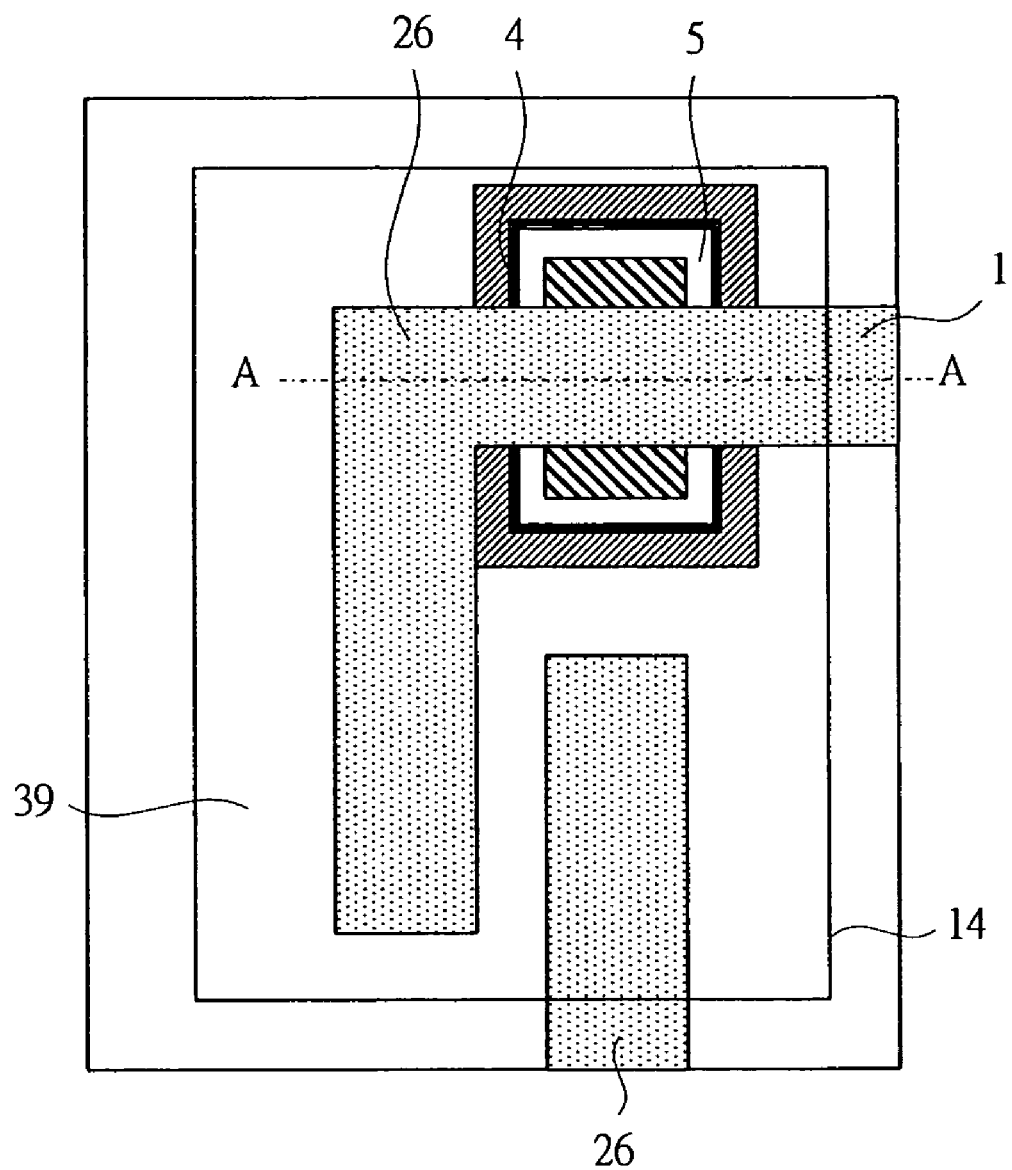
FIG. 38 is a schematic plan view of the memory cell during a manufacturing process in a region corresponding to FIG. 36.
Figure 39:
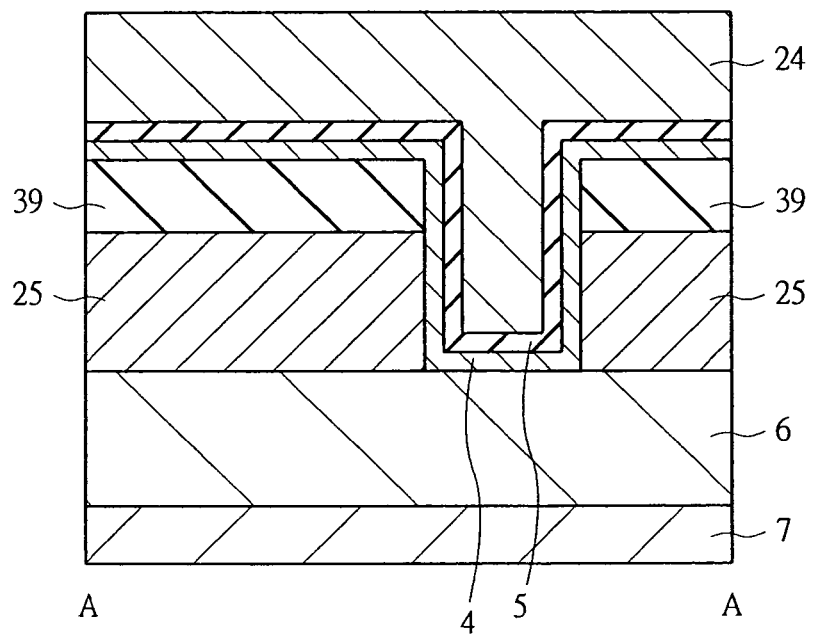
FIG. 39 is a schematic cross-section view of the memory cell during the manufacturing process in a portion corresponding to the portion along an A-A line in FIG. 36.
Figure 40:
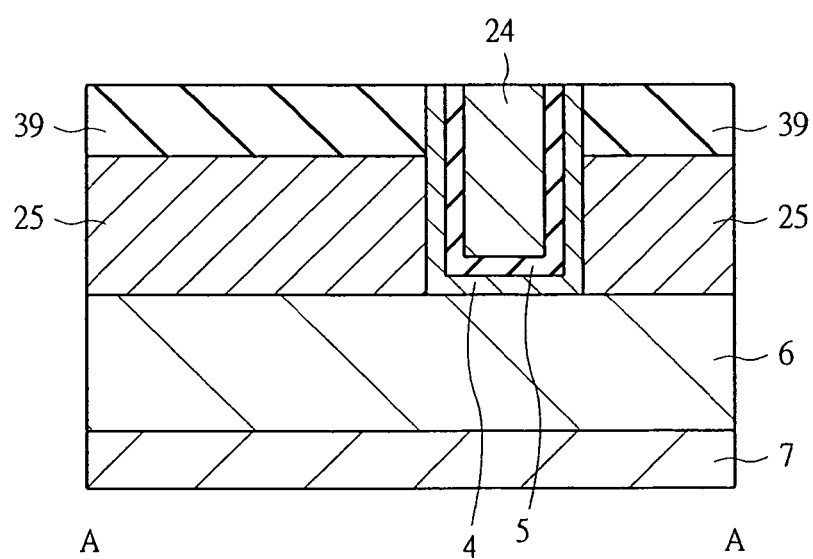
FIG. 40 is a schematic cross-section view of the memory cell during the manufacturing process continued from FIG. 39.
Figure 41:
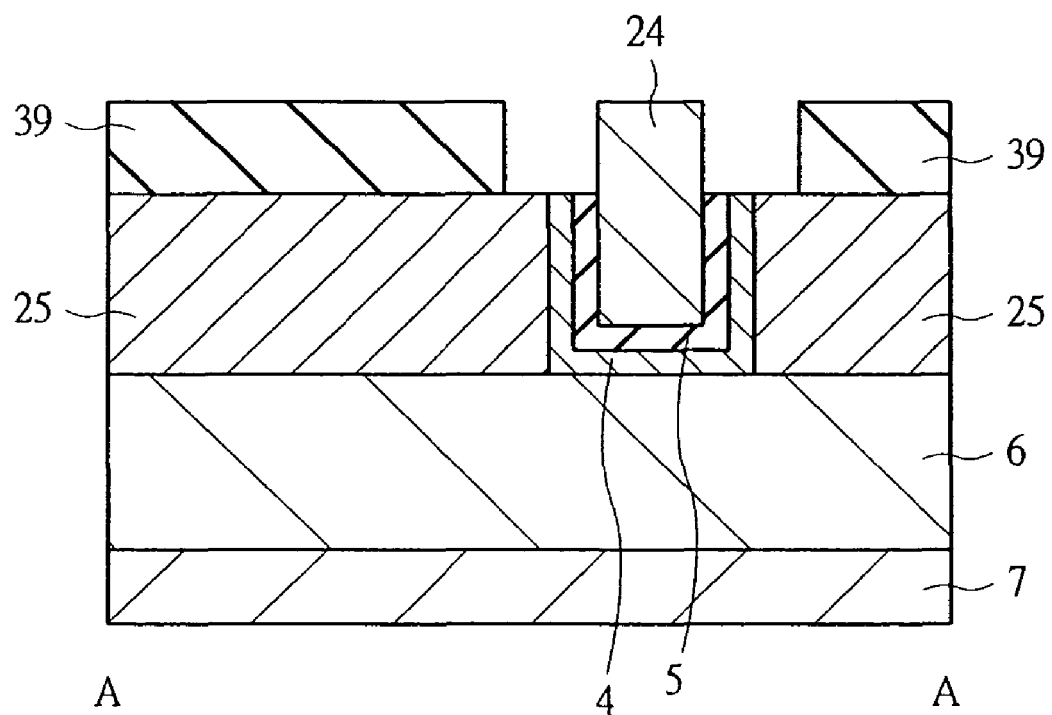
FIG. 41 is a schematic cross-section view of the memory cell during the manufacturing process continued from FIG. 40.

A semiconductor device according to a fourth embodiment is described with reference to FIGS. 36 to 41, focusing on differences from the first embodiment. FIG. 36 is a schematic plan view of a memory cell according to the fourth embodiment, depicting a write transistor Qw, a read transistor Qr, and a select transistor Qs. FIG. 37 is a cross-section view along an A-A line in FIG. 36. FIG. 38 is a schematic plan view of the memory cell during a manufacturing process in a region corresponding to FIG. 36. FIGS. 39 to 41 are schematic cross-section views of the memory cell during the manufacturing process in a portion corresponding to the portion along the A-A line in FIG. 36. Here, in FIGS. 36 and 37, for ease of description of an element structure, components, such as contacts and wirings, are omitted. Also, in FIG. 36, for ease of viewing, an insulating film 39 shown in FIG. 37 is omitted.

First, the structure of the write transistor Qw of a unit memory cell according to the fourth embodiment is described. As shown in FIG. 37, in the fourth embodiment, unlike the structure of the write transistor Qw in FIG. 71 studied by the inventors, portions of a source 2, a drain 3 and a gate 1 facing each other are removed with a portion connected to a channel 4 being left.

With such a structure of the write transistor Qw, the memory according to the fourth embodiment can perform a stable reading operation with a less influence of the parasitic capacitance Cp (refer to FIGS. 70A and 70B).

Next, differences from the manufacturing process shown in the first embodiment are described. From formation of the insulating layer 6 to formation of the gate insulating film 5 and deposition of a conductive film 25 made of, for example, polycrystalline silicon, are similar to those in the manufacturing method according to the first embodiment. Then, on the conductive film 25, an insulating film 39 made of, for example, silicon oxide, is deposited.

Then, as shown in FIG. 39, etching is performed with a hole pattern of a resist as a mask to remove the insulating film 39 and the conductive film 25 in the channel and gate regions. After cleaning, deposited are the channel 4 made of amorphous silicon having a thickness on the order of 2.5 nm and the gate insulating film 5 formed of a silicon oxide film having a thickness on the order of 15 nm. Here, annealing is performed, thereby crystallizing amorphous silicon into polycrystalline silicon. Next, a conductive film 24 made of for example, polycrystalline silicon, serving as a gate is deposited on the gate insulating film 5.

Then, as shown in FIG. 40, CMP or an etch-back technique is performed until the surface of the insulating film 39 is exposed.

Then, as shown in FIG. 41, etching is performed with a resist as a mask to remove portions of the insulating film 39 near the conductive film 24 serving as a gate of the write transistor. Next, with the remaining insulating film 39 as a mask, the conductive film 24 is etched so as to have a height equal to the height of the upper surface of the conductive film 25 (or the lower surface of the insulating film 39) (refer to FIG. 37).

Then, by applying a resist pattern 26 as shown in FIG. 38, unwanted portions of the insulating film 39 and the conductive film 25 are removed to form the source 2 and the drain 3 of the write transistor Qw. At this time, what is different from the first embodiment is that the gate 1 and the gate insulating film 5 of the write resistor Qw portion and also the semiconductor film serving as the channel 4 are processed with the same resist pattern as a mask. Also, the conductive film 25 made of the polycrystalline silicon can be etched with a resist as a mask to form a gate pattern of each of a logic transistor and a high-voltage transistor. Thereafter, the manufacturing process is similar to that of the first embodiment.

Fifth Embodiment

Figure 42:
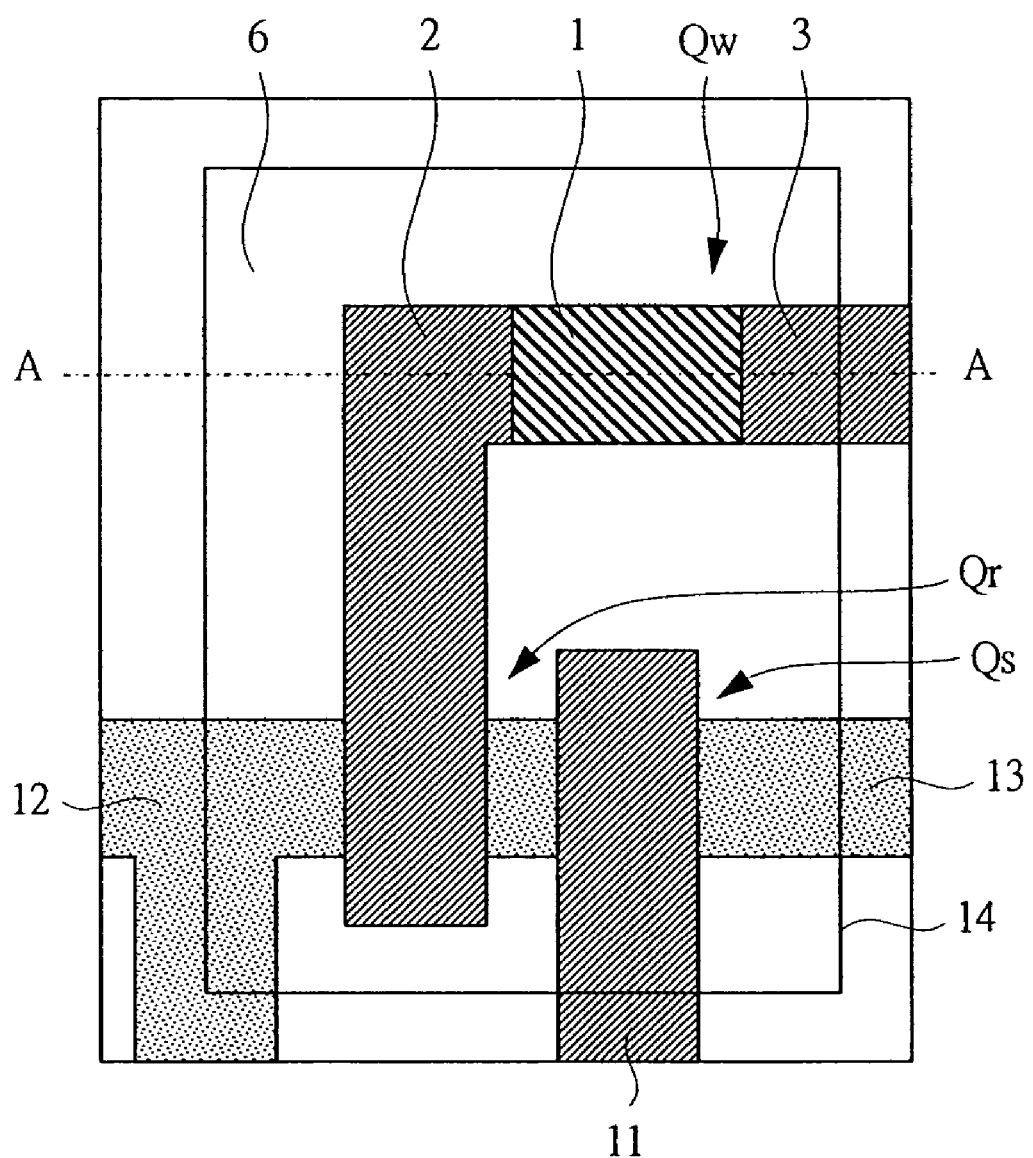
FIG. 42 is a schematic plan view of a memory cell according to a fifth embodiment of the present invention.
Figure 43:
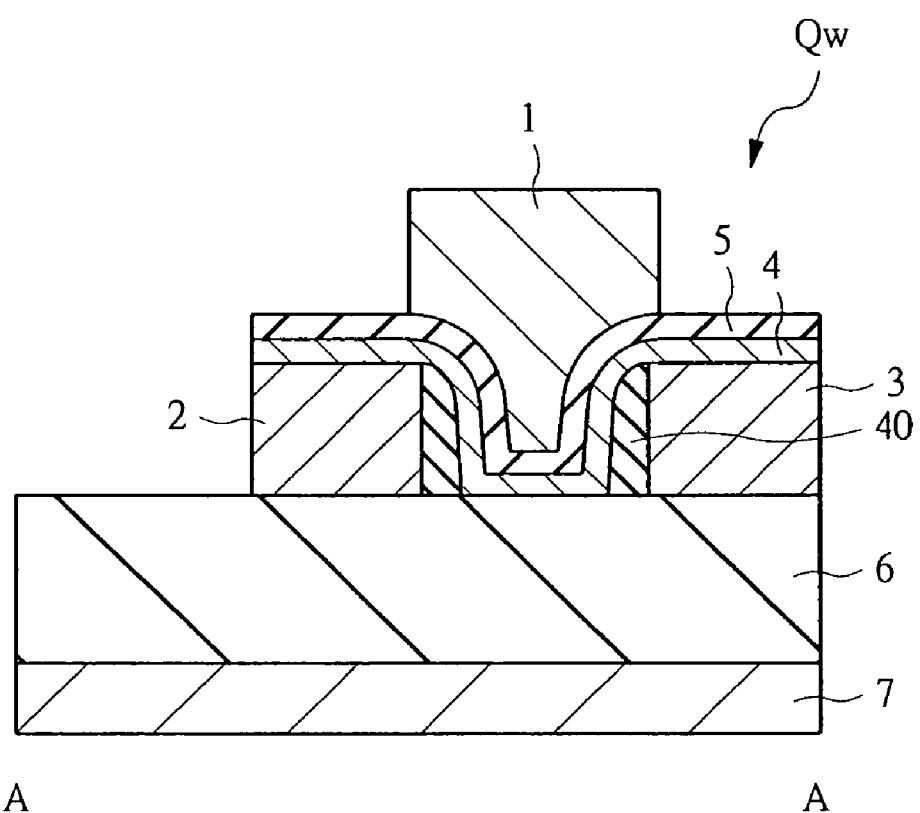
FIG. 43 is a cross-section view along an A-A line in FIG. 42.
Figure 44:
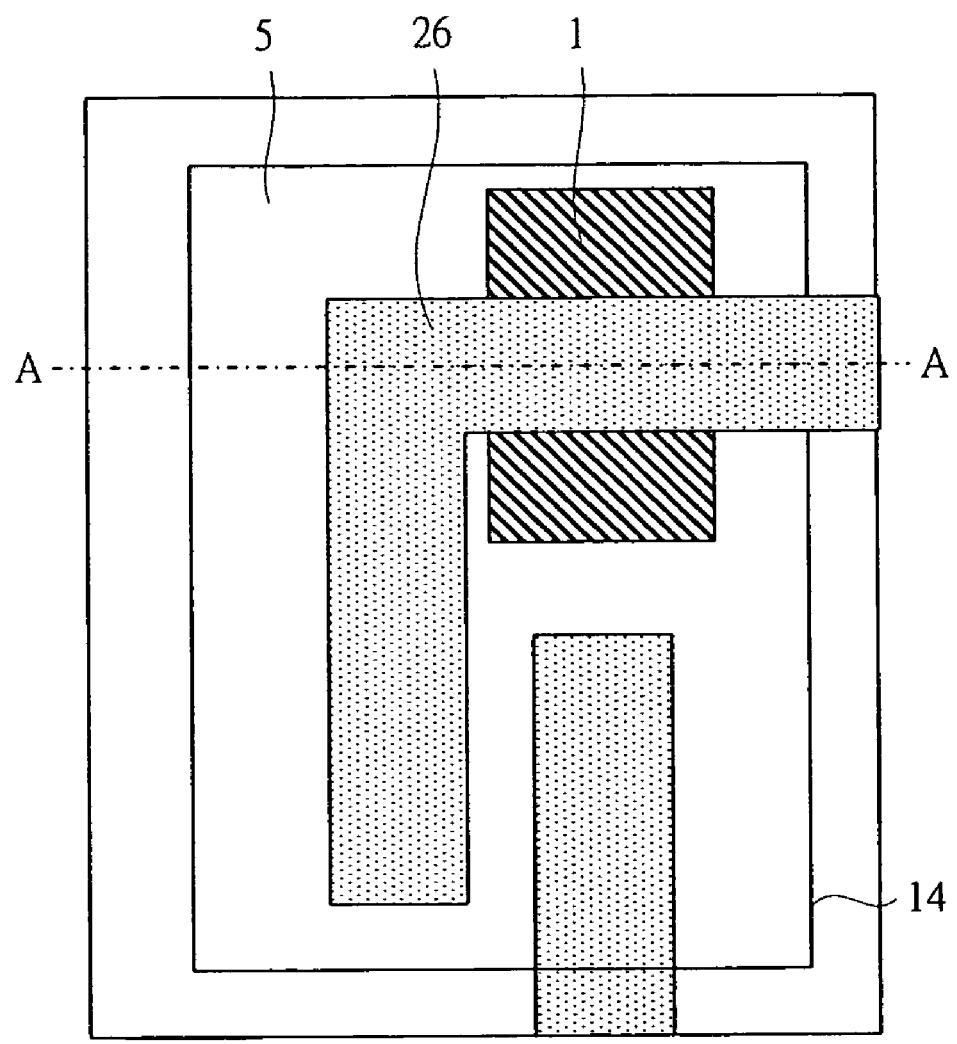
FIG. 44 is a schematic plan view of the memory cell during a manufacturing process in a region corresponding to FIG. 42.
Figure 45:
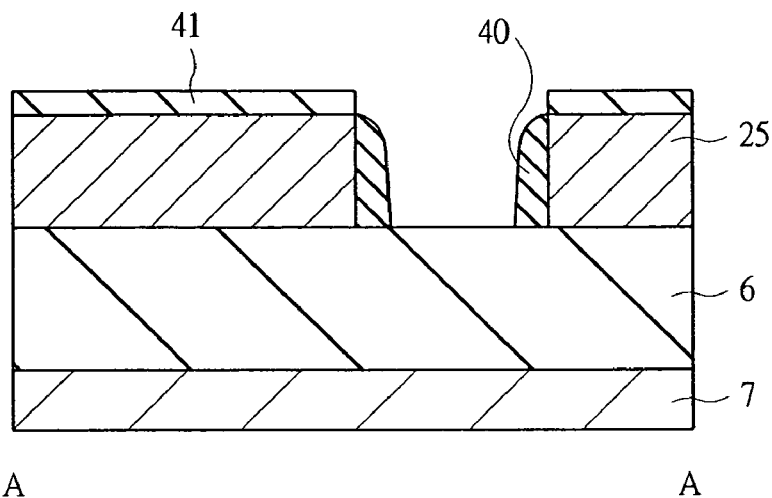
FIG. 45 is a schematic cross-section view of the memory cell during the manufacturing process in a portion corresponding to the portion along an A-A line in FIG. 42.
Figure 46:
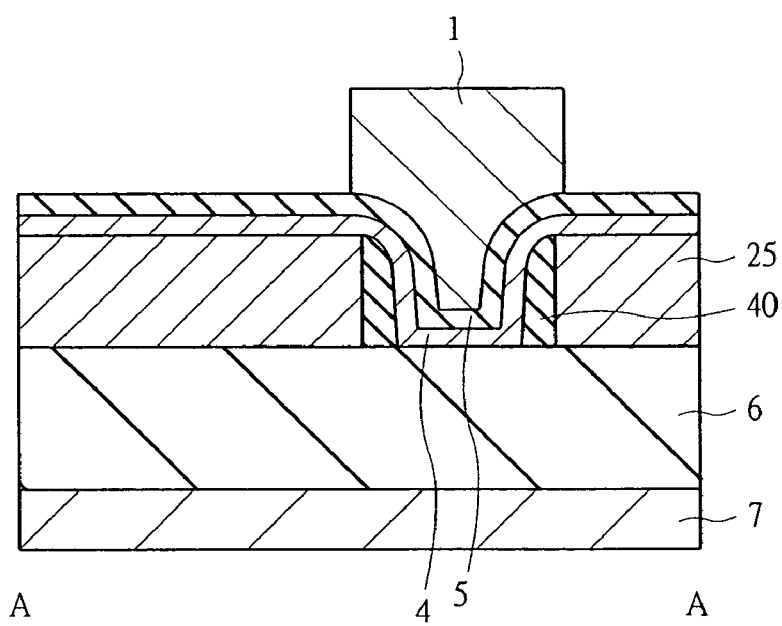
FIG. 46 is a schematic cross-section view of the memory cell during the manufacturing process continued from FIG. 45.

A semiconductor device according to a fifth embodiment is described with reference to FIGS. 42 to 46, focusing on differences from the first embodiment. FIG. 42 is a schematic plan view of a memory cell according to the fifth embodiment, depicting a write transistor Qw, a read transistor Qr, and a select transistor Qs. FIG. 43 is a cross-section view along an A-A line in FIG. 42. FIG. 44 is a schematic plan view of the memory cell during a manufacturing process in a region corresponding to FIG. 42. FIGS. 45 and 46 are schematic cross-section views of the memory cell during the manufacturing process in a portion corresponding to the portion along the A-A line in FIG. 42. Here, in FIGS. 42 and 43, for ease of description of an element structure, components, such as contacts and wirings, are omitted. Also, in FIG. 42, for ease of viewing, an gate insulating film 5 and a channel 4 shown in FIG. 43 are omitted.

First, the structure of the write transistor Qw of a unit memory cell according to the fifth embodiment is described. As shown in FIG. 43, the write transistor Qw has a structure in which sidewalls 40 made of an insulator, such as a silicon oxide film, for example, are formed on the side surfaces of the source 2 and the drain 3 and a channel 4 is formed on these sidewalls 40. The channel 4 is connected to an upper surface of a conductive film 25 made of, for example, polycrystalline silicon, serving as the source 2 and the drain 3. Therefore, the sidewall portion of the gate 1 also serves as a channel, thereby advantageously reducing the capacitance between the gate 1 and the source 2. Also, since the sidewall portion of the gate 1 also serves as a channel, compared with the structure in which simply the lower portion of the gate serves as a channel (refer to FIG. 71), the channel length is long, and also there is an advantage in which a short channel effect is difficult to occur even with the advancement of microfabrication.

As such, in the fifth embodiment, the write transistor Qw includes the source 2 and the drain 3 formed on an insulating layer 6, the channel 4 that is formed on an upper portion of the insulating layer 6, electrically connects the source 2 and the drain 3, and is made of a semiconductor, and the gate 1 that is formed on an upper portion of the insulating layer 6, is electrically insulated from the channel 4 by a gate insulating film 5, and controls a potential of the channel 4. Furthermore, sidewalls 40 made of insulators are formed between the source 2 and the drain 3 and on side surfaces of the source 2 and the drain 3. The channel 4 is formed along an upper surface of the source 2, the sidewall 40 of the source 2, the insulating layer 6, the sidewall 40 of the drain 3, and an upper surface of the drain 3.

With such a structure of the write transistor Qw, the memory according to the fifth embodiment can perform a stable reading operation with a less influence of the parasitic capacitance Cp (refer to FIGS. 70A and 70B).

Next, differences from the manufacturing process shown in the first embodiment are described. From formation of the insulating layer 6 to formation of the gate insulating film 5 and deposition of a conductive film 25 made of, for example, polycrystalline silicon, are similar to those in the manufacturing method according to the first embodiment. Then, on the conductive film 25, an insulating film 41 made of, for example, silicon nitride, is deposited.

Then, as shown in FIG. 45, etching is performed with a hole pattern of a resist as a mask to remove the conductive film 25 in the channel and gate regions, and then an insulating film made of, for example, silicon oxide, is deposited. Then, an etch-back technique is performed, thereby forming the sidewalls 40 on the side surface of the conductive film 25.

Then, as shown in FIG. 46, the insulating film 41 is removed. Then, deposited are the channel 4 made of amorphous silicon having a thickness on the order of, for example, 2.5 nm, and the gate insulating film 5 formed of a silicon oxide film having a thickness on the order of, for example, 15 nm. Here, annealing is performed, thereby crystallizing amorphous silicon into polycrystalline silicon. Next, after depositing polycrystalline silicon serving as the gate 1, etching is performed with a resist as a mask to remove portions of polycrystalline silicon other than the write transistor portion, thereby forming the gate 1.

Then, by applying a resist pattern 26 as shown in FIG. 44, unwanted portions of the gate insulating film 5 and the channel 4 are removed to form the source 2 and the drain 3 of the write transistor Qw (refer to FIG. 43). At this time, what is different from the first embodiment is that the gate 1 and the gate insulating film 5 of the write resistor Qw portion and also the semiconductor film serving as the channel 4 are processed with the same resist pattern as a mask. Also, the conductive film 25 made of the polycrystalline silicon can be etched with a resist as a mask to form a gate pattern of each of a logic transistor and a high-voltage transistor. Thereafter, the manufacturing process is similar to that of the first embodiment.

Sixth Embodiment

Figure 47:
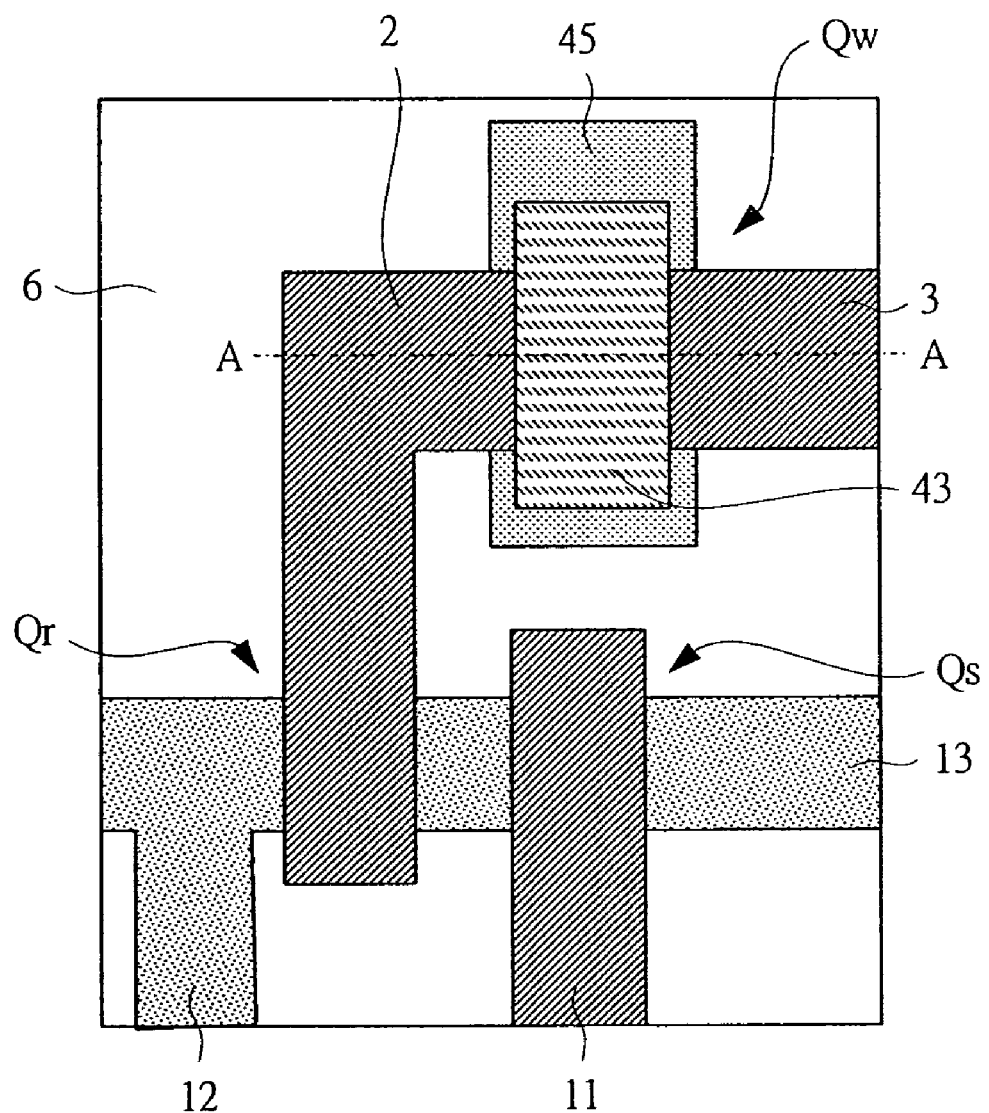
FIG. 47 is a schematic plan view of a memory cell according to a sixth embodiment of the present invention.
Figure 48:
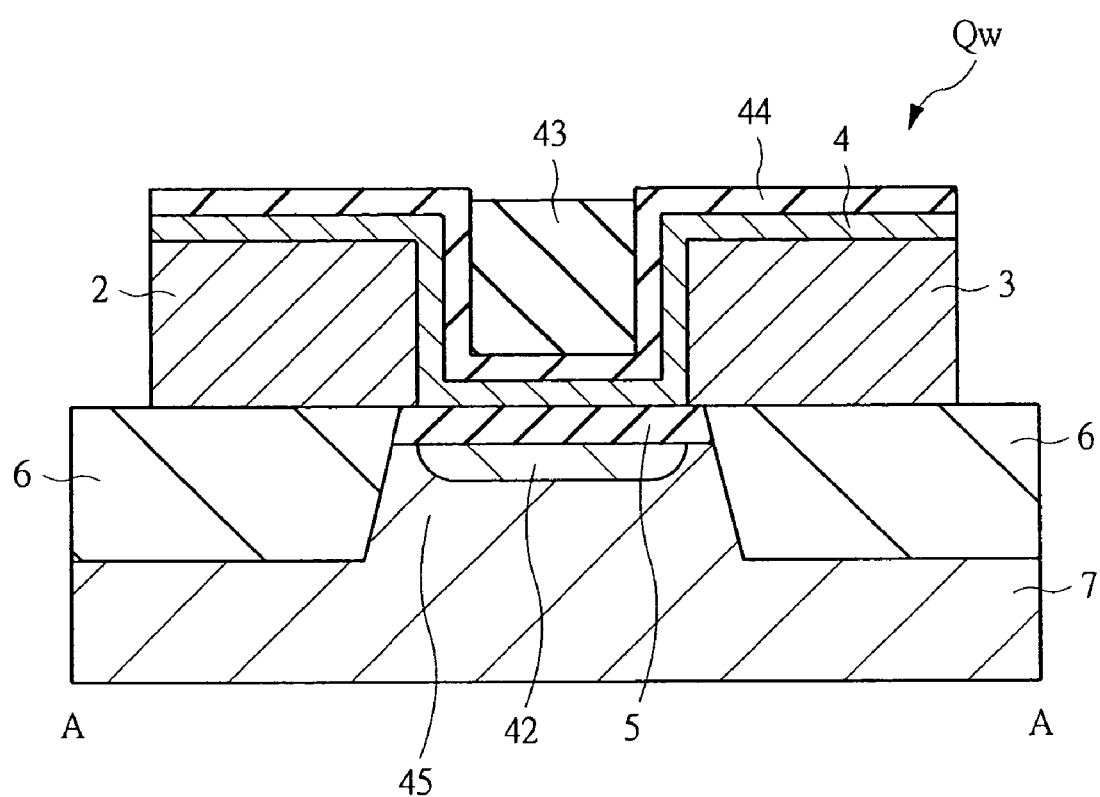
FIG. 48 is a cross-section view along an A-A line in FIG. 47.
Figure 49:
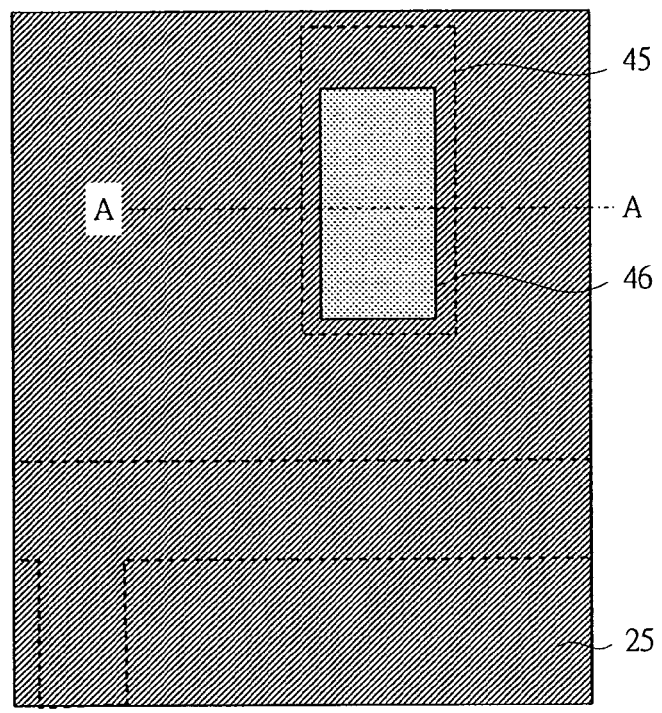
FIG. 49 is a schematic plan view of the memory cell during a manufacturing process in a region corresponding to FIG. 47.
Figure 50:
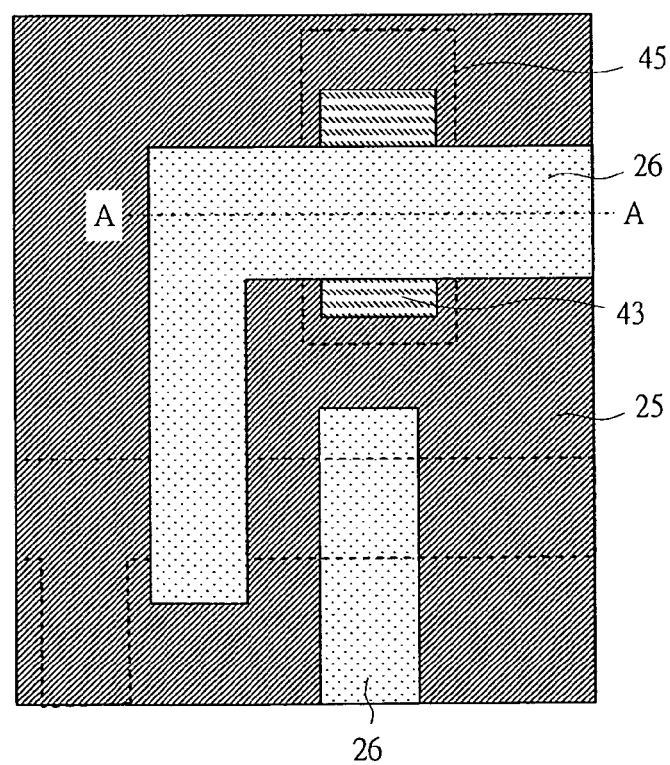
FIG. 50 is a schematic plan view of the memory cell during the manufacturing process continued from FIG. 49.
Figure 51:
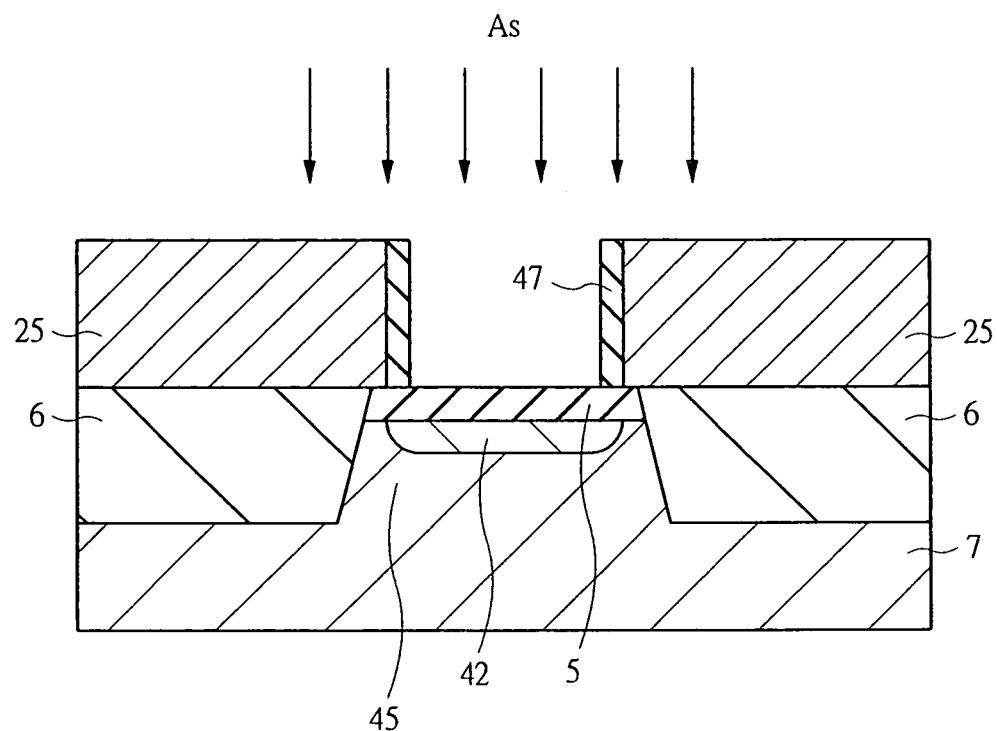
FIG. 51 is a schematic cross-section view of the memory cell during the manufacturing process in a portion corresponding to the portion along the A-A line in FIG. 47.
Figure 52:
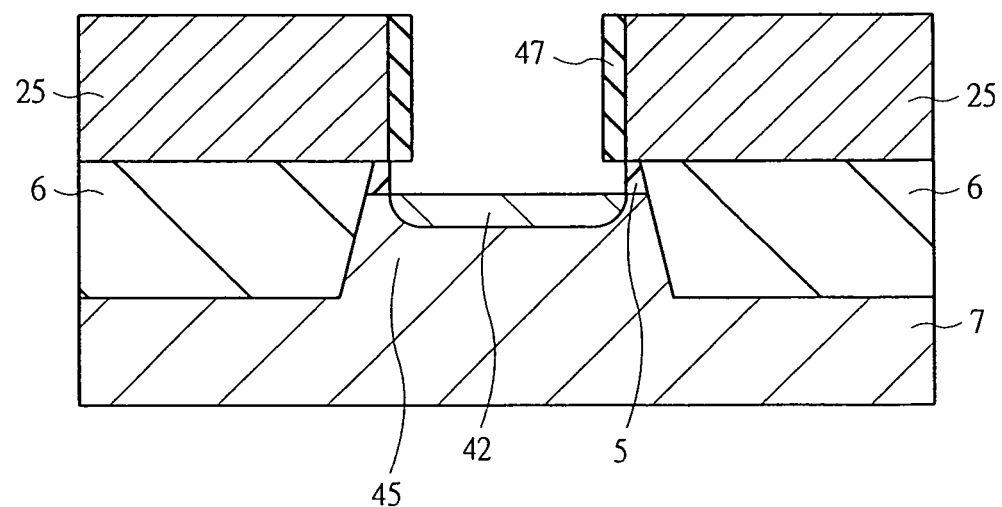
FIG. 52 is a schematic cross-section view of the memory cell during the manufacturing process continued from FIG. 51.
Figure 53:
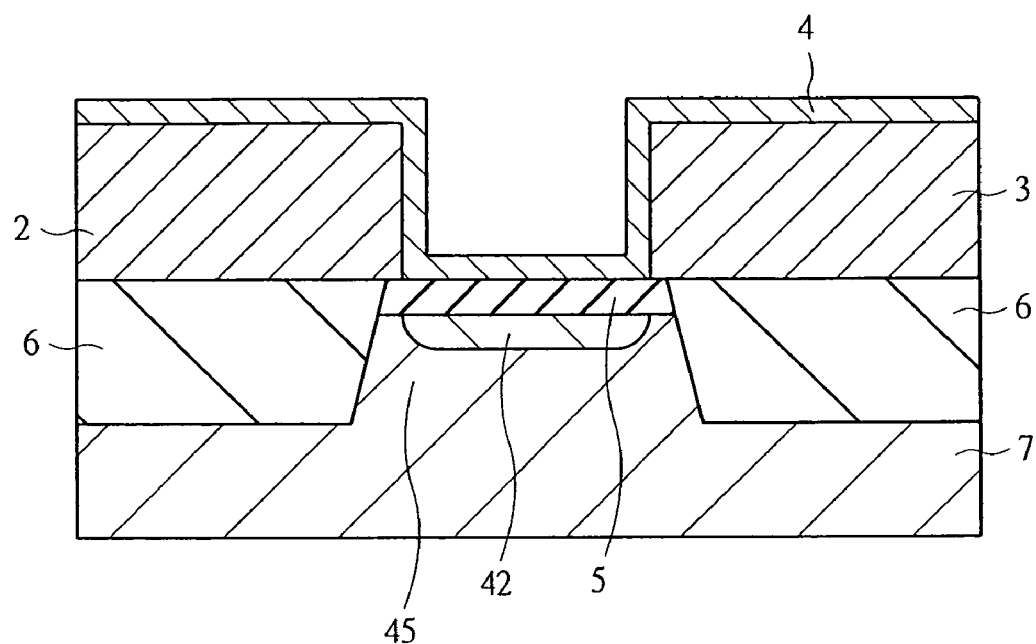
FIG. 53 is a schematic cross-section view of the memory cell during the manufacturing process continued from FIG. 52.

A semiconductor device according to a sixth embodiment is described with reference to FIGS. 47 to 53, focusing on differences from the first embodiment. FIG. 47 is a schematic plan view of a memory cell according to the sixth embodiment, depicting a write transistor Qw, a read transistor Qr, and a select transistor Qs. FIG. 48 is a cross-section view along an A-A line in FIG. 47. FIGS. 49 and 50 are schematic plan views of the memory cell during a manufacturing process in a region corresponding to FIG. 47. FIGS. 51 to 53 are schematic cross-section views of the memory cell during the manufacturing process in a portion corresponding to the portion along the A-A line in FIG. 47. Here, in FIGS. 47 and 48, for ease of description of an element structure, components, such as contacts and wirings, are omitted. Also, in FIG. 47, for ease of viewing, an gate insulating film 5 and a channel 4 shown in FIG. 48 are omitted.

First, the structure of the write transistor Qw of a unit memory cell according to the sixth embodiment is described. Unlike the structure according to the first embodiment, as shown in FIG. 48, the present embodiment has a feature in which an active region 45 is present under the channel 4 and a gate 1 is formed of a gate 42 made of a diffusion layer of high-concentration n-type impurities provided on the surface of the substrate 7. In this structure, the gate 42 is formed under the channel 4, thereby eliminating the parasitic capacitance Cp (refer to FIGS. 70A and 70B) occurring due to the facing portion 9 in the structure of FIG. 71 studied by the inventors. Furthermore, impurities can be implanted into the source 2 and the drain 3 for forming the gate 42 through self alignment. Therefore, the facing area between the lower surfaces of the source 2 and the drain 3 and the gate 42, thereby making the parasitic capacitance Cp extremely small.

As such, in the sixth embodiment, the write transistor Qw includes the source 2 and the drain 3 formed on a gate insulating film 5, the gate 42 that is formed under the gate insulating film 5 and controls the potential of the channel 4, and the channel 4 that is formed on an upper portion of the gate 42, electrically connects the source 2 and the drain 3, and is made of a semiconductor. Also, the gate 42 is made of the semiconductor (diffusion layer) with impurities introduced to the source 2 and the drain 3 through self alignment. Also, a protective film 43 is formed on the channel 4 for protecting the channel 4.

With such a structure of the write transistor Qw, the memory according to the sixth embodiment can perform a stable reading operation with a less influence of the parasitic capacitance Cp.

Next, differences from the manufacturing process shown in the first embodiment are described. The processes are similar to those of the first embodiment until the formation of the insulating layer 6. However, in the sixth embodiment, the active region 45 is formed in advance on the substrate 7 under an area in which the write transistor Qw is formed.

Then, a gate insulating film 5 made of, for example, silicon oxide, and then a conductive film 25 made of polycrystalline silicon are sequentially formed in this order.

Then, as shown in FIG. 49, the conductive film 25 is etched with a resist as a mask to manufacture a structure on a hole pattern 46 in which the conductive film 25 is removed. At this time, to control the potential of the entire channel 4 (refer to FIG. 48) that will be later formed, the active region 45 has a shape so as to surround the hole pattern 46.

Then, as shown in FIG. 51, a protective film 47 made of, for example, silicon nitride, is deposited, and then an etch-back technique is performed, thereby causing the protective film 47 to be left only on the side surface of the hole pattern 46. Next, As (arsenic) is implanted with a resist as a mask to form the gate 42 on the hole pattern through self alignment, the gate 42 being made of a diffusion layer and being a high-concentration n-type region.

Then, as shown in FIG. 52, since the gate insulating film 5 at the bottom of the hole suffers damages from this implantation, this gate insulating film 5 at the bottom of the hole is once removed by HF (hydrofluoric acid).

Then, as shown in FIG. 53, oxidization is performed again to form the gate insulating film 5 at the bottom of the hole. Here, the side surface of the hole is protected by the protective film 47 and therefore is not oxidized. At this point in time, since the portion immediately under the hole pattern is once shaved and then oxidized, a silicon oxide film is formed with the substrate 7 being slightly eroded. However, in the drawing, the height is the same for simplification. Furthermore, by performing a thermal phosphoric acid treatment, the protective film 47 made of, for example, silicon nitride, is removed. Then, a semiconductor film (channel 4) made of amorphous silicon is deposited on the order of, for example, 2.5 nm.

Then, as shown in FIG. 48, after an insulating film 44 made of silicon oxide is formed through oxidization on the surface of the channel 4, a protective film 43 made of, for example, silicon nitride, is deposited and etched back so as to fill the hole. Next, by applying a resist pattern 26 as shown in FIG. 50, unwanted portions of the insulating film 44, the channel 4, and the conductive film 25 are removed to form the source 2 and the drain 3 of the write transistor Qw. At this time, the conductive film 25 made of the polycrystalline silicon can be etched with a resist as a mask to form a gate pattern of each of a logic transistor and a high-voltage transistor. Thereafter, the manufacturing process is similar to that of the first embodiment.

Figure 54:
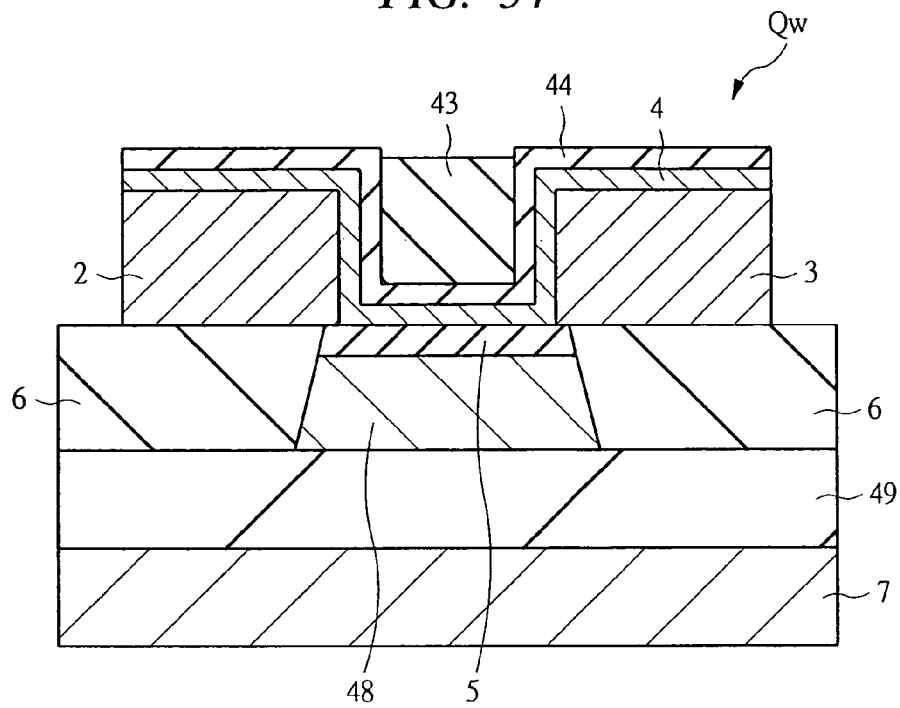
FIG. 54 is a schematic cross-section view of a write transistor in a modification example according to the sixth embodiment.

FIG. 54 is a schematic cross-section view of a write transistor Qw in a modification example according to the sixth embodiment. A difference from the structure of FIG. 48 is that a substrate having a so-called SOI (Silicon on Insulator) structure is applied, in which an insulating film 49 made of, for example, silicon oxide, is embedded in the substrate 7. A gate 48 is formed on the insulating layer 49 having an SOI structure. Also, a gate 48 provided under the channel 4 is formed of not an n-type region provided through self alignment in the p-type region of the MIS transistor, for example, but of a high-concentration n-type active region. Since the structure includes a substrate having an SOI structure, the active region is isolated from the surroundings, and the potential can be freely changed as the gate 1. Furthermore, since the capacitance with respect to the surroundings is small, the gate 48 can be charged and discharged within a short time.

Seventh Embodiment

Figure 55:
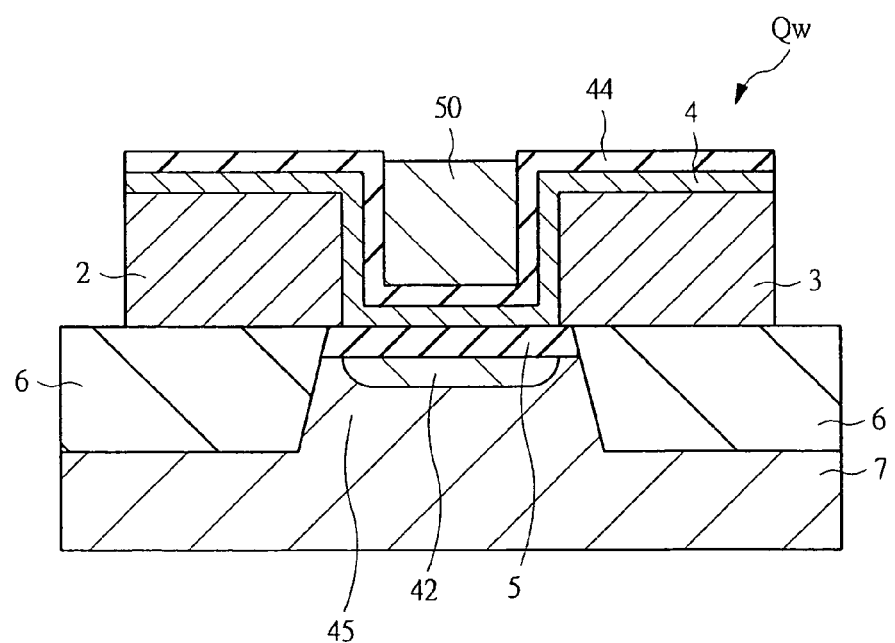
FIG. 55 is a schematic cross-section view of main parts of a memory cell according to a seventh embodiment of the present invention.

A semiconductor device according to a seventh embodiment is described with reference to FIG. 55, focusing on differences from the sixth embodiment. FIG. 55 is a schematic cross-section view of main parts of a memory cell according to the seventh embodiment. The present embodiment is similar to the sixth embodiment shown in FIG. 48, but is different therefrom in that the protective film 43 for channel protection made of, for example, silicon nitride, is replaced by a gate 50, which is a conductive film made of, for example, high-concentration n-type polycrystalline silicon.

The structure of the write transistor Qw of the memory cell according to the seventh embodiment has a first gate 42 formed of a diffusion layer and a second gate 50 formed of a conductive film made of, for example, metal. As shown in FIG. 55, a source 2 and a drain 3 are formed on a gate insulating film 5 formed on a substrate 7. Under the gate insulating film 5, the gate 42 formed of a diffusion layer for controlling the potential of a channel 4 is formed. On an upper portion of the gate 42, the channel 4 is formed, which electrically connects the source 2 and the drain 3, is electrically isolated from the gate 42 by the gate insulating film 5, and is made of a semiconductor. Furthermore, the gate 50 formed of a conductive film is formed so as to have the channel 4 interposed between the gate 50 and the gate 42. Here, the gate 42 is formed of a semiconductor with impurities introduced in the source 2 and the drain 3 through self alignment, and a threshold voltage is set by controlling the impurity concentration of the gate 42.

If these gates 42 and 50 are controlled at the same potential, an improvement in ON/OFF current ratio of the write transistor Qw can be expected. When an ON-state current is improved, writing can be performed to write a potential up to near that of the write bit line even with impression of a write pulse having the same length, thereby allowing a stable reading operation.

Also, in the seventh embodiment, if a circuit that drives the gate 42 formed of a diffusion layer and the gate 50 formed of a conductive film at the same voltage is formed in the peripheral circuit area, an improvement in ON/OFF current ratio of the write transistor Qw can be expected. Here, in the peripheral circuit area, a circuit that drives these gates at different voltages at different timings can be formed.

In the seventh embodiment, the case has been described in which both of the diffusion layer of the gate 42 and the conductive film of the gate 50 are provided as gates. Alternatively, only the conductive film (gate 50) may be used as a gate, and the impurity concentration of the diffusion layer (gate 42) may be adjusted for threshold control.

Furthermore, in the seventh embodiment, the case has been described in which both of the diffusion layer (gate 42) and the conductive film (gate 50) are provided as gates. Alternatively, the conductive layer (gate 50) may be used as a gate, whilst the potential of the diffusion layer (gate 42) may be used as that of a substrate bias electrode. By changing the potential of this diffusion layer (gate 42) based on an operation mode, the threshold may be changed. For example, in a writing operation, a potential higher than that in a holding state is provided, thereby ensuring more ON-state current.

Still further, the role of the diffusion layer (gate 42) and the role of the conductive film (gate 50) may be switched. Still further, as shown in FIG. 54 according to the sixth embodiment, an SOI structure may be applied to the substrate 7. That is, the protective film 43 for protecting channel in the sixth embodiment can be replaced by the conductive film 50 made of, for example, n-type polycrystalline silicon with high concentration.

Eighth Embodiment

A semiconductor device according to an eighth embodiment is described with reference to FIGS. 56 to 61, focusing on differences from the first embodiment.

Figure 56:
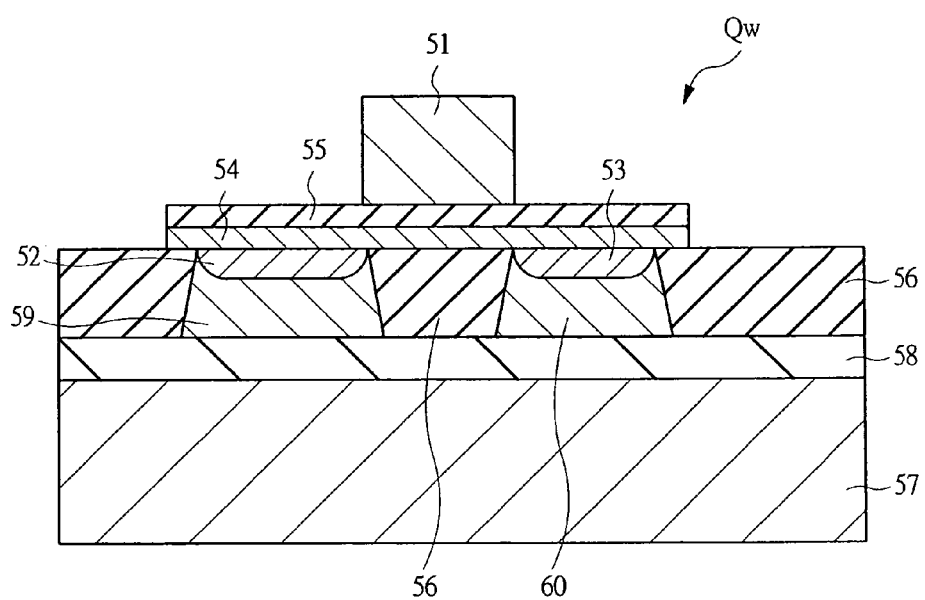
FIG. 56 is a schematic cross-section view of main parts of a memory cell according to an eighth embodiment of the present invention.

FIG. 56 is a schematic cross-section view of a write transistor of a memory cell according to the eighth embodiment. As shown in FIG. 56, a source 52 and a drain 53 of the write transistor are formed from a substrate 57 made of, for example, a p-type single-crystal silicon. Here, at least one of the source 52 and the drain 53 of the write transistor may be formed from the substrate 57.

A semiconductor film serving as a channel 54 is directly connected to the substrate 57, not via a contact or metal wiring. Also, the channel 54 formed of a semiconductor film is also formed on an insulating film 56 for isolation. Furthermore, a gate 51 is formed on the channel 54 by the intermediary of a gate insulating film 55 to control the channel potential. As the substrate 57, a substrate having a so-called SOI structure with an embedded insulating film 58 is used.

A well 59 of the source 52 is of n type, and is electrically connected to the source 52. Also, the drain 53 is formed in an n-well 60 and is electrically connected to the well 60.

By using the substrate 57 having an SOI structure, the well 59 in which the source 52 is present can be insulated from the surroundings. With this, even if there is a leakage between the source 52 and the well 59 connected to a charge-storage node, excellent data holding characteristics can be achieved. In the eighth embodiment, the well 59 is of n type, which is the same as the source 52. Therefore, the source 52 and the well 59 are electrically connected to each other. However, with the use of the substrate having an SOI structure, sufficient holding characteristics can be ensured. Also, with the use of the substrate having an SOI structure, the capacitance of the write bit line can be reduced, thereby reducing a pre-charge time at the time of a writing operation. Alternatively, a silicon substrate may be used, and the source 52 and the drain 53 may be formed in a p-well. In this case, a lower-concentration n-type region is provided around the high-concentration n-type source on the surface of the substrate to mitigate pn junction with the p-well, thereby suppressing a leakage current.

In the eighth embodiment, the substrate 57 is made of single-crystal silicon, and the channel 54 is made of single-crystal silicon or silicon having crystallinity similar to that of single-crystal silicon. Therefore, high mobility can be achieved, thereby increasing a write current. Also, when a writing operation is performed at the same voltage under the same time conditions, writing is possible in a storage node up to a high voltage level, compared with the case of a smaller write current. Thus, stable reading is possible even if the same parasitic capacitance between the gate 51 and the source 52 is present. In other words, with the same voltage and the same time for writing in the charge-storage node, writing is possible at a lower gate voltage. Also, a decrease in gate voltage at the end of writing is small. Therefore, there is another feature in that an influence of the parasitic capacitance Cp (refer to FIGS. 70A and 70B) is small.

In the eighth embodiment, unlike the first embodiment in which the source 2 and the drain 3 are formed of a film deposited simultaneously with the gate of the logic transistor, the substrate surface is used as the source 52 and the drain 53. Therefore, the side surface of the gate 51 and the side surfaces of the source 52 and the drain 53 do not face each other, thereby decreasing the parasitic capacitance Cp. With such a structure of the write transistor Qw, in the memory according to the eighth embodiment, a stable reading operation can be achieved with a less influence of the parasitic capacitance Cp.

As such, in the eighth embodiment, the write transistor Qw includes the source 52 and the drain 53 formed on the insulating layer 58, the channel 54 that is formed on the source 52 and the drain 53, electrically connects the source 52 and the drain 53, and is made of a semiconductor, and the gate 51 that is formed on an upper portion of the source 52 and the drain 53, is electrically insulated from the channel 54 by the gate insulating film 55, and controls a potential of the channel 54. The channel 54 is formed on an entire surface of a lower portion of this gate 51. Also, the substrate 57 is made of single-crystal silicon, whilst the channel 54 is made of single-crystal silicon or silicon having crystallinity similar to that of the single-crystal silicon. Furthermore, the source 52 and the drain 53 are formed on the surface of the well 59 and the well 60 each formed on the insulating film 58. Still further, the channel 54 is directly connected to the source 52 or the drain 53 not via a metal wiring. Still further, at least either one of the source 52 and the drain 53 may be made of single-crystal silicon.

Figure 57:
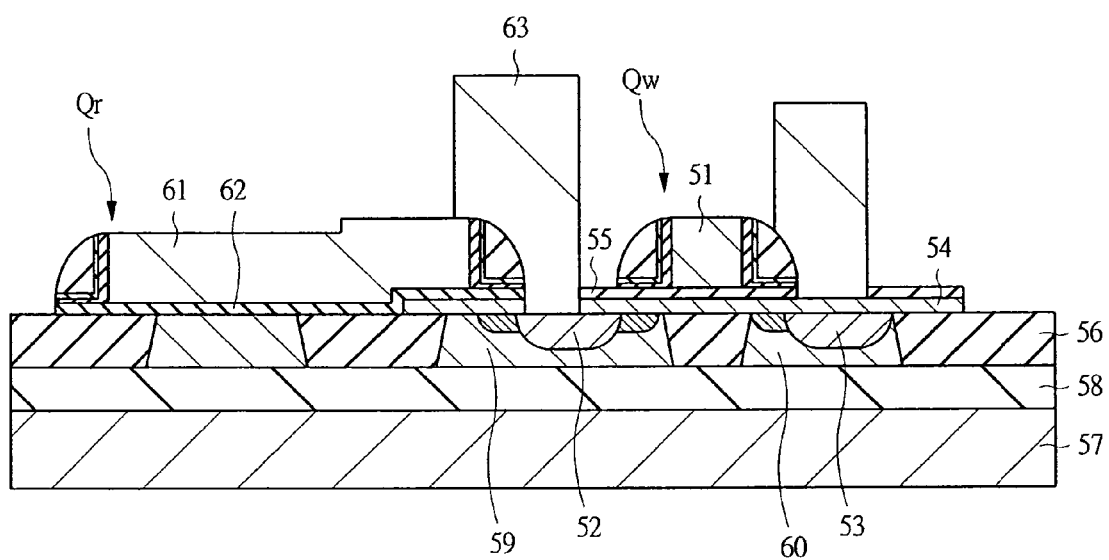
FIG. 57 is a cross-section view near a read transistor of the memory cell according to the eighth embodiment.

FIG. 57 is a schematic cross-section view near the read transistor Qr of the memory cell according to the eighth embodiment, describing a connection relationship between the write transistor Qw and the read transistor Qr. Here, a side-wall structure omitted in FIG. 56 is also shown.

The source of the write transistor Qw is connected to a gate 61 of the read transistor by using a contact 63. With connection only by using the contact 63, the memory cell can be formed in a smaller area compared with the case of connection via a metal wiring layer. Unlike the write transistor Qw, the gate insulating film 62 of the read transistor Qr has a thickness on the order of 7 nm, which is equal to that of the high-voltage transistor. This film thickness may be thinner, as described in the first embodiment.

Next, a method of manufacturing the write transistor Qw according to the eighth embodiment is described. Here, other than the use of the substrate having a SOI structure, the processes similar to those in the first embodiment can be used up to, for example, oxidization of the gate of the logic transistor. Then, the substrate 57 is oxidized on the order of 4 nm.

Then, etching is performed with a resist as a mask to remove a portion of the gate insulating film 55 in which the write transistor Qw is to be formed, thereby exposing the surface of the substrate 57. Here, in the case of the substrate having an SOI structure, a triple-well structure is not required.

Then, the channel 54 formed of an amorphous silicon semiconductor film is deposited, for example, on the order of 4 nm, and annealing is performed. At this time, crystallization proceeds by taking the substrate 57 made of single-crystal silicon as a core, thereby obtaining crystallinity virtually similar to that of single-crystal.

Figure 58:
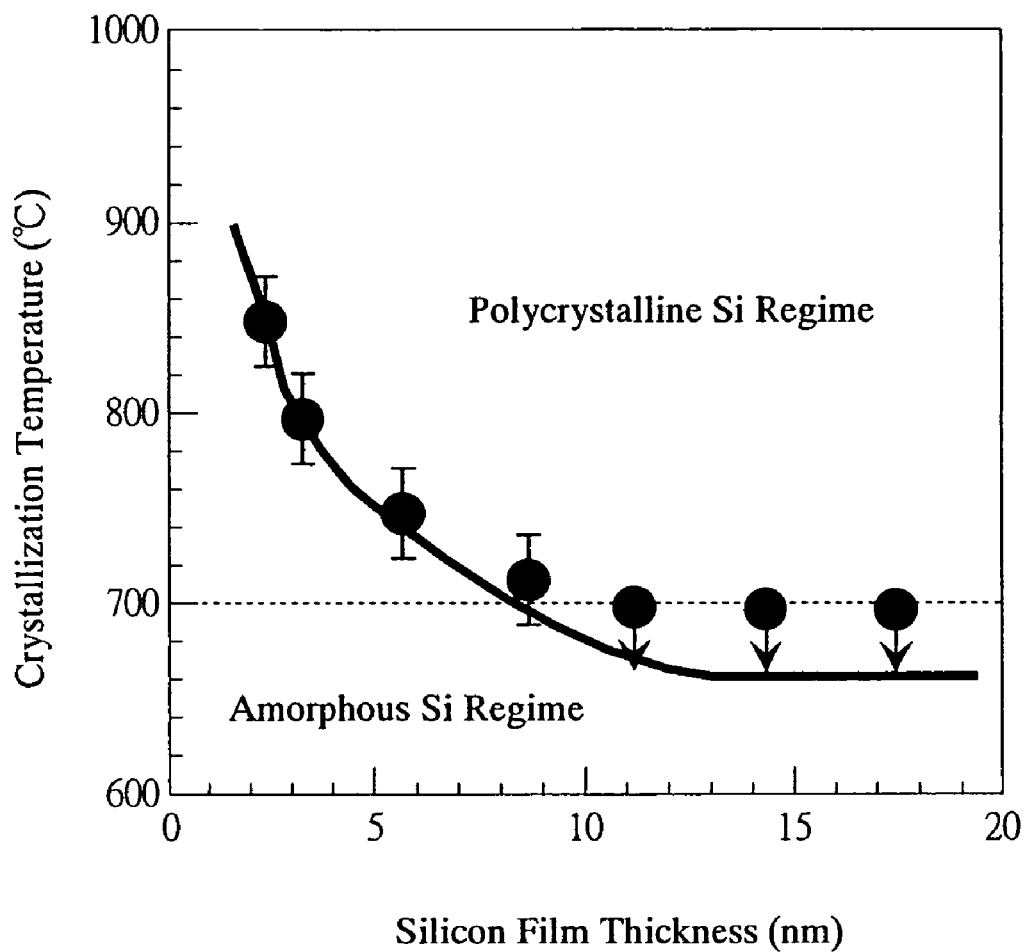
FIG. 58 is a drawing for describing a relation of a crystallization temperature to a silicon film thickness.

FIG. 58 is a drawing for describing a relation of a crystallization temperature to a silicon film thickness, depicting inventors' own study results indicating crystallization temperatures of amorphous films deposited with different film thicknesses and subjected to annealing for 30 minutes. As shown in FIG. 58, the temperature required for crystallization is increased for amorphous silicon having a film thickness on the order of 10 nm and, particularly, is abruptly increased for the one having a film thickness equal to or smaller than 5 nm. This is because generation of a crystal core does not proceed much with such a film thickness. Therefore, in crystallization of such a film, unlike crystallization of an amorphous film having a film thickness on the order of 10 nm or larger, crystallization is difficult to proceed from inside and a general crystallization mechanism is such that crystallization begins from portions in contact with single-crystal. As a result, crystallinity virtually similar to that of single-crystal can be obtained.

Therefore, even in amorphous silicon having a thick film thickness, crystallization proceeds similarly by taking single-crystal silicon as a core. At the same time, crystallization proceeds by taking a core generated inside the film as a core, resulting in polycrystal. To get around this problem, in the eighth embodiment, the thickness of the semiconductor film serving as the channel 54 is thin (on the order of 4 nm).

This crystallized thin-film surface is oxidized on the order of 2 nm (a silicon oxide film on the order of 4 nm is formed). As such, since the film with excellent crystallinity is oxidized, there is a feature in which oxidization can be well controlled and, in addition, interface traps between the semiconductor film and the insulating film are less than that in a case a silicon oxide film is formed through CVD.

Then, a silicon oxide film serving as the gate insulating film 55 is deposited on the order of, for example, 10 nm. Next, portions of the silicon oxide film other than the write transistor are removed with a resist as a mask. Next, when oxidization is lightly performed, the ultra-thin silicon film is oxidized with a portion for the write transistor Qw covered with the silicon oxide film being left. At this time, in the active region other than the portion for the write transistor Qw, a silicon oxide film on the order of 7 nm is formed, which is used as a gate insulating film for a high-voltage transistor.

Then, with a resist pattern having an opening at a portion for a logic transistor as a mask, a hydrofluoric acid treatment is performed, thereby removing the gate insulating film of the opening. Here, for the memory cell portion, a pattern without opening is used.

Then, after the resist is removed, the gate is oxidized for a thickness on the order of 2 nm. Next, a non-doped polycrystalline silicon film for gate having a thickness on the order of 150 nm is deposited. Thereafter, a normal transistor forming process can be used. Here, the present embodiment is different from the first embodiment in that the gate 51 of the write transistor Qw is also made of polycrystalline silicon, which is the same as for a gate of a logic transistor.

Figure 59:
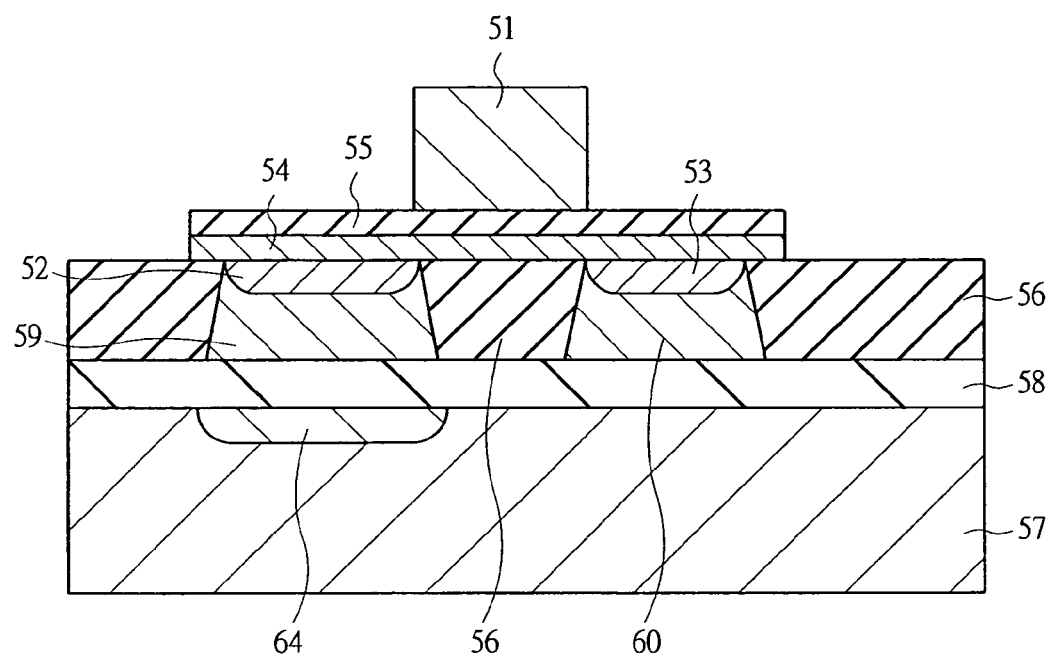
FIG. 59 is a schematic cross-section view of a write transistor in a modification example according to the eighth embodiment.

FIG. 59 is a schematic cross-section view of the write transistor Qw in a modification example according to the eighth embodiment. Differences from the structure of FIG. 56 are the embedded insulating film 58 of the substrate having an SOI structure is made thin on the order of 15 nm and a high-concentration n-type semiconductor layer 64 is formed under the n-well 59 where the source 52 is present.

This structure has an advantage in which the capacitance of the charge-storage node is large due to the capacitance under the lower surface of the n-well 59, thereby reducing an influence of the capacitance Cp (refer to FIGS. 70A and 70B) between the gate 51 and the source 52 of the write transistor Qw and improving reading characteristics.

It is also possible to increase the potential of the charge-storage node by providing a positive potential to the n-type semiconductor layer 64, thereby canceling an effect decreased due to operation of the gate of the write transistor Qw. For this operation, the polarity of impurities does not matter because all what is needed is to function as an electrode capable of applying a voltage to the charge-storage node. Here, when the write transistor Qw and the read transistor Qr are both of n-channel, it is effective to apply a positive voltage to the n-type semiconductor layer 64 as described above. However, when the write transistor Qw and the read transistor Qr are both of p-channel, it is effective to provide an electrode (for example, a high-concentration p-type region) under a p-well including a p-type region which is the source 52 of the write transistor Qw, and to apply a negative voltage thereto.

Furthermore, when the write transistor Qw is of n channel and the read transistor Qr is of p channel, in contrast to the problem described in the Related Art section, a resistance ratio is small in both of a 0 state and a 1 state being in a low resistance state. To solve this problem, it is effective to provide an electrode (in the eighth embodiment, the high-concentration n-type semiconductor layer 64) under the n-type well 59 including the n-type region which is the source 52 of the write transistor Qw, and to apply a positive voltage thereto. When the write transistor Qw is of p channel and the read transistor is of n channel, it is effective to provide an electrode (in the eighth embodiment, the high-concentration p-type semiconductor layer 64) under the p-type well 59 including the p-type region which is the source 52 of the write transistor Qw, and to apply a negative voltage thereto.

Figure 60:
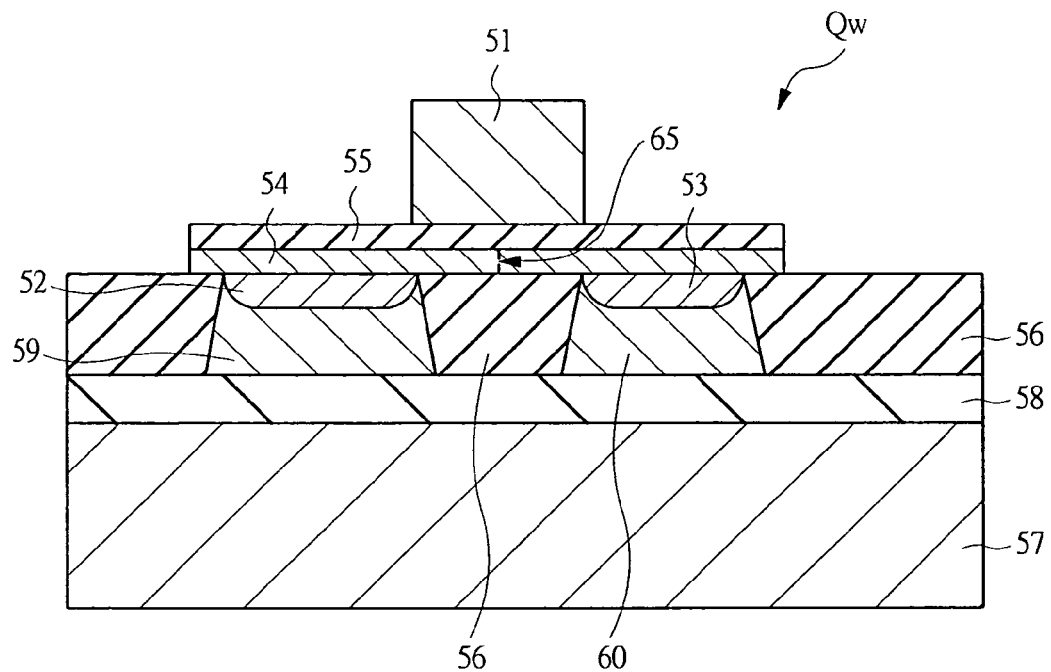
FIG. 60 is a schematic cross-section view of a write transistor in another modification example according to the eighth embodiment.

FIG. 60 is a schematic cross-section view of a write transistor Qw in another modification example according to the eighth embodiment. The structure of FIG. 60 is obtained by performing a manufacturing method similar to that for the structure of FIG. 56 except annealing conditions, and has a grain boundary 65 near the middle of the source 52 side and the drain 53 side of the channel 54. Basically, when single crystallization proceeds from the source 52 side and the drain 53 side of the channel 54, crystallization from both sides proceeds with the same single-crystal as a core and therefore, the crystal orientation is the same. However, the grain boundary is formed herein because a slight deviation may have occurred in crystal orientation as crystallization proceeds from both sides.

This middle grain boundary 65 occurs in each element. Unlike polycrystalline silicon, for example, grain boundaries do not randomly occur to cause variations in characteristics. Also, with a high-potential barrier being present at the middle of the channel, a small off-leakage can be achieved.

As such, in the channel 54 of the write transistor Qw, one crystal interface is present between the source 52 and the drain 53.

Figure 61:
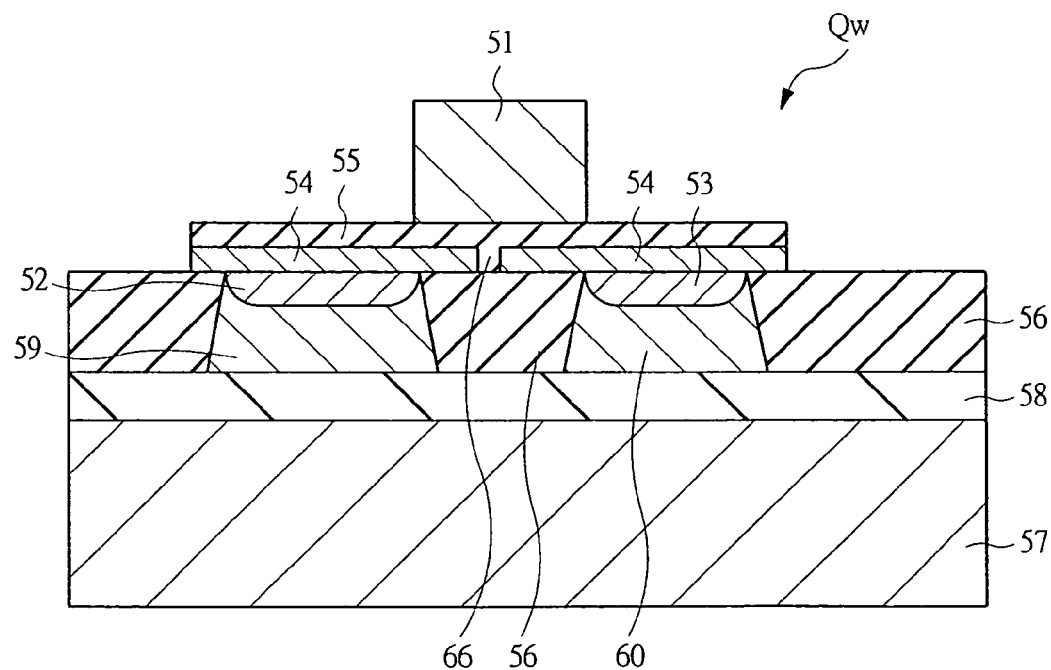
FIG. 61 is a schematic cross-section view of a write transistor in still another modification example according to the eighth embodiment.

FIG. 61 is a schematic cross-section view of a write transistor Qw in still another modification example according to the eighth embodiment. The structure of FIG. 60 is such that, after amorphous silicon of the channel 54 is crystallized through annealing, the gate insulating film 55 is formed through CVD. By contrast, the structure of FIG. 61 is such that, after amorphous silicon of the channel 54 is crystallized, oxidization is performed to form the gate insulating film 55, with an insulating film barrier 66 being present near the middle of the channel. As such, the channel 54 of the write transistor Qw has the insulating film barrier 66 forming a space between the source 52 and the drain 53.

This is because oxidization proceeds quickly at the portion of the grain boundary 65 in FIG. 60. As a result, the leakage current is smaller than that in the structure of FIG. 60, thereby achieving a semi-volatile memory characteristic. On the other hand, the structure of FIG. 56 without a grain boundary has a feature in which a larger ON-state current can be ensured, and therefore high-speed memory writing can be achieved.

Ninth Embodiment

A semiconductor device according to a ninth embodiment is described with reference to FIGS. 62 to 65, focusing on differences from the first embodiment.

Figure 62:
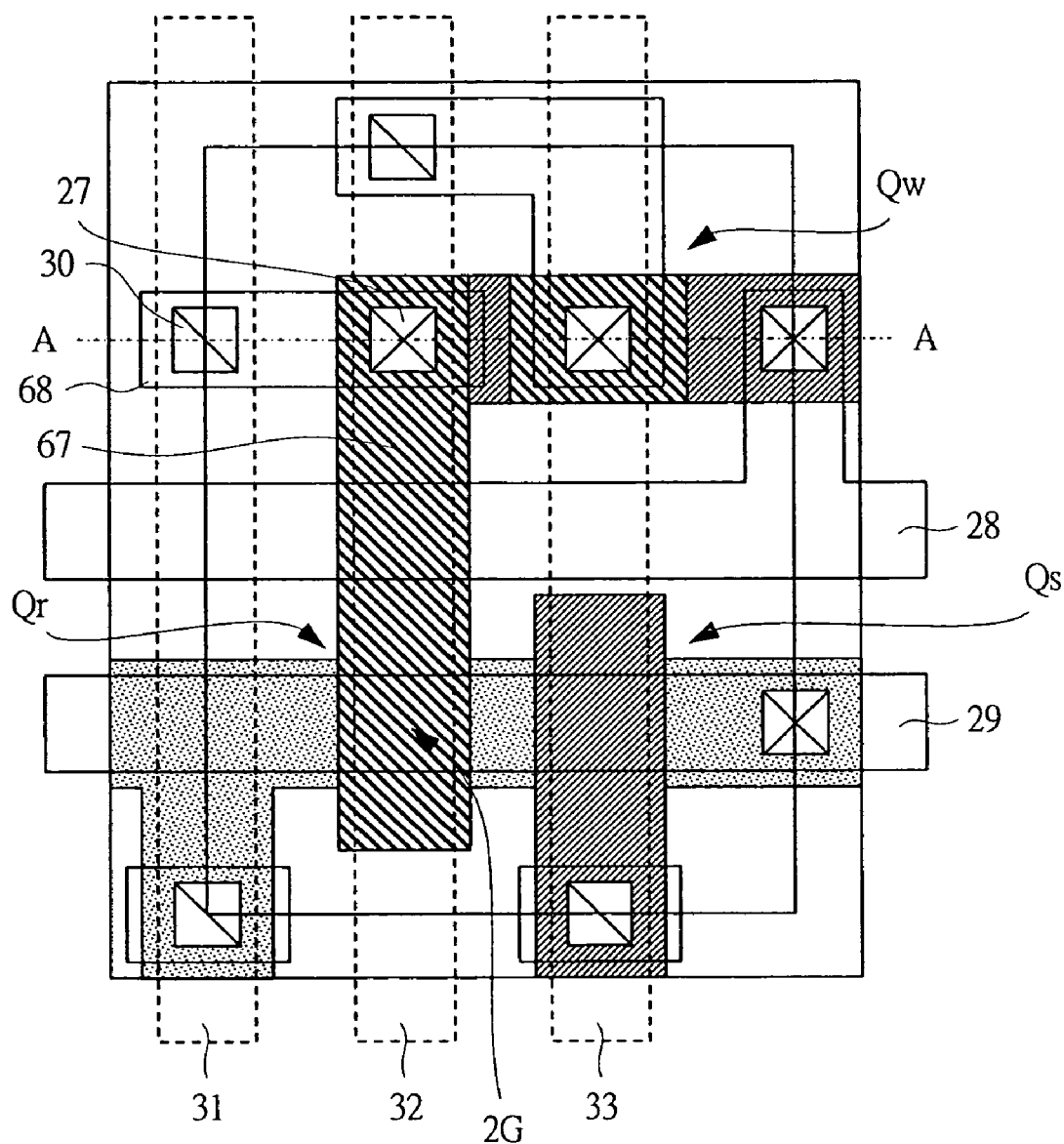
FIG. 62 is a schematic plan view of a memory cell according to a ninth embodiment of the present invention.
Figure 63:
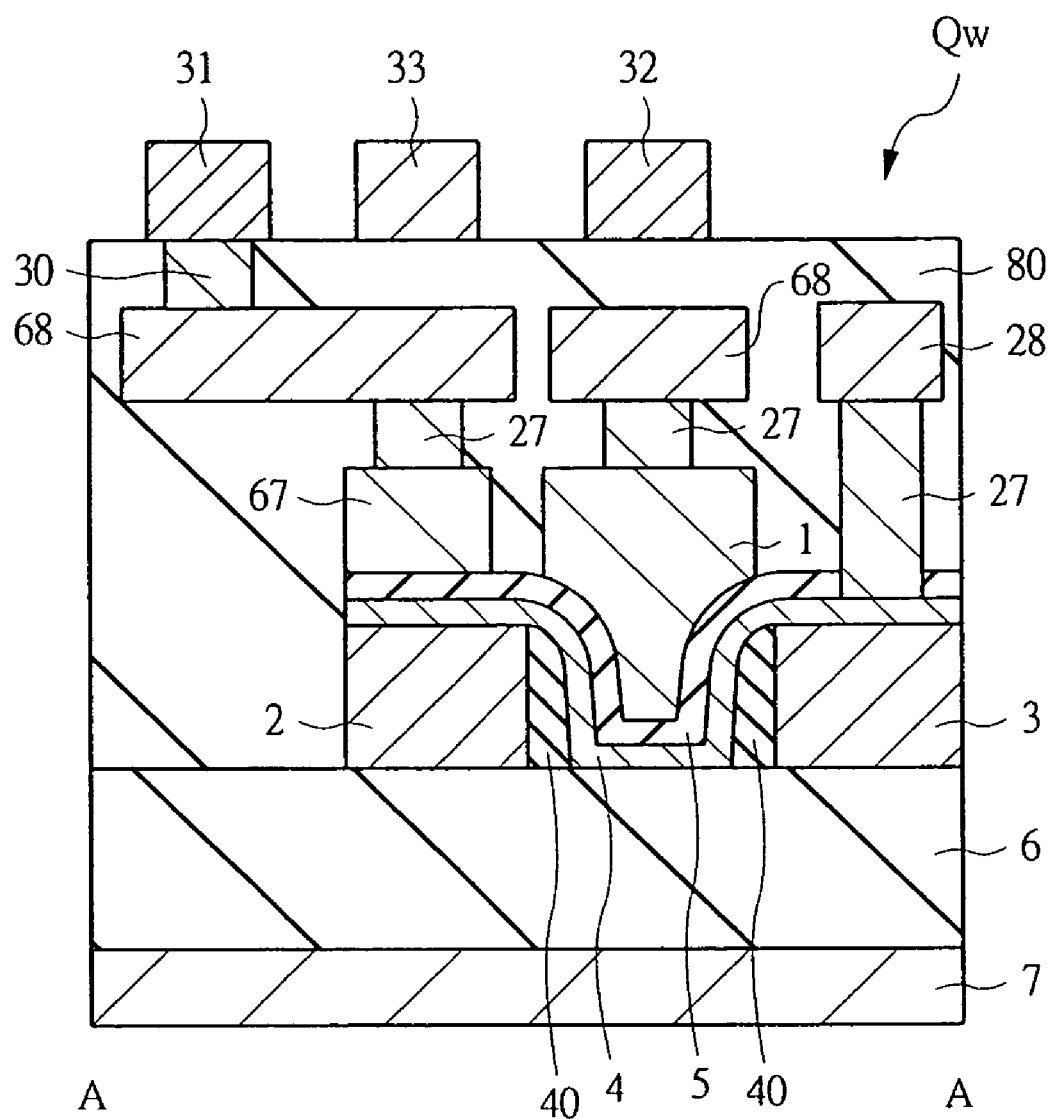
FIG. 63 is a cross-section view along an A-A line in FIG. 62.

FIG. 62 is a schematic plan view of a memory cell according to the ninth embodiment, depicting a write transistor Qw, a read transistor Qr, and a select transistor Qs. FIG. 63 is a cross-section view along an A-A line in FIG. 62.

The ninth embodiment is different from the first embodiment in that an electrode 67 made of polycrystalline silicon of the same layer as that of the gate 1 of the write transistor Qw is formed on the gate of the read transistor Qr serving as a charge-storage node. With this electrode 67 being connected to a source line via a contact 27, a first-layer wiring 68, and a via 30, the amount of stored charge Cs (refer to FIGS. 70A and 70B) of the charge-storage node can be increased. As such, with an increase in the charge-storage capacitance Cs, it is possible to relatively suppress the influence of the parasitic capacitance Cp (refer to FIGS. 70A and 70B), that is, a phenomenon in which the potential of the charge-storage node is significantly lowered due to capacitance coupling with the parasitic capacitance Cp as the potential of the gate of the write transistor Qw is lowered. With such a structure of the write transistor Qw, such a memory according to the ninth embodiment allows a stable reading operation with a less influence of the parasitic capacitance Cp. Also, there is an advantage of achieving a long retention time.

As such, in the ninth embodiment, the drain 3 of the write transistor Qw that inputs and outputs a stored charge is electrically connected to a write bit line 28, and the source 2 not electrically connected to the write bit line 28 is electrically connected to the gate of the read transistor Qr. Also, the electrode 67 is formed near a gate 2G of the read transistor Qr. Furthermore, the electrode 67 is electrically connected to a source line 31. Still further, the electrode 67 is formed in the same layer as the gate 1.

Also, in the ninth embodiment, a unit memory cell further has a select transistor Qs. The select transistor Qs is connected in series to the read transistor Qr. Also, the gate of the select transistor Qs is electrically connected to a word line for memory cell selection.

Figure 64:
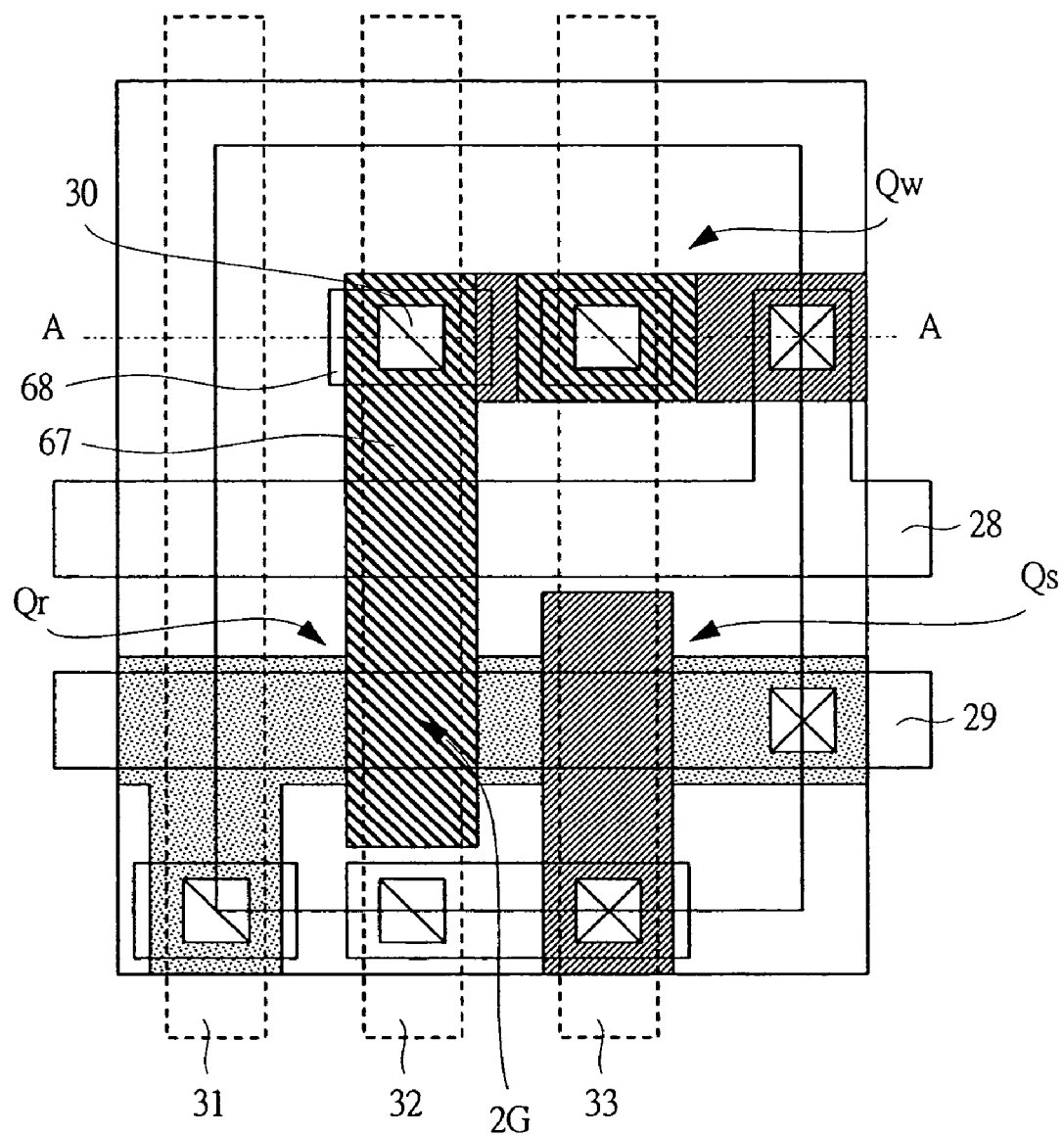
FIG. 64 is a schematic plan view of a memory cell in a modification example according to the ninth embodiment.
Figure 65:
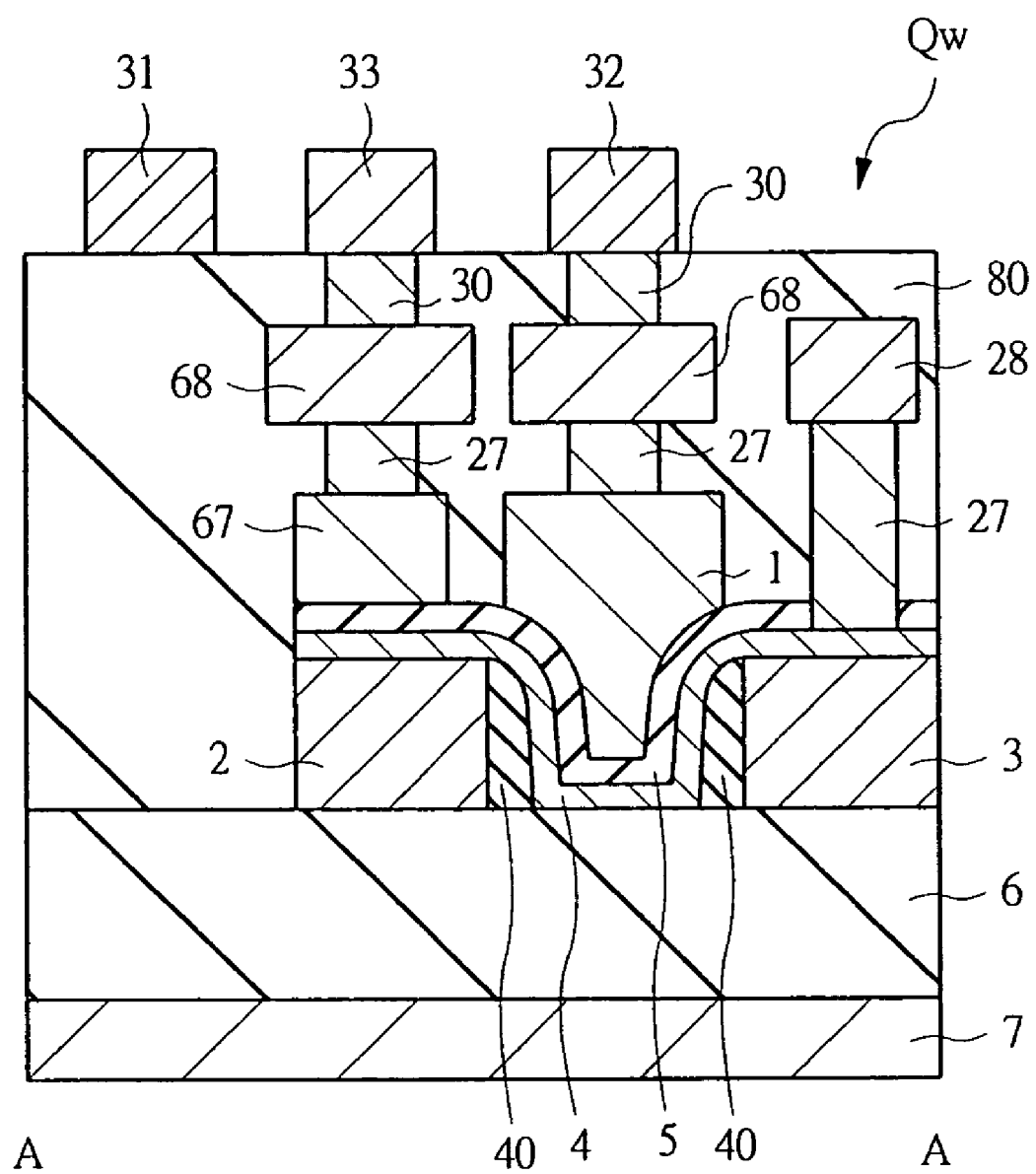
FIG. 65 is a cross-section view along an A-A line in FIG. 64.

FIG. 64 is a schematic plan view of a memory cell in a modification example according to the ninth embodiment, depicting a write transistor Qw, a read transistor Qr, and a select transistor Qs. FIG. 65 is a cross-section view along an A-A line in FIG. 64.

As shown in FIGS. 64 and 65, the electrode 67 formed on the gate 2G of the read transistor Qr serving as a charge-storage node is connected to a read word line 33. The structure shown in FIGS. 64 and 65 have advantages of the structure shown in FIGS. 62 and 63, as well as advantages such that, when the potential of the read word line 33 is increased at the time of reading, the potential of the charge-storage node can be increased due to capacitance coupling between the gate 2G serving as the charge-storage node and the electrode 67 thereabove, thereby compensating for a reduction in potential of the charge-storage node due to a decrease in potential of the write word line 32 when writing ends.

The write transistor Qw according to the ninth embodiment has a structure similar to that of the write transistor Qw according to the fifth embodiment but, alternatively, may have the structure shown in FIG. 25 according to the second embodiment or the structure shown in FIG. 71. Also, the electrode 67 made of polycrystalline silicon can be formed simultaneously with the gate 1 of the write transistor Qw. Therefore, the manufacturing process can achieve any structure according to the second or fifth embodiment or which studied by the inventors (refer to FIG. 71), thereby attaining advantages identical to those described above.

Tenth Embodiment

A semiconductor device according to a tenth embodiment is described with reference to FIGS. 66 and 67, focusing on differences from the first embodiment.

Figure 66:
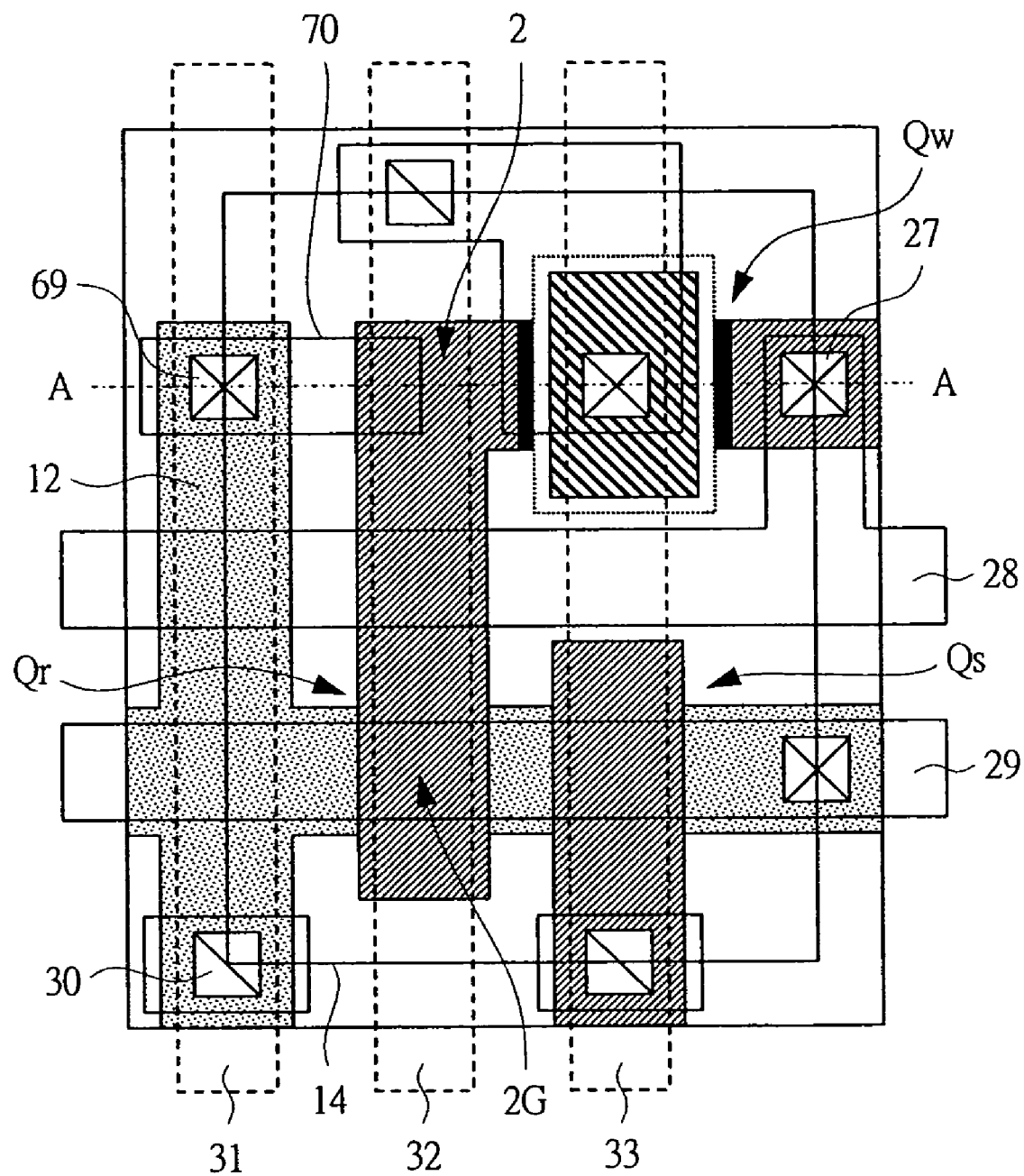
FIG. 66 is a schematic plan view of a memory cell according to a tenth embodiment of the present invention.
Figure 67:
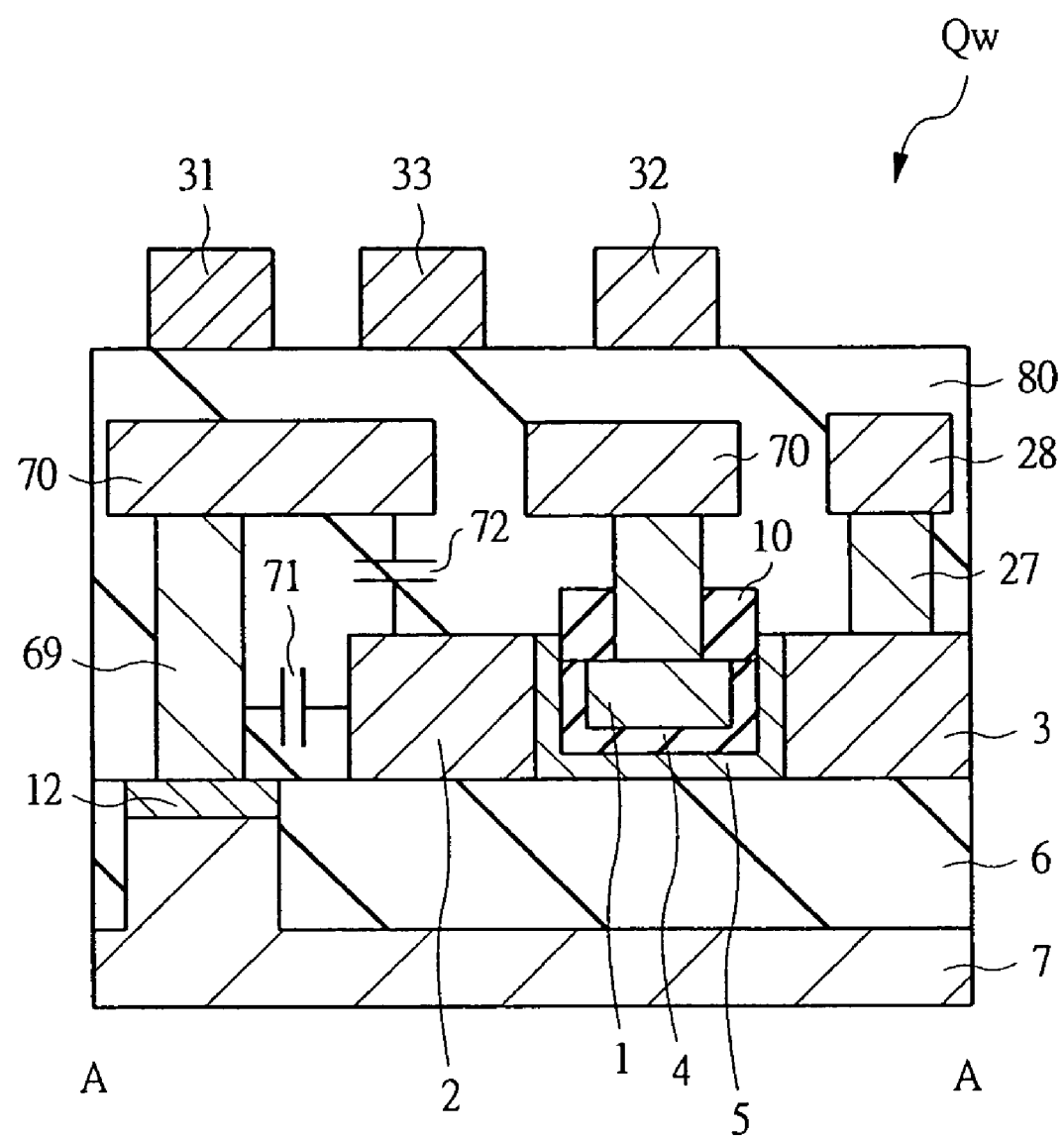
FIG. 67 is a cross-section view along an A-A line in FIG. 66.

FIG. 66 is a schematic plan view of a memory cell according to the tenth embodiment, depicting a write transistor Qw, a read transistor Qr, and a select transistor Qs. FIG. 67 is a cross-section view along an A-A line in FIG. 66. Here, for ease of description, in FIG. 67, a capacitance 71 between a contact and a charge-storage node and a capacitance 72 between a first-layer wiring pattern and the charge-storage node are shown.

In the tenth embodiment, a source 12 formed of an n$^+$ diffusion layer of the read transistor Qr is laid out along the source 2 of the write transistor Qw and the gate 2G of the read transistor Qr. Also, the present embodiment is different from the first embodiment in that a contact 69 and a first-layer wiring layer pattern 70 are laid out in an area where a write bit line 28 and a read bit line 29 are not present.

According to the tenth embodiment, a capacitance 71 between the contact 69 and the charge-storage node (the gate 2G of the read transistor Qr) and a capacitance 72 between the first-layer wiring layer pattern 70 and the charge-storage node (the gate 2G of the read transistor Qr) are added, thereby increasing the amount of stored charge Cs. With this, it is possible to relatively suppress the influence of the parasitic capacitance Cp (refer to FIGS. 70A and 70B), that is, a phenomenon in which the potential of the charge-storage node is significantly lowered due to capacitance coupling with the parasitic capacitance Cp as the potential of the gate 1 of the write transistor Qw is lowered. Such a memory according to the tenth embodiment allows a stable reading operation with a less influence of the parasitic capacitance Cp. Also, there is an advantage of achieving a long retention time.

Also, the tenth embodiment provides a contrivance in layout with the contact 69 and the first-layer wiring layer pattern 70, and the manufacturing process is identical to those according to the other embodiments described above, thereby achieving the advantages described above. Furthermore, although the first-layer wiring layer pattern 70 and the source line 31 are not directly connected together with a via in the tenth embodiment, this is because what is mainly focused is description of an increase in the storage capacitance. Connection with a via is more desirable because the resistance of the source 12 of the read transistor Qr can be reduced.

Here, in the tenth embodiment, the write transistor Qw has a structure similar to that of the first embodiment but, alternatively, may have the structure according to any other embodiment or the structure of FIG. 71 studied by the inventors.

Eleventh Embodiment

A semiconductor device according to an eleventh embodiment is described with reference to FIGS. 68 and 69, focusing on differences from the first embodiment.

Figure 68:
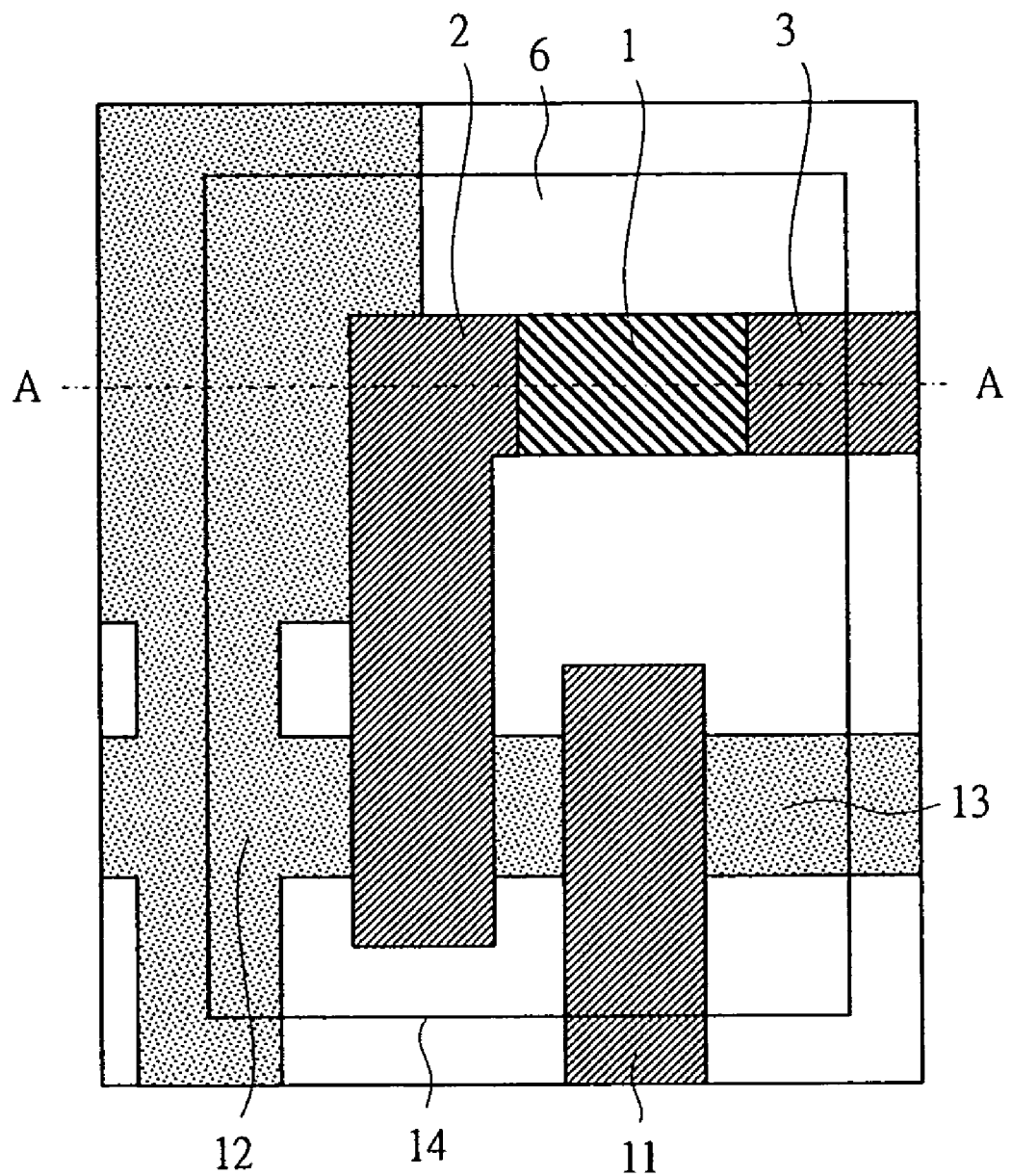
FIG. 68 is a schematic plan view of a memory cell according to an eleventh embodiment of the present invention.
Figure 69:
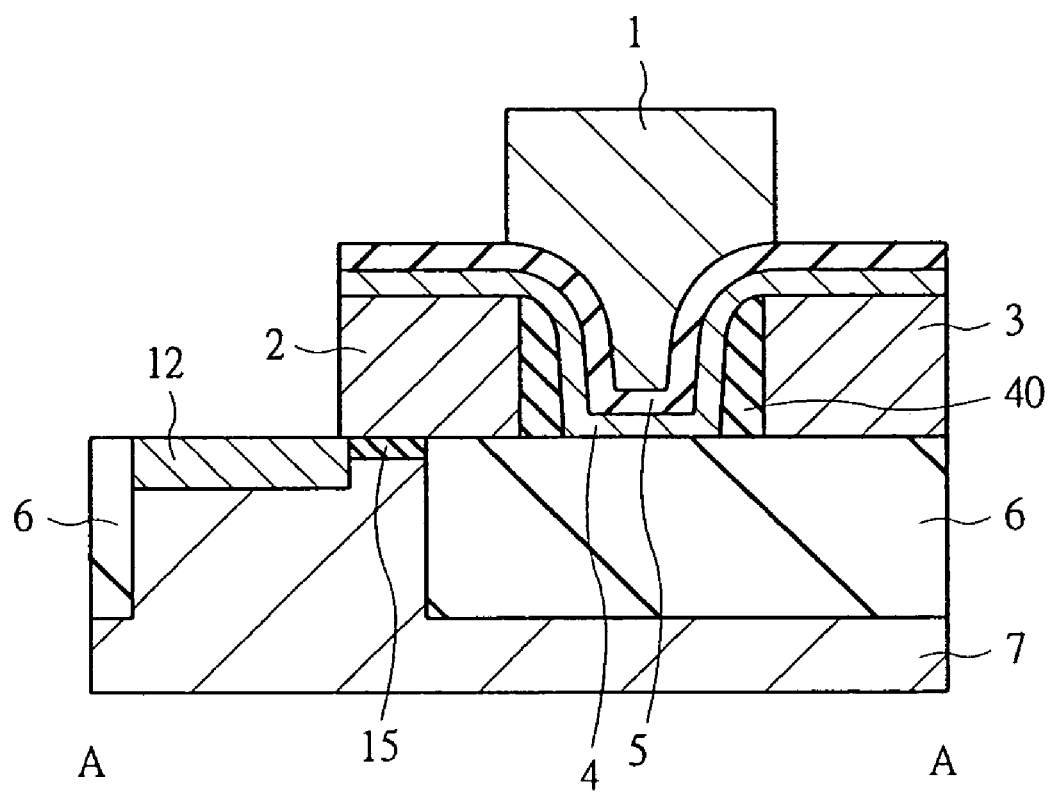
FIG. 69 is a cross-section view along an A-A line in FIG. 68.

FIG. 68 is a schematic plan view of a memory cell according to the eleventh embodiment, depicting a write transistor Qw, a read transistor Qr, and a select transistor Qs. FIG. 69 is a cross-section view along an A-A line in FIG. 68. Here, in FIGS. 68 and 69, for ease of description of an element structure, components, such as contacts and wirings, are omitted. Also, in FIG. 68, an insulating film 5 and a channel 4 shown in FIG. 69 are omitted for ease of viewing.

In the eleventh embodiment, what is different from the first embodiment is that a source 12 formed of an n$^+$ diffusion layer of the read transistor Qr is widely formed even under the source 2 of the write transistor Qw.

According to the eleventh embodiment, a capacitance between the source 2 of the write transistor Qw and the source 12 formed of the n$^+$ diffusion layer of the read transistor Qr is added, thereby increasing the amount of stored charge Cs. With this, it is possible to relatively suppress the influence of the parasitic capacitance Cp (refer to FIGS. 70A and 70B), that is, a phenomenon in which the potential of the charge-storage node is significantly lowered due to capacitance coupling with the parasitic capacitance Cp as the potential of the gate 1 of the write transistor Qw is lowered. With such a structure of the write transistor Qw, the memory according to the eleventh embodiment allows a stable reading operation with a less influence of the parasitic capacitance Cp. Also, there is an advantage of achieving a long retention time.

Also, the eleventh embodiment provides a contrivance in layout with the source 12 formed of the n$^+$ diffusion layer of the read transistor Qr, and the manufacturing process provides advantages identical to those of other embodiments described above.

Here, in the eleventh embodiment, the write transistor Qw has a structure similar to that of the fifth embodiment but, alternatively, may have the structure according to any other embodiment or the structure of FIG. 71 studied by the inventors.

In the foregoing, the invention made by the inventors of the present invention has been concretely described based on the embodiments. However, it is needless to say that the present invention is not limited to the foregoing embodiments and various modifications and alterations can be made within the scope of the present invention.

For example, in the above embodiments, the case is described where the write transistor, the read transistor, and the select transistor are of n-type. Alternatively, a combination of polarities and a combination of p-types can be applied.

The present invention is widely used in manufacturing industries for manufacturing semiconductor devices and, particularly, is used to achieve a semiconductor device having high process consistency with a logic transistor and including a low-cost semiconductor memory.

What is claimed is:

1. A semiconductor device having a memory area formed of an array of a plurality of unit memory cells in a same chip, wherein:
each of the unit memory cells has a write transistor and a read transistor,
the write transistor is a field effect transistor including:
a substrate having a main surface on which a first insulating layer is formed;
a source and a drain formed on the first insulating layer;
a channel formed on the first insulating layer and between the source and the drain and made of a semiconductor;
a gate formed on an upper portion of the first insulating layer and between the source and the drain, the gate being electrically insulated from the channel by a gate insulating film, and controlling a potential of the channel; and
a second insulating layer formed on an upper surface of the gate,
wherein the entire boundary between the gate and the second insulating layer is lower than an upper surface of the source,
the gate is formed without overlapping the upper surfaces of the source and drain, and the source and drain are formed without overlapping with an upper surface of the gate,
the read transistor is a field effect transistor,
one of the source and the drain of the write transistor that inputs and outputs a stored charge is electrically connected to a bit line, and one of the drain and the source not electrically connected to the bit line is electrically connected to a gate of the read transistor,
an electrode, which is electrically separated from the gate of the read transistor, is formed near the gate of the read transistor, and
only one insulating film is disposed between facing surfaces of the gate and the channel, between facing surfaces of the gate and the source, and between facing surfaces of the gate and the drain, the one insulating film being the gate insulating film.

2. The semiconductor device according to claim 1, wherein the electrode is electrically connected to a source of the read transistor.

3. The semiconductor device according to claim 1, wherein the electrode is electrically connected to a word wiring for memory cell selection.

4. The semiconductor device according to claim 1, wherein the electrode is formed in a same layer as the gate of the write transistor.

5. The semiconductor device according to claim 1, wherein the electrode is formed in a same layer as a contact connecting a source of the read transistor and a wiring layer.

6. The semiconductor device according to claim 1, wherein the electrode is formed in a same layer as a source of the read transistor.

7. The semiconductor device according to claim 1, wherein the unit memory cell further includes a select transistor,
the select transistor is connected in series to the read transistor, and
a gate of the select transistor is electrically connected to a word line for memory cell selection.

8. The semiconductor device according to claim 7, wherein
in the read transistor, a conductance in one of a source and a drain of the read transistor is varied depending on an amount of stored charge input and output by the write transistor, and
a channel width of the read transistor is larger than a channel width of the select transistor.

9. A semiconductor device provided with a field-effect transistor comprising:
a substrate having a main surface on which a first insulating layer is formed;
a source and a drain formed on the first insulating layer;
a channel formed on the first insulating layer and between the source and the drain and made of a semiconductor;
a gate formed on an upper portion of the first insulating layer and between the source and the drain and electrically insulated from the channel by a gate insulating film, and controlling a potential of the channel; and
a second insulating layer formed on an upper surface of the gate,
wherein the channel electrically connects the source and the drain on side surfaces of the source and the drain,
wherein the entire boundary between the gate and the second insulating layer is formed at a lower height than an upper surface of the source,
wherein the gate is formed without overlapping with the upper surfaces of the source and drain, and the source and drain are formed without overlapping an upper surface of the gate,
wherein the channel is made of either one of polycrystalline silicon and amorphous silicon, and
wherein only one insulating film is disposed between facing surfaces of the gate and the channel, between facing surfaces of the gate and the source, and between facing surfaces of the gate and the drain, the one insulating film being the gate insulating film.

10. The semiconductor device according to claim 9, wherein
the channel has a thickness on the order of 5 nm or smaller.

11. The semiconductor device according to claim 9, wherein
the gate is made of metal.

12. The semiconductor device according to claim 9, wherein
at least one of the source and the drain is made of metal.

13. The semiconductor device according to claim 9, wherein
a current path width of the channel is wider than a current path width of the source.

14. The semiconductor device according to claim 9, wherein
the channel is formed on an entire surface of a lower portion of the gate.

* * * * *